(12) United States Patent
Mizuno et al.

(10) Patent No.: US 10,241,400 B2
(45) Date of Patent: *Mar. 26, 2019

(54) COLOR DEVELOPING COMPOSITION, LITHOGRAPHIC PRINTING PLATE PRECURSOR, PLATE MAKING METHOD FOR LITHOGRAPHIC PRINTING PLATE, AND COLOR DEVELOPER

(71) Applicant: FUJIFILM CORPORATION, Minato-ku, Tokyo (JP)

(72) Inventors: Akio Mizuno, Shizuoka (JP); Keisuke Nogoshi, Shizuoka (JP); Kyosuke Tsumura, Shizuoka (JP); Taira Murakami, Shizuoka (JP); Kohei Aizu, Shizuoka (JP)

(73) Assignee: FUJIFILM CORPORATION, Tokyo (JP)

(*) Notice: Subject to any disclaimer, the term of this patent is extended or adjusted under 35 U.S.C. 154(b) by 90 days.

This patent is subject to a terminal disclaimer.

(21) Appl. No.: 15/407,254

(22) Filed: Jan. 17, 2017

(65) Prior Publication Data

US 2017/0123315 A1    May 4, 2017

Related U.S. Application Data

(63) Continuation of application No. PCT/JP2015/073522, filed on Aug. 21, 2015.

(30) Foreign Application Priority Data

| Aug. 22, 2014 | (JP) | 2014-169258 |
| Feb. 16, 2015 | (JP) | 2015-027558 |
| Jul. 29, 2015 | (JP) | 2015-149712 |

(51) Int. Cl.

| G03F 7/00 | (2006.01) |
| G03F 7/004 | (2006.01) |
| C09B 23/00 | (2006.01) |
| B41C 1/10 | (2006.01) |
| B41M 5/333 | (2006.01) |
| C09B 23/16 | (2006.01) |
| G03F 7/11 | (2006.01) |
| G03F 7/16 | (2006.01) |
| G03F 7/20 | (2006.01) |
| G03F 7/26 | (2006.01) |

(Continued)

(52) U.S. Cl.
CPC .......... *G03F 7/0045* (2013.01); *B41C 1/1016* (2013.01); *B41M 5/3333* (2013.01); *C09B 23/00* (2013.01); *C09B 23/0025* (2013.01); *C09B 23/0066* (2013.01); *C09B 23/086* (2013.01); *C09B 23/164* (2013.01); *G03F 7/11* (2013.01); *G03F 7/16* (2013.01); *G03F 7/168* (2013.01); *G03F 7/20* (2013.01); *G03F 7/26* (2013.01); *B41C 2201/02* (2013.01); *B41C 2201/12* (2013.01); *B41C 2210/04* (2013.01); *B41C 2210/08* (2013.01); *B41M 5/286* (2013.01); *B41M 5/333* (2013.01)

(58) Field of Classification Search
CPC ........................................................ G03F 7/00
See application file for complete search history.

(56) References Cited

U.S. PATENT DOCUMENTS

2016/0326372 A1    11/2016   Mizuno et al.

FOREIGN PATENT DOCUMENTS

| EP | 30101475 A1 | 12/2016 |
| JP | 61-248789 A | 11/1986 |

(Continued)

OTHER PUBLICATIONS

Hu C. et al, "A Ratiometric Near-Infrared Fluorescent Probe for Hydrazine and Its in Vivo Applications", (2013, vol. 15, No. 15, p. 4022-4025, American Chemical Society).*
English language translation of the following: Office action dated Aug. 29, 2017 from the JPO in a Japanese patent application No. 2016-544266 corresponding to the instant patent application. This office action translation is submitted now in order to supplement the understanding of the cited reference which is being disclosed in the instant Information Disclosure Statement.

(Continued)

*Primary Examiner* — Chanceity N Robinson
(74) *Attorney, Agent, or Firm* — Solaris Intellectual Property Group, PLLC

(57) ABSTRACT

A color developing composition which develops colors in a high density and does not significantly discolor when aged, a lithographic printing plate precursor which has excellent plate-inspecting properties by means of color development and is capable of maintaining strong color development even when aged after color development, a plate making method for a lithographic printing plate in which the lithographic printing plate precursor is used, and a new compound that can be preferably used as a color developer. The color developing composition of the present invention includes a compound represented by Formula 1. The compound in the present invention is represented by Formula 1. In Formula 1, $R^1$ represents a group in which an $R^1$—O bond is cleaved by heat or exposure to infrared rays.

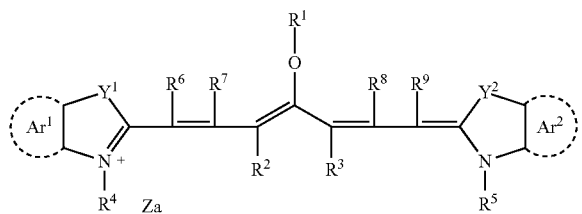

(1)

21 Claims, No Drawings

(51) Int. Cl.
*C09B 23/01* (2006.01)
*C09B 23/08* (2006.01)
*B41M 5/28* (2006.01)

(56) References Cited

FOREIGN PATENT DOCUMENTS

| JP | 62-124986 A | 6/1987 |
|---|---|---|
| JP | 2008-544053 A | 12/2008 |
| JP | 2008-544322 A | 12/2008 |
| JP | 2013-199089 A | 10/2013 |
| WO | 01/08885 A1 | 2/2001 |
| WO | 2015/115598 A1 | 8/2015 |

OTHER PUBLICATIONS

Extended European Search Report dated Aug. 31, 2017, issued in corresponding EP Patent Application No. 15833893.9.
Vompe, A. F. et al, "Reactions of cyanine dyes. I. New way to synthesize 11-alkoxy substituted thiatricarbocyanines", Russian Journal of Organic Chemistry (Zhurnal Organicheskoi Khimii), 1982, vol. 18, No. 5, p. 1089-94.
Slominskii, Y. L. et al, "Polymethine dyes with hydrocarbon-bridge in the chromophore. I. Electronic energy levels of thiatricarbocyanines and their connection with effectiveness of the photographic effect", Journal of Information Recording Materials,1988, vol. 16, No. 1, p. 23-31, Akademie-Verlag Berlin.
Pascal, S. et al, "Expanding the Polymethine Paradigm: Evidence for the Contribution of a Bis-Dipolar Electronic Structure", Journal of Physical Chemistry A, 2014, vol. 118, No. 23, p. 4038-4047, American Chemical Society.
Kim, Y. et al, "Membrane permeable esterase-activated fluorescent imaging probe", Bioorganic & Medicinal Chemistry Letters, 2007, vol. 17, No. 18, p. 5054-5057, Elsevier Ltd.
Hu C. et al, "A Ratiometric Near-Infrared Fluorescent Probe for Hydrazine and Its in Vivo Applications", Organic Letters, 2013, vol. 15, No. 15, p. 4022-4025, American Chemical Society.
International Search Report issued in International Application No. PCT/JP2015/073522 dated Nov. 24, 2015.
Written Opinion of the ISA issued in International Application No. PCT/JP2015/073522 dated Nov. 24, 2015.
English language translation of the following: Office action dated Apr. 19, 2018 from the SIPO in a Chinese patent application No. 2015800427160 corresponding to the instant patent application.

\* cited by examiner

COLOR DEVELOPING COMPOSITION, LITHOGRAPHIC PRINTING PLATE PRECURSOR, PLATE MAKING METHOD FOR LITHOGRAPHIC PRINTING PLATE, AND COLOR DEVELOPER

CROSS-REFERENCE TO RELATED APPLICATIONS

This application is a Continuation of International Application No. PCT/JP2015/073522 filed on Aug. 21, 2015, which claims priority to Japanese Patent Application No. 2014-169258 filed on Aug. 22, 2014, Japanese Patent Application No. 2015-027558 filed on Feb. 16, 2015, and Japanese Patent Application No. 2015-149712 filed on Jul. 29, 2015. The entire contents of these applications are incorporated herein by reference.

BACKGROUND OF THE INVENTION

1. Field of the Invention

The present invention relates to a color developing composition, a lithographic printing plate precursor, a plate making method for a lithographic printing plate, and a new compound that can be preferably used as a color developer.

2. Description of the Related Art

At the moment, lithographic printing plates are produced using computer to plate (CTP) technologies. That is, lithographic printing plates are produced by directly scanning, exposing, and developing lithographic printing plate precursors using lasers or laser diodes without using lith films.

In response to the above-described technological advances, regarding lithographic printing plate precursors, there is a changing demand for improvement in image-forming characteristics, printing characteristics, physical characteristics, and the like in accordance with the CTP technologies. In addition, due to increasing interest in the global environment, regarding lithographic printing plate precursors, there is another attention-gathering environmental demand for good treatments of waste liquid used for wet processes such as a development process.

Regarding the above-described environmental demand, there have been attempts to facilitate development or plate-making or to remove processes. As one of easy plate making methods, a method called "on-machine development" is carried out. That is, in the method, after the exposure of lithographic printing plate precursors, development of the related art is not carried out, and instead, the lithographic printing plate precursors are mounted on printers, and unnecessary portions in image-recording layers are removed at the initial phase of an ordinary printing step.

In on-machine development-type or process-less (development-less)-type lithographic printing plate precursors on which no development process is carried out, there are no images on the printing plates in a phase of mounting the printing plates on printers, and thus plate inspection is not possible. Particularly, whether or not it is possible to determine if register marks, which serve as indicators for registration in polychromatic printing, are drawn is critical in printing operations. Therefore, for on-machine development-type or process-less (development-less)-type lithographic printing plate precursors, there is a demand for means for checking exposed images, that is, the generation of so-called print-out images in which exposed regions develop or do not develop colors. Furthermore, from the viewpoint of improving workability, there is another demand that exposed regions which develop or do not develop colors remain unchanged regardless of the elapsing of time and maintain a state of developing or not developing colors.

In addition, as lithographic printing plate precursors of the related art, lithographic printing plate precursors described in JP2013-199089A are known.

Furthermore, as infrared absorption dyes of the related art, those described in JP2008-544322A and JP2008-544053A are known.

SUMMARY OF THE INVENTION

An object of the present invention is to provide a color developing composition which develops colors in a high density and does not significantly discolor when aged.

Another object of the present invention is to provide a lithographic printing plate precursor which has excellent plate-inspecting properties by means of color development and is capable of maintaining strong color development even when aged after color development and a plate making method for a lithographic printing plate in which the lithographic printing plate precursor is used.

Still another object of the present invention is to provide a new compound that can be preferably used as a color developer.

The above-described objects have been achieved using means described in <1>, <13>, <17>, or <18> below. Preferred embodiments <2> to <12>, <14> to <16>, and <19> to <22> will also be described together.

<1> A color developing composition comprising a compound represented by Formula 1.

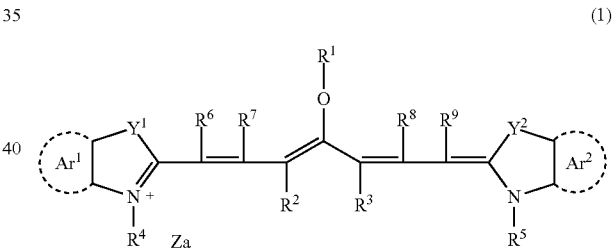

(1)

In Formula 1, $R^1$ represents a group in which an $R^1$—O bond is cleaved by heat or exposure to infrared rays, $R^2$ and $R^3$ each independently represent a hydrogen atom or an alkyl group, $R^2$ and $R^3$ may be linked to each other to form a ring, $Ar^1$ and $Ar^2$ each independently represent a group forming a benzene ring or a naphthalene ring, $Y^1$ and $Y^2$ each independently represent an oxygen atom, a sulfur atom, —$NR^0$—, or a dialkyl methylene group, $R^4$ and $R^5$ each independently represent an alkyl group, $R^6$ to $R^9$ each independently represent a hydrogen atom or an alkyl group, $R^0$ represents a hydrogen atom, an alkyl group, or an aryl group, and Za represents a counter ion neutralizing a charge.

<2> The color developing composition according to <1>, in which $R^1$ is a group represented by any one of Formulae 1-1 to 1-7,

(1-1)

-continued

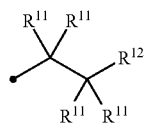 (1-2)

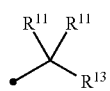 (1-3)

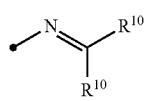 (1-4)

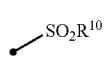 (1-5)

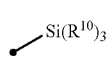 (1-6)

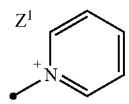 (1-7)

in Formulae 1-1 to 1-7, ● represents a bonding site with the O atom in Formula 1, $R^{10}$'s each independently represent a hydrogen atom, an alkyl group, an alkenyl group, an aryl group, —$OR^{14}$, —$NR^{15}R^{16}$, or —$SR^{17}$, $R^{11}$'s each independently represent a hydrogen atom, an alkyl group, or an aryl group, $R^{12}$ represents an aryl group, —$OR^{14}$, —$NR^{15}R^{16}$, —$SR^{17}$, —$C(=O)R^{18}$, —$OC(=O)R^{18}$, or a halogen atom, $R^{13}$ represents an aryl group, an alkenyl group, an alkoxy group, or an onium group, $R^{14}$ to $R^{17}$ each independently represent a hydrogen atom, an alkyl group, or an aryl group, $R^{18}$'s each independently represent an alkyl group, an aryl group, —$OR^{14}$, —$NR^{15}R^{16}$, or —$SR^{17}$, and $Z^1$ represents a counter ion neutralizing a charge.

<3> The color developing composition according to <2>, in which $R^1$ is a group represented by any one of Formulae 1-1 to 1-3.

<4> The color developing composition according to any one of <1> to <3>, in which $R^1$ is a group represented by Formula 2,

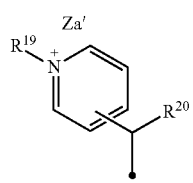 (2)

in Formula 2, ● represents a bonding site with the O atom in Formula 1, $R^{19}$ and $R^{20}$ each independently represent an alkyl group, and Za' represents a counter ion neutralizing a charge.

<5> The color developing composition according to any one of <1> to <4>, further comprising: a binder polymer.

<6> The color developing composition according to any one of <1> to <5>, further comprising: a polymerization initiator; and a polymerizable compound.

<7> The color developing composition according to any one of <1> to <6>, further comprising: a chain transfer agent.

<8> The color developing composition according to <7>, in which the chain transfer agent is a thiol compound.

<9> The color developing composition according to any one of <1> to <8>, further comprising: a borate compound.

<10> The color developing composition according to <9>, in which a potential difference between a highest occupied molecular orbital of the compound represented by Formula 1 and a highest occupied molecular orbital of the borate compound is 0.585 eV or more.

<11> The color developing composition according to <9> or <10>, in which the borate compound is a tetraarylborate compound.

<12> The color developing composition according to any one of <1> to <11> which is a thermosensitive and/or infrared-sensitive color developing composition.

<13> A lithographic printing plate precursor comprising: a layer including a compound represented by Formula 1 and a binder polymer on a support.

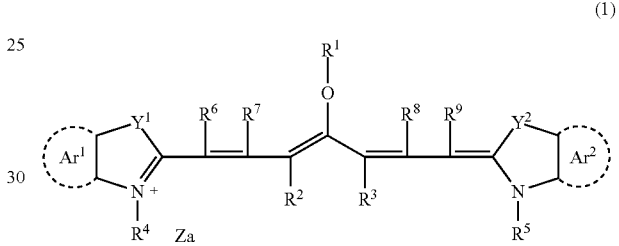 (1)

In Formula 1, $R^1$ represents a group in which an $R^1$—O bond is cleaved by heat or exposure to infrared rays, $R^2$ and $R^3$ each independently represent a hydrogen atom or an alkyl group, $R^2$ and $R^3$ may be linked to each other to form a ring, $Ar^1$ and $Ar^2$ each independently represent a group forming a benzene ring or a naphthalene ring, $Y^1$ and $Y^2$ each independently represent an oxygen atom, a sulfur atom, —$NR^0$—, or a dialkyl methylene group, $R^4$ and $R^5$ each independently represent an alkyl group, $R^6$ to $R^9$ each independently represent a hydrogen atom or an alkyl group, $R^0$ represents a hydrogen atom, an alkyl group, or an aryl group, and Za represents a counter ion neutralizing a charge.

<14> The lithographic printing plate precursor according to <13>, in which the layer is an image-recording layer.

<15> The lithographic printing plate precursor according to <14>, further comprising: a protective layer on the image-recording layer.

<16> The lithographic printing plate precursor according to <13>, in which the layer is a protective layer.

<17> A plate making method for a lithographic printing plate, comprising: an exposure step of exposing the lithographic printing plate precursor according to any one of <13> to <16> in an image pattern; and an on-machine development process step of removing non-image portions by supplying printing ink and dampening water to the lithographic printing plate precursor that has been exposed in an image pattern on a printer.

<18> A compound represented by Formula 1.

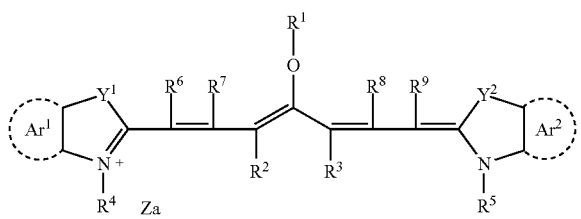

(1)

In Formula 1, $R^1$ represents a group in which an $R^1$—O bond is cleaved by heat or exposure to infrared rays, $R^2$ and $R^3$ each independently represent a hydrogen atom or an alkyl group, $R^2$ and $R^3$ may be linked to each other to form a ring, $Ar^1$ and $Ar^2$ each independently represent a group forming a benzene ring or a naphthalene ring, $Y^1$ and $Y^2$ each independently represent an oxygen atom, a sulfur atom, —$NR^0$—, or a dialkyl methylene group, $R^4$ and $R^5$ each independently represent an alkyl group, $R^6$ to $R^9$ each independently represent a hydrogen atom or an alkyl group, $R^0$ represents a hydrogen atom, an alkyl group, or an aryl group, and Za represents a counter ion neutralizing a charge.

<19> The compound according to <18>, in which $R^1$ is a group represented by any one of Formulae 1-1 to 1-7,

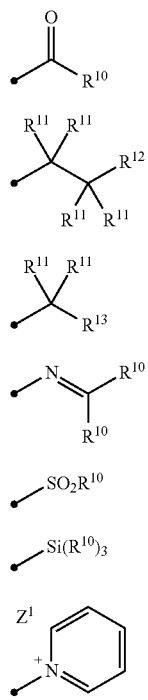

in Formulae 1-1 to 1-7, ● represents a bonding site with the O atom in Formula 1, $R^{10}$'s each independently represent a hydrogen atom, an alkyl group, an alkenyl group, an aryl group, —$OR^{14}$, —$NR^{15}R^{16}$, or —$SR^{17}$, $R^{11}$'s each independently represent a hydrogen atom, an alkyl group, or an aryl group, $R^{12}$ represents an aryl group, —$OR^{14}$, —$NR^{15}R^{16}$, —$SR^{17}$, —C(=O)$R^{18}$, —OC(=O)$R^{18}$, or a halogen atom, $R^{13}$ represents an aryl group, an alkenyl group, an alkoxy group, or an onium group, $R^{14}$ to $R^{17}$ each independently represent a hydrogen atom, an alkyl group, or an aryl group, $R^{18}$'s each independently represent an alkyl group, an aryl group, —$OR^{14}$, —$NR^{15}R^{16}$, or —$SR^{17}$, and $Z^1$ represents a counter ion neutralizing a charge.

<20> The compound according to <19>, in which $R^1$ is a group represented by any one of Formulae 1-1 to 1-3.

<21> The compound according to any one of <18> to <20>, in which $R^1$ is a group represented by Formula 2,

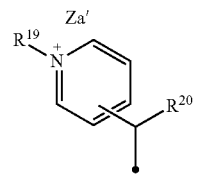

(2)

in Formula 2, ● represents a bonding site with the O atom in Formula 1, $R^{19}$ and $R^{20}$ each independently represent an alkyl group, and Za' represents a counter ion neutralizing a charge.

<22> The compound according to any one of <18> to <21> which is a thermosensitive and/or infrared-sensitive color developer.

According to the present invention, it is possible to provide a color developing composition which develops colors in a high density and does not significantly discolor when aged.

In addition, according to the present invention, it is possible to provide a lithographic printing plate precursor which has excellent plate-inspecting properties by means of color development and is capable of maintaining strong color development even when aged after color development and a plate making method for a lithographic printing plate in which the lithographic printing plate precursor is used.

Furthermore, according to the present invention, it is possible to provide a new compound that can be preferably used as a color developer.

DESCRIPTION OF THE PREFERRED EMBODIMENTS

Hereinafter, the present invention will be described in detail.

Meanwhile, in the present specification, an expression "xx to yy" represents a numerical range including xx and yy.

"(Meth)acrylates" and the like represent "acrylates and/or methacrylates" and the like, which shall apply below.

In addition, in the present invention, "% by mass" and "% by weight" have the same meaning, and "parts by mass" and "parts by weight" have the same meaning.

In addition, in the present invention, combinations of preferred aspects are more preferred aspects.

In the present specification, regarding the expression of groups in compounds represented by formulae, in a case in which there are no descriptions of whether or not the groups are substituted or not substituted and the groups are capable of further having a substituent, unless particularly otherwise regulated, the groups may be not only unsubstituted groups but also groups having a substituent. For example, in a formula, when there is a description that "R represents an alkyl group, an aryl group, or a heterocyclic group", it means that "R represents an unsubstituted alkyl group, a substituted alkyl group, an unsubstituted aryl group, a substituted aryl group, an unsubstituted heterocyclic group, or a substituted heterocyclic group".

(Color Developing Composition)

A color developing composition of the present invention includes a compound represented by Formula 1.

In addition, the color developing composition of the present invention can be preferably used as a thermosensitive and/or infrared-sensitive color developing composition.

Furthermore, the color developing composition of the present invention can be preferably used to produce image-recording layers and/or protective layers for lithographic printing plate precursors.

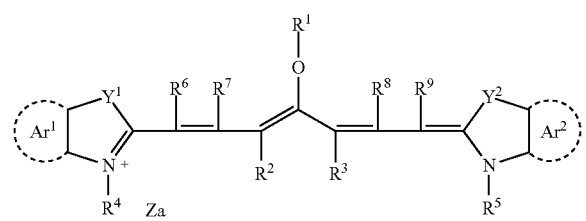

(1)

In Formula 1, $R^1$ represents a group in which an $R^1$—O bond is cleaved by heat or exposure to infrared rays, $R^2$ and $R^3$ each independently represent a hydrogen atom or an alkyl group, $R^2$ and $R^3$ may be linked to each other to form a ring, $Ar^1$ and $Ar^2$ each independently represent a group forming a benzene ring or a naphthalene ring, $Y^1$ and $Y^2$ each independently represent an oxygen atom, a sulfur atom, —$NR^0$—, or a dialkyl methylene group, $R^4$ and $R^5$ each independently represent an alkyl group, $R^6$ to $R^9$ each independently represent a hydrogen atom or an alkyl group, $R^0$ represents a hydrogen atom, an alkyl group, or an aryl group, and Za represents a counter ion neutralizing a charge.

<Compound Represented by Formula 1>

The compound represented by Formula 1 is a compound which is decomposed by heat or exposure to infrared rays and generates color-developing decomposed matters.

In the present invention, color development refers to the fact that strong coloration or absorption occurs at shorter wavelengths after heating or exposure than before heating and exposure and absorption occurs in the visible light range. The compound represented by Formula 1 is preferably a compound which is decomposed by heat or exposure to infrared rays and generates compounds having a maximum absorption wavelength in a range of 500 to 600 nm.

The present inventors and the like assume the color development mechanism of the compound represented by Formula 1 as follows: the $R^1$—O bond is cleaved by heat or exposure to infrared rays, the cleaved oxygen atoms form a carbonyl group, and a merocyanine colorant which is a color developing body is generated and develops color as illustrated below.

The present inventors and the like assume that the bond of $R^1$, in which a bond is cleaved by heat or exposure to infrared rays, and a cyanine colorant structure through an oxygen atom is important for the generation of a merocyanine colorant.

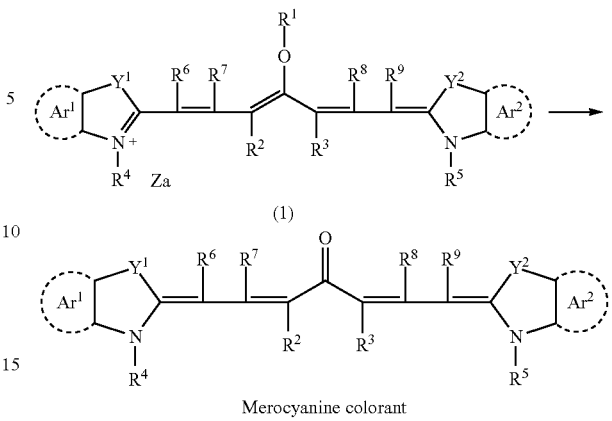

Merocyanine colorant $R^1$ represents a group in which the $R^1$—O bond is cleaved by heat or exposure to infrared rays. Specific examples thereof include groups in which decomposition or an isomerization reaction proceeds due to heat energy supplied from the outside, energy generated when the compound represented by Formula 1 returns to the ground state from the excited state generated after absorbing infrared rays, or a chemical reaction proceeding from the excited state and the $R^1$—O bond is cleaved.

Preferred aspects of $R^1$ will be described below.

The alkyl group as $R^2$ to $R^9$ and $R^0$ is preferably an alkyl group having 1 to 30 carbon atoms, more preferably an alkyl group having 1 to 15 carbon atoms, and still more preferably an alkyl group having 1 to 10 carbon atoms. The alkyl group may have a linear shape or a branch and may have a ring structure.

Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group.

Among these alkyl groups, a methyl group, an ethyl group, a propyl group, and a butyl group are particularly preferred.

In addition, the alkyl group may have a substituent. Examples of the substituent include an alkoxy group, an aryloxy group, an amino group, an alkylthio group, an arylthio group, a halogen atom, a carboxy group, a carboxylate group, a sulfo group, a sulfonate group, an alkyloxycarbonyl group, an aryloxycarbonyl group, a group formed of a combination thereof, and the like.

The aryl group as $R^0$ is preferably an aryl group having 6 to 30 carbon atoms, more preferably an aryl group having 6 to 20 carbon atoms, and still more preferably an aryl group having 6 to 12 carbon atoms.

In addition, the aryl group may have a substituent. Examples of the substituent include an alkyl group, an alkoxy group, an aryloxy group, an amino group, an alkylthio group, an arylthio group, a halogen atom, a carboxy group, a carboxylate group, a sulfo group, a sulfonate group, an alkyloxycarbonyl group, an aryloxycarbonyl group, a group formed of a combination thereof, and the like.

Specific examples thereof include a phenyl group, a naphthyl group, a p-tolyl group, a p-chlorophenyl group, a p-fluorophenyl group, a p-methoxyphenyl group, a p-dimethylaminophenyl group, a p-methyl thiophenyl group, a p-phenylthiophenyl group, and the like.

Among these aryl groups, a phenyl group, a p-methoxyphenyl group, a p-dimethylaminophenyl group, and a naphthyl group are preferred.

$R^2$ and $R^3$ are preferably linked to each other to form a ring.

In a case in which $R^2$ and $R^3$ are linked to each other to form a ring, the preferred number of members in the ring is preferably 5 or 6 and most preferably 6.

$Y^1$ and $Y^2$ each independently represent an oxygen atom, a sulfur atom, —$NR^0$—, or a dialkyl methylene group and are preferably —$NR^0$— or a dialkyl methylene group and more preferably a dialkyl methylene group.

$R^0$ represents a hydrogen atom, an alkyl group, or an aryl group and is preferably an alkyl group.

$R^4$ and $R^5$ are preferably identical groups.

In addition, $R^4$ and $R^5$ each are independently preferably a linear alkyl group or an alkyl group having a sulfonate group at the terminal and more preferably a methyl group, an ethyl group, or a butyl group having a sulfonate group at the terminal.

In addition, a counter cation of the sulfonate group may be a quaternary ammonium group in Formula 1, an alkali metal cation, or an alkaline earth metal cation.

Furthermore, from the viewpoint of the water solubility of the compound represented by Formula 1, $R^4$ and $R^5$ each are independently preferably an alkyl group having an anion structure, more preferably an alkyl group having a carboxylate group or a sulfonate group, and still more preferably an alkyl group having a sulfonate group at the terminal.

In addition, from the viewpoint of an increase in the maximum absorption wavelength of the compound represented by Formula 1 and color-developing properties and printing resistance in lithographic printing plates, $R^4$ and $R^5$ each are independently preferably an alkyl group having an aromatic ring, more preferably an alkyl group having an aromatic ring at the terminal, and particularly preferably a 2-phenyl ethyl group, a 2-naphthalenylethyl group, or a 2-(9-anthracenyl)ethyl group.

$R^6$ to $R^9$ each independently represent a hydrogen atom or an alkyl group and are preferably a hydrogen atom.

$Ar^1$ and $Ar^2$ each independently represent a group forming a benzene ring or a naphthalene ring. The benzene ring or the naphthalene ring may have a substituent. Examples of the substituent include an alkyl group, an alkoxy group, an aryloxy group, an amino group, an alkylthio group, an arylthio group, a halogen atom, a carboxy group, a carboxylate group, a sulfo group, a sulfonate group, an alkyloxycarbonyl group, an aryloxycarbonyl group, a group formed of a combination thereof, and the like, and an alkyl group is preferred.

In addition, from the viewpoint of an increase in the maximum absorption wavelength of the compound represented by Formula 1 and color-developing properties and printing resistance in lithographic printing plates, $Ar^1$ and $Ar^2$ each are independently preferably a group forming a naphthalene ring or a benzene ring having an alkyl group or an alkoxy group as a substituent, more preferably a group forming a naphthalene ring or a benzene ring having an alkoxy group as a substituent, and particularly preferably a group forming a naphthalene ring or a benzene ring having a methoxy group as a substituent.

Za represents a counter ion neutralizing a charge, and, in a case in which Za represents an anion, examples thereof include a sulfonate ion, a carboxylate ion, a tetrafluoroborate ion, a hexafluorophosphate ion, a p-toluenesulfonate ion, a perchlorate ion, and the like, and a hexafluorophosphate ion is particularly preferred. In a case in which Za represents a cation, an alkali metal ion, an alkaline earth metal ion, an ammonium ion, a pyridinium ion, or a sulfonium ion is preferred, a sodium ion, a potassium ion, an ammonium ion, a pyridinium ion, or a sulfonium ion is more preferred, and a sodium ion, a potassium ion, or an ammonium ion is still more preferred.

$R^1$ to $R^9$, $R^0$, $Ar^1$, $Ar^2$, $Y^1$, and $Y^2$ may have an anion structure or a cation structure, and, when all of $R^1$ to $R^9$, $R^0$, $Ar^1$, $Ar^2$, $Y^1$, and $Y^2$ are electrically neutral groups, Za is a monovalent counter anion, and, for example, in a case in which $R^1$ to $R^9$, $R^0$, $Ar^1$, $Ar^2$, $Y^1$, and $Y^2$ have two or more anion structures, Za may also become a counter cation.

From the viewpoint of color-developing properties, $R^1$ is preferably a group represented by any of Formulae 1-1 to 1-7 and more preferably a group represented by any of Formulae 1-1 to 1-3.

(1-1)

(1-2)

(1-3)

(1-4)

(1-5)

(1-6)

(1-7)

In Formulae 1-1 to 1-7, ● represents a bonding site with the O atom in Formula 1, $R^{10}$'s each independently represent a hydrogen atom, an alkyl group, an alkenyl group, an aryl group, —$OR^{14}$, —$NR^{15}R^{16}$, or —$SR^{17}$, $R^{11}$'s each independently represent a hydrogen atom, an alkyl group, or an aryl group, $R^{12}$ represents an aryl group, —$OR^{14}$, —$NR^{15}R^{16}$, —$SR^{17}$, —$C(=O)R^{18}$, —$OC(=O)R^{18}$, or a halogen atom, $R^{13}$ represents an aryl group, an alkenyl group, an alkoxy group, or an onium group, $R^{14}$ to $R^{17}$ each independently represent a hydrogen atom, an alkyl group, or an aryl group, $R^{18}$'s each independently represent an alkyl group, an aryl group, —$OR^{14}$, —$NR^{15}R^{16}$, or —$SR^{17}$, and $Z^1$ represents a counter ion neutralizing a charge.

In a case in which $R^{10}$, $R^{11}$, and $R^{14}$ to $R^{18}$ are alkyl groups, the preferred aspects thereof are identical to the preferred aspects of the alkyl group as $R^2$ to $R^9$ and $R^0$.

The number of carbon atoms in the alkenyl group as $R^{10}$ and $R^{13}$ is preferably 1 to 30, more preferably 1 to 15, and still more preferably 1 to 10.

In a case in which $R^{10}$ to $R^{18}$ are aryl groups, the preferred aspects thereof are identical to the preferred aspects of the aryl group as $R^0$.

From the viewpoint of color-developing properties, $R^{10}$ in Formula 1-1 is preferably an alkyl group, an alkenyl group, an aryl group, —$OR^{14}$, —$NR^{15}R^{16}$, or —$SR^{17}$, more preferably an alkyl group, —$OR^{14}$, —$NR^{15}R^{16}$, or —$SR^{17}$, still more preferably an alkyl group or —$OR^{14}$, and particularly preferably —$OR^{14}$.

In addition, in a case in which $R^{10}$ in Formula 1-1 is an alkyl group, the alkyl group is preferably an alkyl group having an arylthio group or an alkyloxycarbonyl group at the α-position.

In a case in which $R^{10}$ in Formula 1-1 is —$OR^{14}$, $R^{14}$ is preferably an alkyl group, more preferably an alkyl group having 1 to 8 carbon atoms, still more preferably an isopropyl group or a t-butyl group, and particularly preferably a t-butyl group.

From the viewpoint of color-developing properties, $R^{11}$ in Formula 1-2 is preferably a hydrogen atom.

In addition, from the viewpoint of color-developing properties, $R^{12}$ in Formula 1-2 is preferably —$C(=O)OR^{14}$, —$OC(=O)OR^{14}$, or a halogen atom and more preferably —$C(=O)OR^{14}$ or —$OC(=O)OR^{14}$. In a case in which $R^{12}$ in Formula 1-2 is —$C(=O)OR^{14}$ or —$OC(=O)OR^{14}$, $R^{14}$ is preferably an alkyl group.

From the viewpoint of color-developing properties, $R^{11}$'s in Formula 1-3 each are independently preferably a hydrogen atom or an alkyl group, and at least one $R^{11}$ in Formula 1-3 is more preferably an alkyl group.

In addition, the alkyl group as $R^{11}$ is preferably an alkyl group having 1 to 10 carbon atoms and more preferably an alkyl group having 3 to 10 carbon atoms.

Furthermore, the alkyl group as $R^{11}$ is preferably an alkyl group having a branch, more preferably a secondary or tertiary alkyl group, and still more preferably an isopropyl group, a cyclopentyl group, a cyclohexyl group, or a t-butyl group.

In addition, from the viewpoint of color-developing properties, $R^{13}$ in Formula 1-3 is preferably an aryl group, an alkoxy group, or an onium group, more preferably p-dimethylaminophenyl group or a pyridinium group, and still more preferably a pyridinium group.

Examples of the onium group as $R^{13}$ include a pyridinium group, an ammonium group, a sulfonium group, and the like. The onium group may have a substituent. Examples of the substituent include an alkyl group, an alkoxy group, an aryloxy group, an amino group, an alkylthio group, an arylthio group, a halogen atom, a carboxy group, a sulfo group, an alkyloxycarbonyl group, an aryloxycarbonyl group, a group formed of a combination thereof, and the like, and an alkyl group, an aryl group, and a group formed of a combination thereof are preferred.

Among these, a pyridinium group is preferred, an N-alkyl-3-pyridinium group, an N-benzyl-3-pyridinium group, an N-(alkoxy polyalkyleneoxy alkyl)-3-pyridinium group, an N-alkoxycarbonylmethyl-3-pyridinium group, an N-alkyl-4-pyridinium group, an N-benzyl-4-pyridinium group, an N-(alkoxy polyalkyleneoxy alkyl)-4-pyridinium group, an N-alkoxycarbonylmethyl-4-pyridinium group, or an N-alkyl-3,5-dimethyl-4-pyridinium group is more preferred, an N-alkyl-3-pyridinium group or an N-alkyl-4-pyridinium group is still more preferred, an N-methyl-3-pyridinium group, an N-octyl-3-pyridinium group, an N-methyl-4-pyridinium group, or an N-octyl-4-pyridinium group is particularly preferred, and an N-octyl-3-pyridinium group or an N-octyl-4-pyridinium group is most preferred.

In addition, in a case in which $R^{13}$ is a pyridinium group, examples of the counter anion include a sulfonate ion, a carboxylate ion, a tetrafluoroborate ion, a hexafluorophosphate ion, a p-toluenesulfonate ion, a perchlorate ion, and the like, and a p-toluenesulfonate ion or a hexafluorophosphate ion is preferred.

From the viewpoint of color-developing properties, $R^{10}$'s in Formula 1-4 are preferably alkyl groups or aryl groups, and it is more preferable that one of the two $R^{10}$'s is an alkyl group and the other is an aryl group.

From the viewpoint of color-developing properties, $R^{10}$ in Formula 1-5 is preferably an alkyl group or an aryl group, more preferably an aryl group, and still more preferably a p-methylphenyl group.

From the viewpoint of color-developing properties, $R^{10}$'s in Formula 1-6 each are independently preferably alkyl groups or aryl groups and more preferably methyl groups or phenyl groups.

From the viewpoint of color-developing properties, $Z^1$ in Formula 1-7 may be a counter ion neutralizing a charge, and may be included in Za as the entire compound.

$Z^1$ is preferably a sulfonate ion, a carboxylate ion, a tetrafluoroborate ion, a hexafluorophosphate ion, a p-toluenesulfonate ion, or a perchlorate ion and more preferably a p-toluenesulfonate ion or a hexafluorophosphate ion.

In addition, $R^1$ is particularly preferably a group represented by Formula 2.

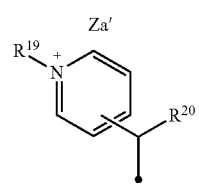

(2)

In Formula 2, ● represents a bonding site with the O atom in Formula 1, $R^{19}$ and $R^{20}$ each independently represent an alkyl group, and Za' represents a counter ion neutralizing a charge.

The bonding site with a hydrocarbon group including a pyridinium ring and $R^{20}$ in Formula 2 is preferably the third or fourth position of the pyridinium ring and more preferably the fourth position of the pyridinium ring.

The alkyl group as $R^{19}$ and $R^{20}$ may have a linear shape, a branch, or a ring structure.

In addition, the alkyl group may have a substituent, and preferred examples of the substituent include an alkoxy group and a terminal alkoxy polyalkyleneoxy group.

$R^{19}$ is preferably an alkyl group having 1 to 12 carbon atoms, more preferably a linear alkyl group having 1 to 12 carbon atoms, still more preferably a linear alkyl group having 1 to 8 carbon atoms, and particularly preferably a methyl group or an n-octyl group.

$R^{20}$ is preferably an alkyl group having 1 to 8 carbon atoms, more preferably a branched alkyl group having 3 to 8 carbon atoms, still more preferably an isopropyl group or a t-butyl group, and particularly preferably an isopropyl group.

Za' may be a counter ion neutralizing a charge and may be included in Za as the entire compound.

Za' is preferably a sulfonate ion, a carboxylate ion, a tetrafluoroborate ion, a hexafluorophosphate ion, a p-toluenesulfonate ion, or a perchlorate ion and more preferably a p-toluenesulfonate ion or a hexafluorophosphate ion.

Hereinafter, preferred examples of $R^1$ will be illustrated, but the present invention is not limited thereto. Meanwhile, $TsO^-$ represents a tosylate anion.

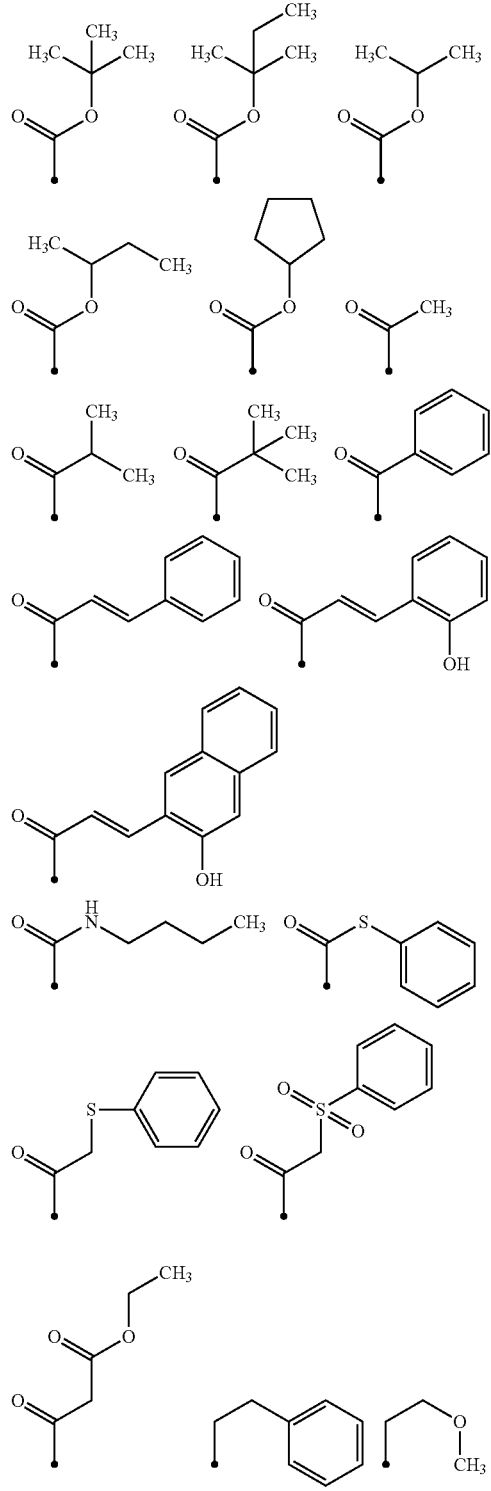

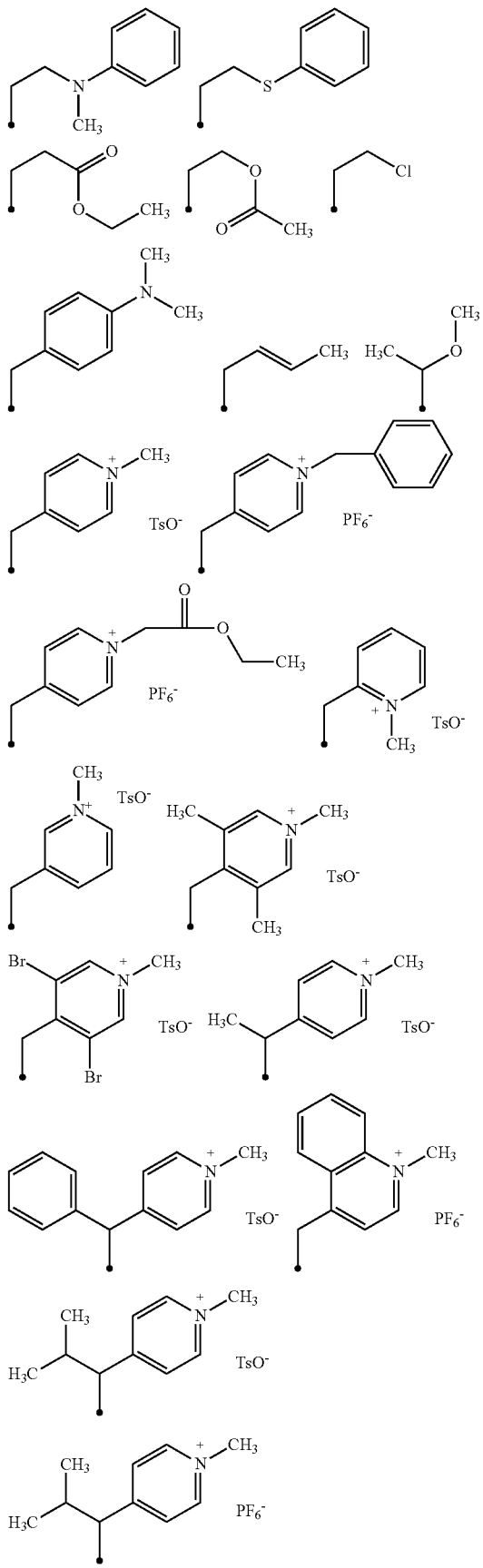

-continued

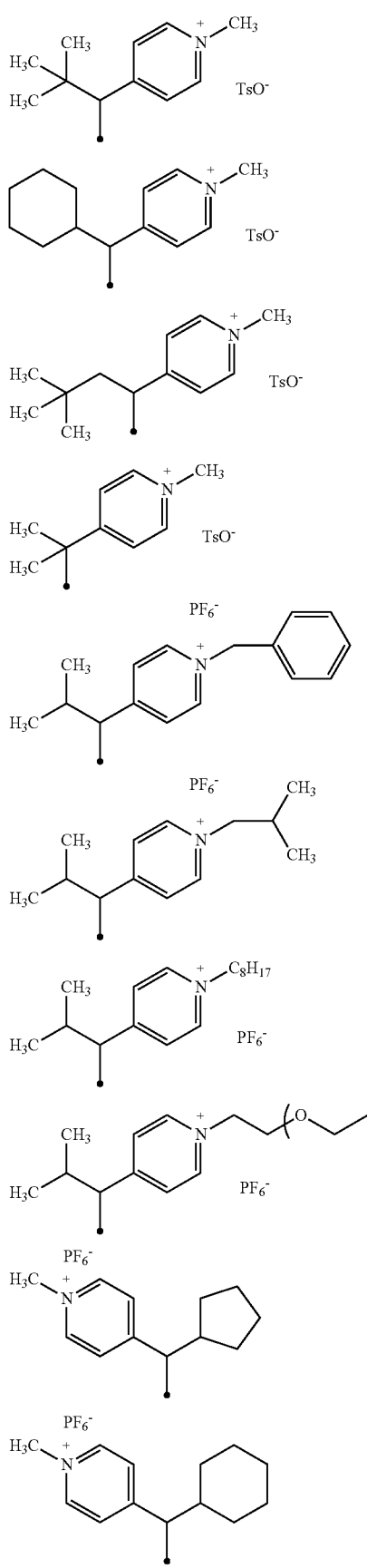
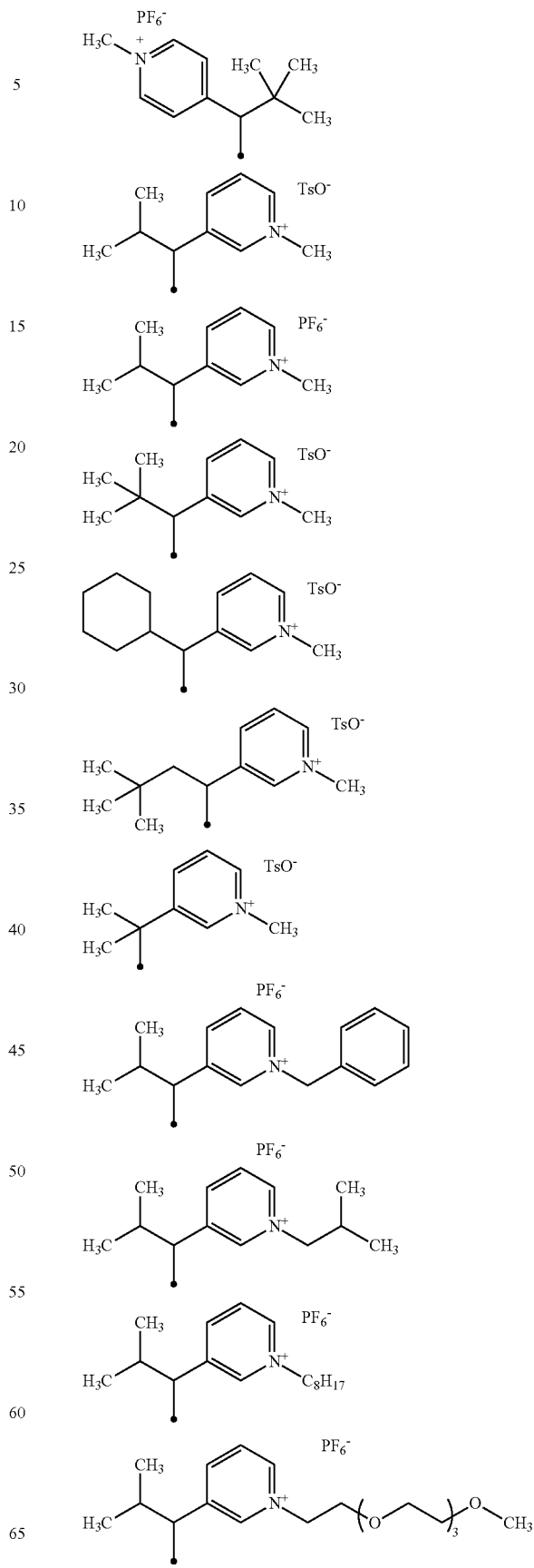

17
-continued
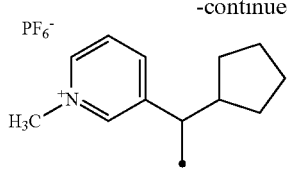
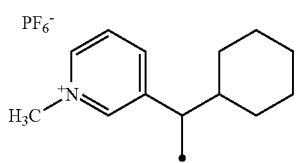
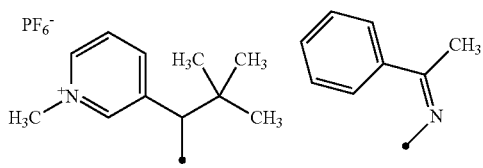
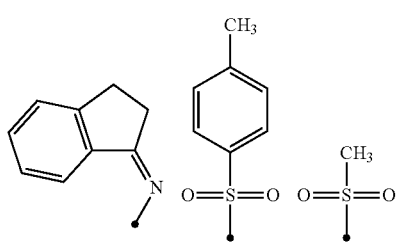
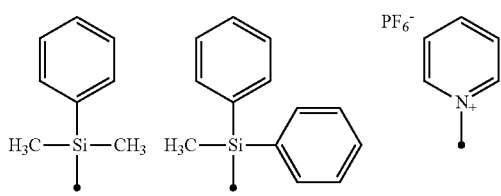
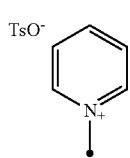
Hereinafter, as specific preferred examples of the compound represented by Formula 1, specific compounds 1 to 45 will be illustrated, but the present invention is not limited thereto. Meanwhile, TsO⁻ represents a tosylate anion.
1
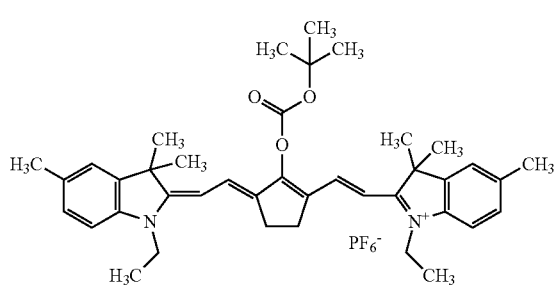
18
-continued
2
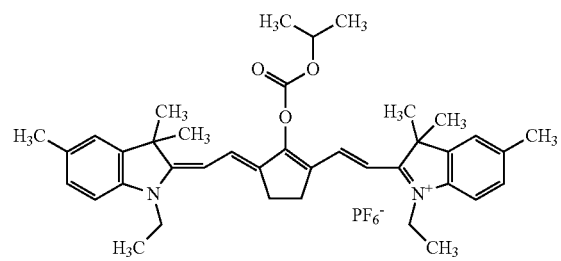
3
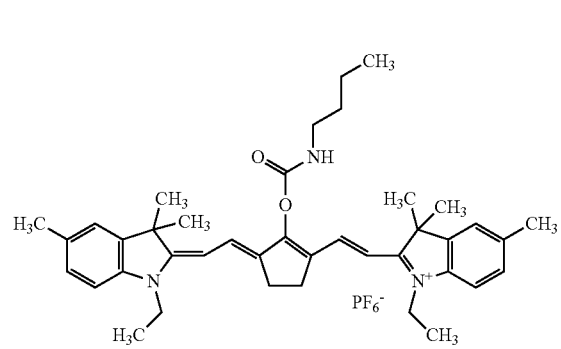
4
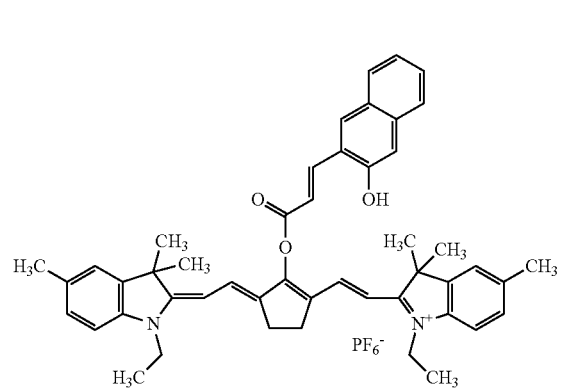
5
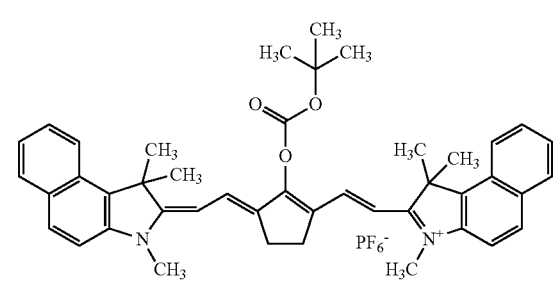
6
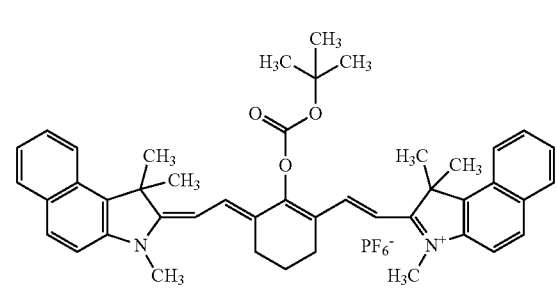

-continued
7
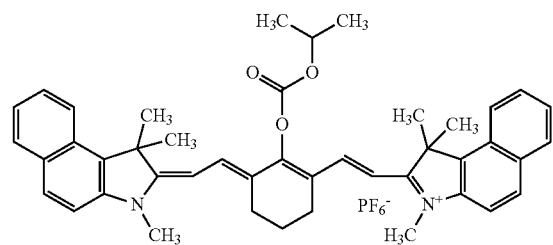
8
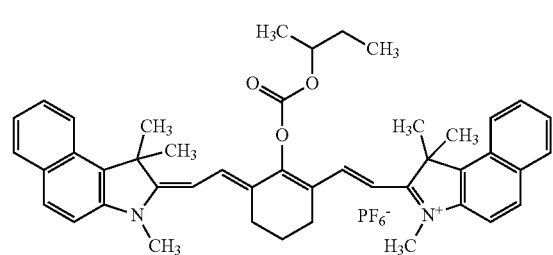
9
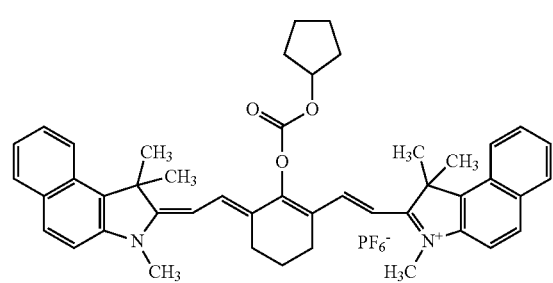
10
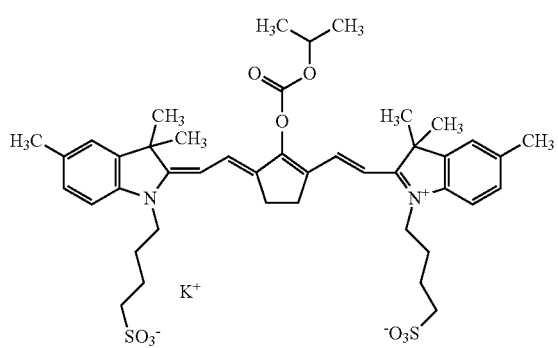
11
-continued
12
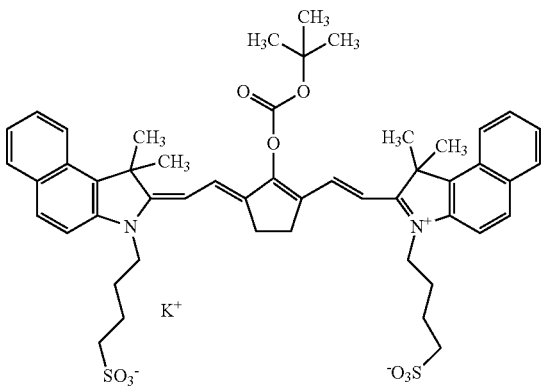
13
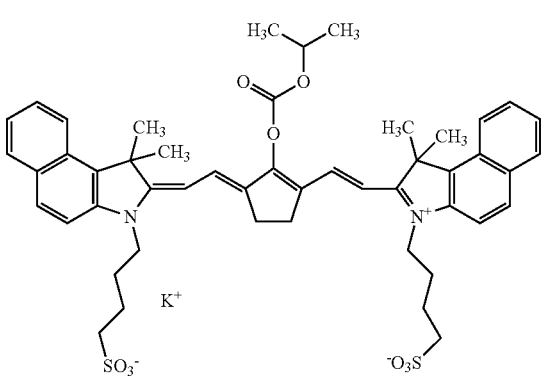
14
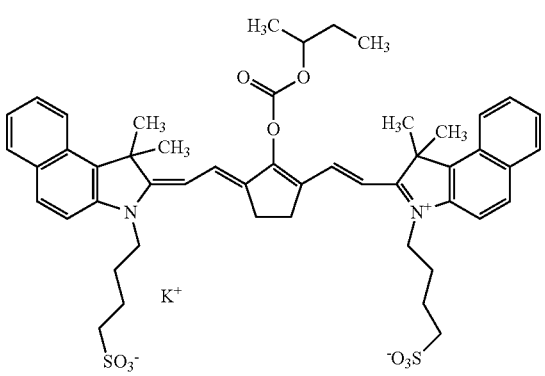
15
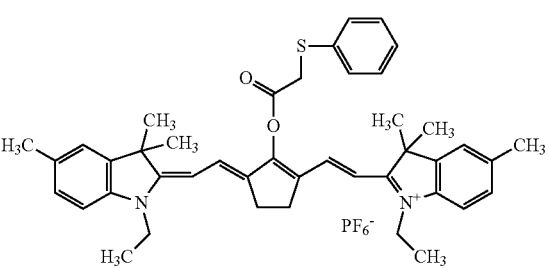

-continued
16
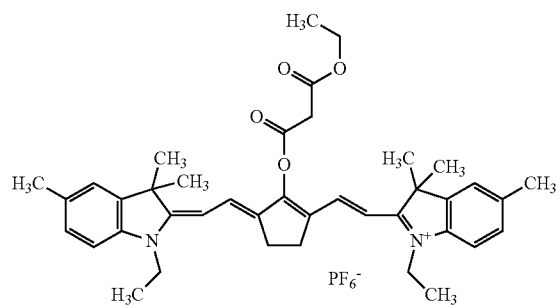
17
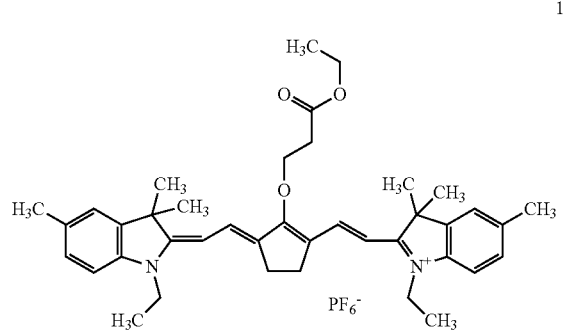
18
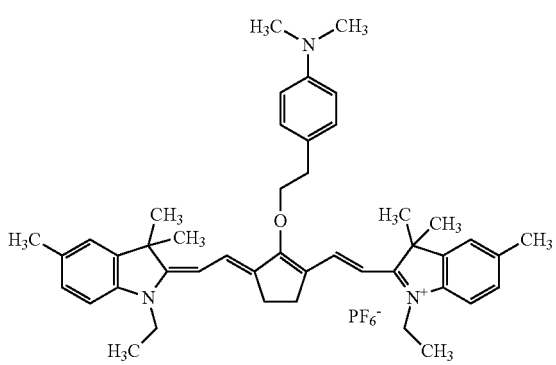
19
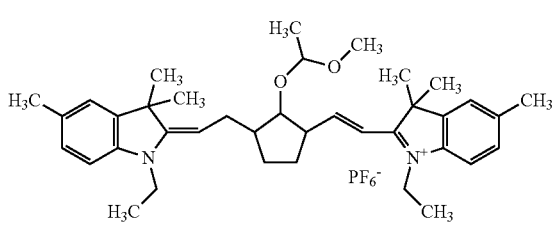
20
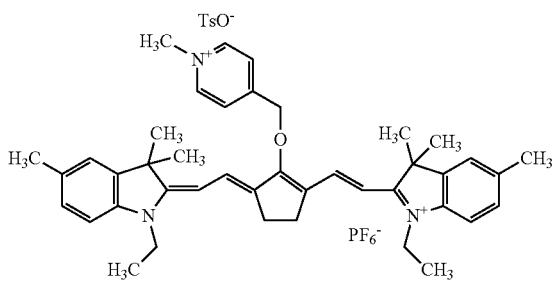
-continued
21
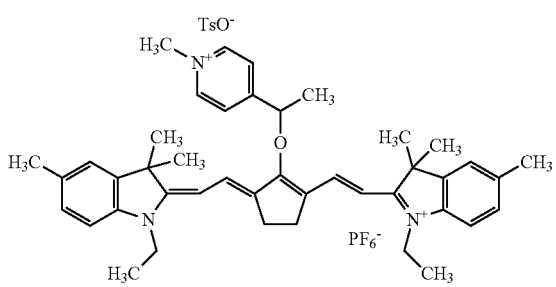
22
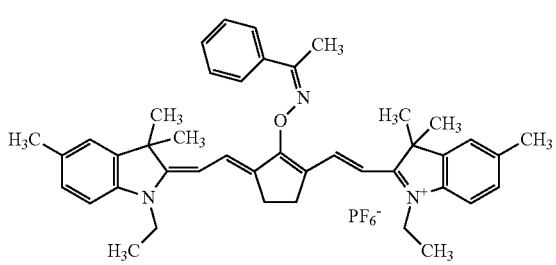

26
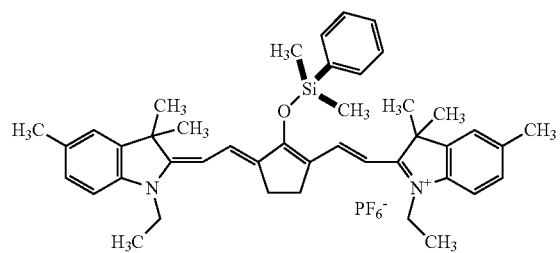
27
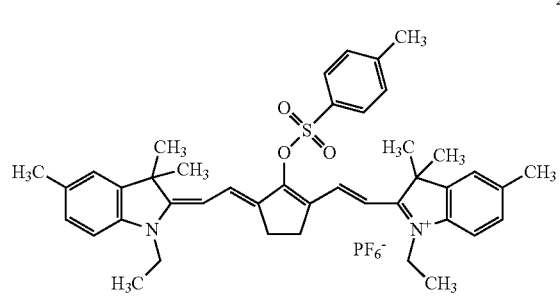
28
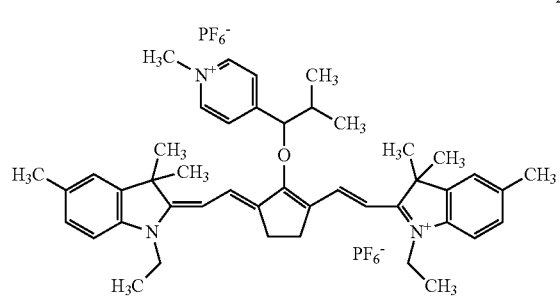
29
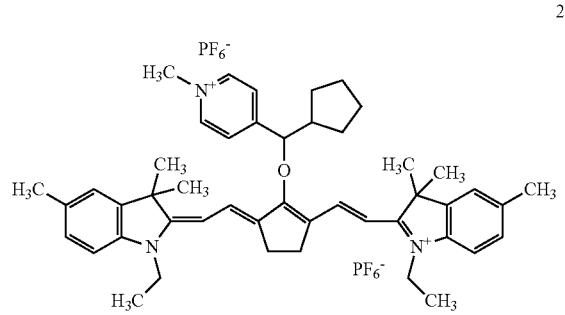
30
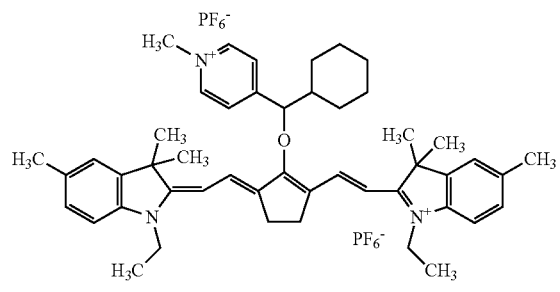
31
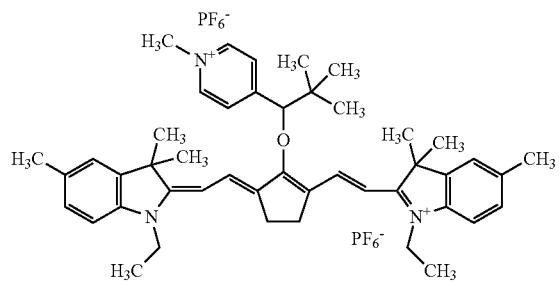
32
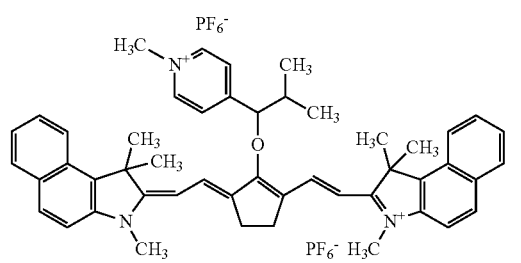
33
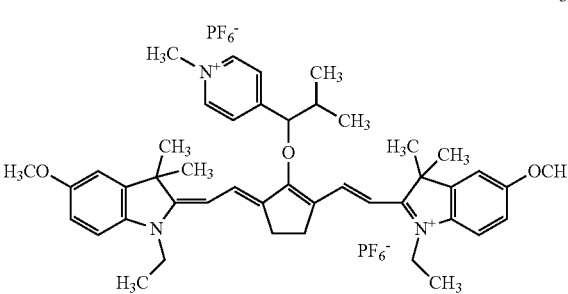
34
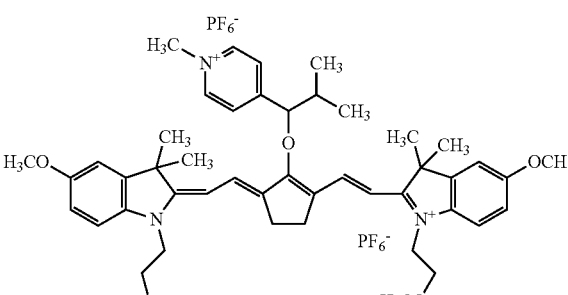
35
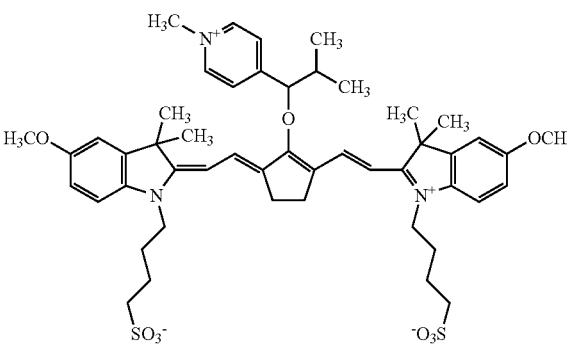

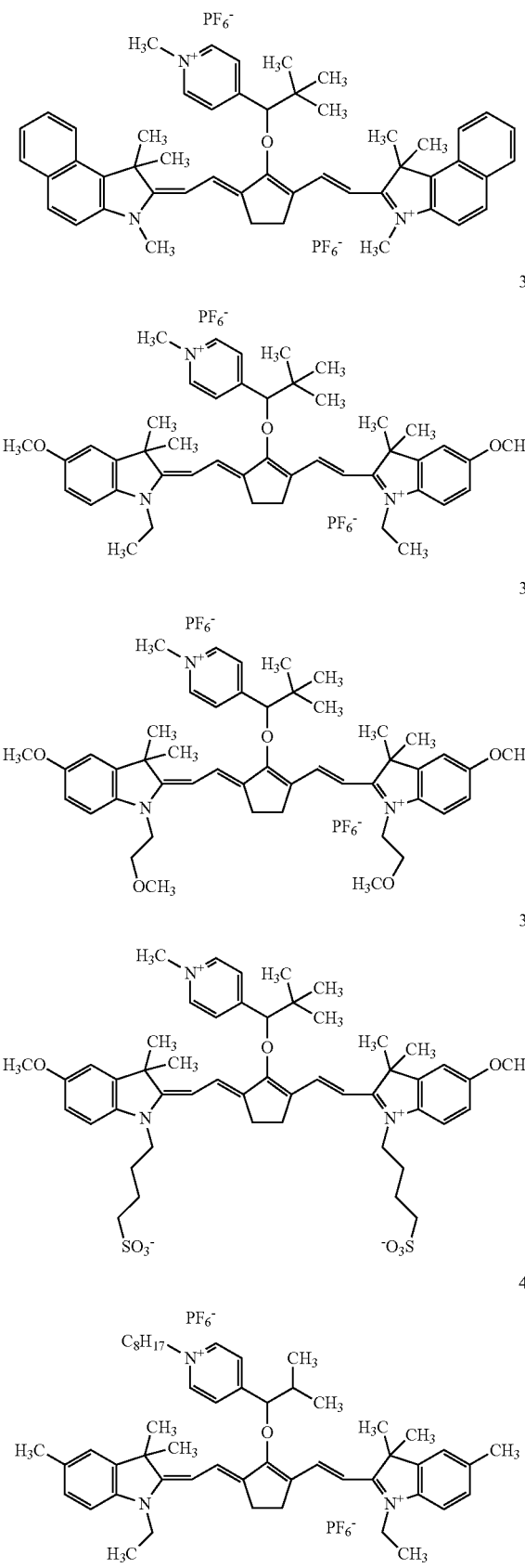
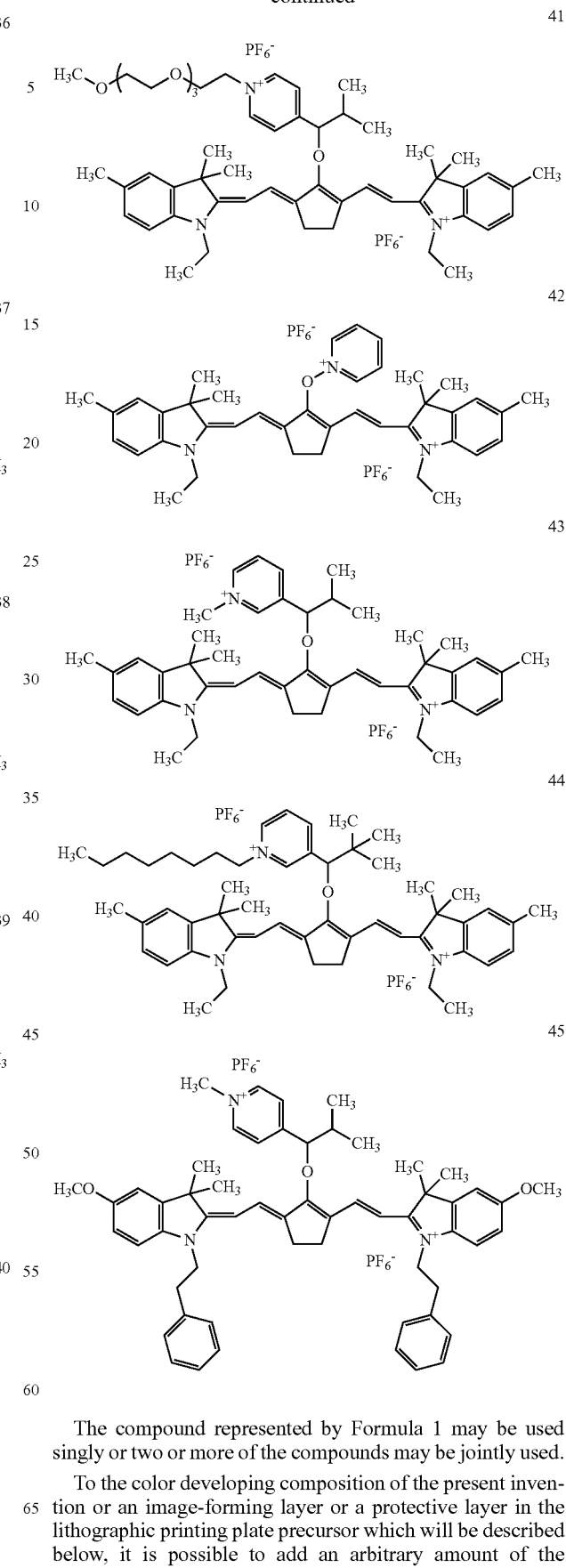
The compound represented by Formula 1 may be used singly or two or more of the compounds may be jointly used.
To the color developing composition of the present invention or an image-forming layer or a protective layer in the lithographic printing plate precursor which will be described below, it is possible to add an arbitrary amount of the compound represented by Formula 1, but the content of the compound represented by Formula 1 is preferably in a range of 0.1% to 95% by mass, more preferably in a range of 1% to 75% by mass, and still more preferably in a range of 1% to 50% by mass of the total solid content of the color developing composition. Meanwhile, the total solid content refers to the total amount of components in the composition or the layer excluding volatile components such as a solvent.

The compound represented by Formula 1 can be obtained according to a synthesis method described below as a synthesis scheme.

Preferred examples of a method for introducing a group represented by any of Formulae 1-1, 1-5, and 1-6 include synthesis schemes represented by Formulae S1 to S3 below, and preferred examples of a method for introducing a group represented by any of Formulae 1-2 to 1-4 include synthesis schemes represented by Formula S4 below.

Meanwhile, DMAP represents N,N-dimethylamino-4-pyridine, AcONa represents sodium acetate, NEt$_3$ represents triethylamine, and catecol is catechol. In addition, R represents a group corresponding to each portion in Formula 1.

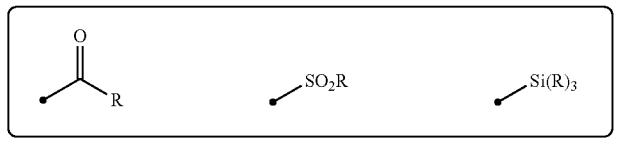

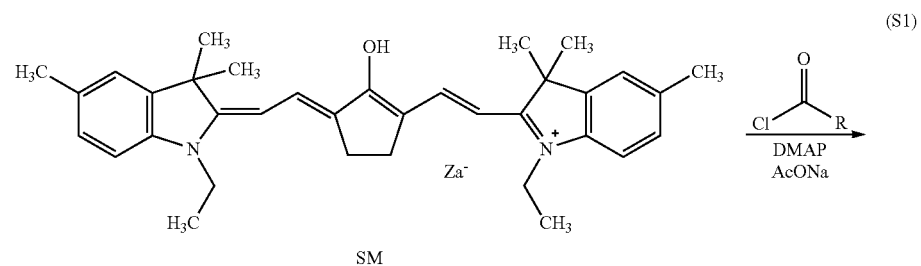

(S1)

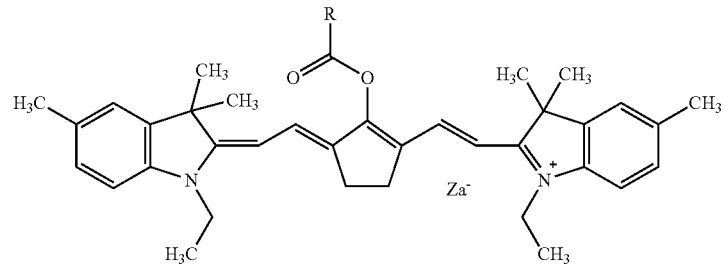

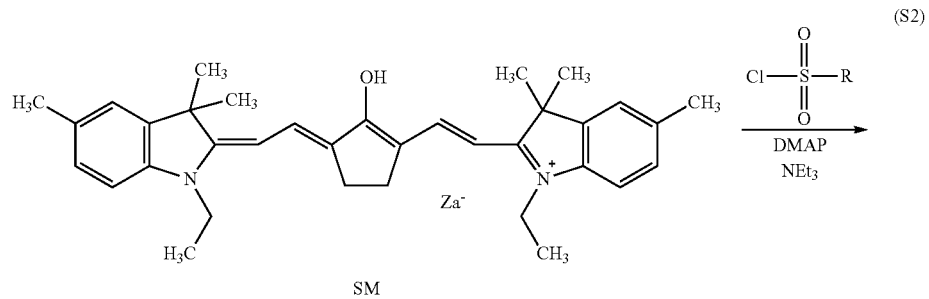

(S2)

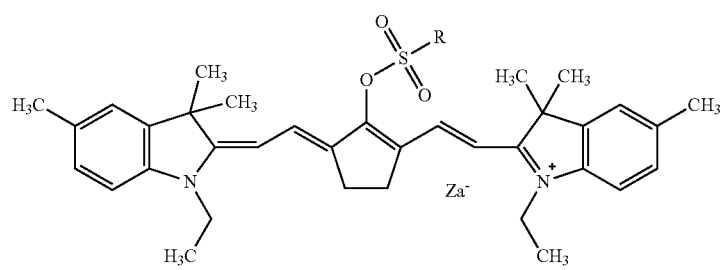

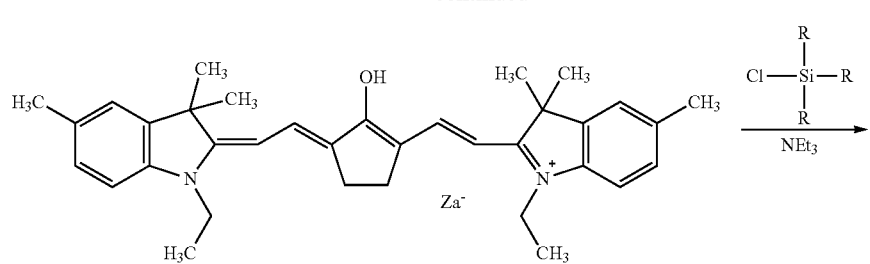

SM

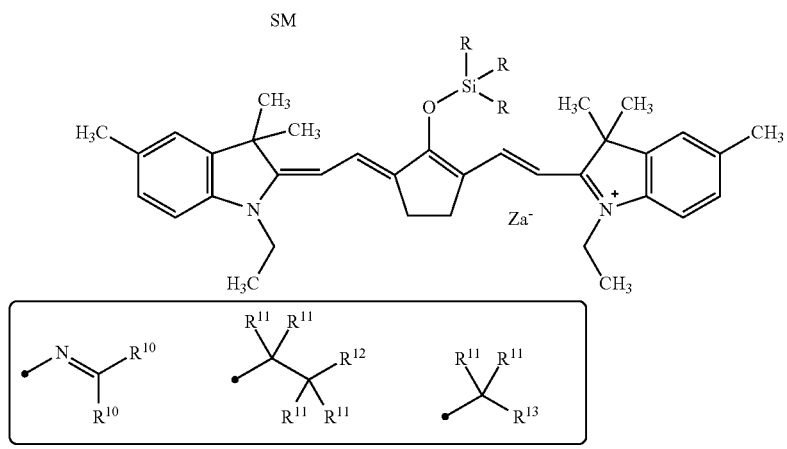

SM-Cl

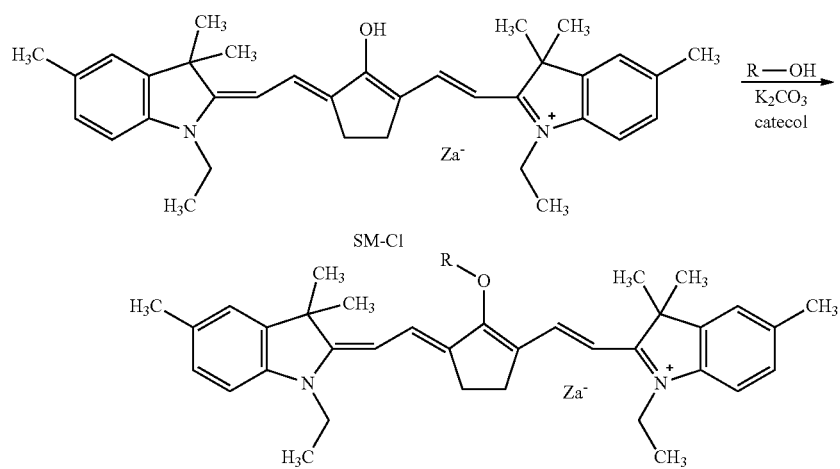

<Binder Polymer>

The color developing composition of the present invention preferably further includes a binder polymer.

The binder polymer that can be used in the present invention is not particularly limited, and well-known binder polymers that are used for photosensitive color developing compositions or thermosensitive color developing compositions can be used. Among these, the binder polymer is preferably an acrylic resin, a polyvinyl acetal resin, or a polyurethane resin.

The binder polymer that is used in the image-recording layer in the lithographic printing plate precursor of the present invention described below is preferably a binder polymer that is used in on-machine development-type lithographic printing plate precursors (hereinafter, also referred to as the binder polymer for on-machine development).

The binder polymer for on-machine development is preferably a binder polymer having alkylene oxide chains. The binder polymer having alkylene oxide chains may have poly(alkylene oxide) portions in main chains or side chains and may be graft polymers having poly(alkylene oxide) in side chains or block copolymers of blocks constituted of repeating units containing poly(alkylene oxide) and blocks constituted of repeating units not containing (alkylene oxide).

In a case in which the binder polymer has poly(alkylene oxide) portions in main chains, polyurethane resins are preferred. Examples of polymers in main chains in a case in which the binder polymer has poly(alkylene oxide) portions in side chains include (meth)acrylic resins, polyvinyl acetal resins, polyurethane resins, polyurea resins, polyimide resins, polyamide resins, epoxy resins, polystyrene resins, novolac-type phenol resins, polyester resins, synthetic rubber, and natural rubber, and (meth)acrylic resins are particularly preferred.

The alkylene oxide is preferably an alkylene oxide having 2 to 6 carbon atoms and particularly preferably an ethylene oxide or a propylene oxide.

The repeating number of the alkylene oxide in the poly (alkylene oxide) portion is preferably in a range of 2 to 120, more preferably in a range of 2 to 70, and still more preferably in a range of 2 to 50.

When the repeating number of the alkylene oxide is 120 or smaller, there are no cases in which printing resistance is degraded due to both friction and ink-receiving properties, which is preferable.

The poly(alkylene oxide) portion is preferably included in a structure represented by Formula (AO) below as the side chain of the binder and more preferably included in the structure represented by Formula (AO) below as the side chain of the (meth)acrylic resin.

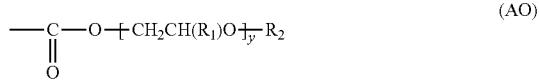

(AO)

In Formula (AO), y represents 2 to 120, $R_1$ represents a hydrogen atom or an alkyl group, and $R_2$ represents a hydrogen atom or a monovalent organic group.

The monovalent organic group is preferably an alkyl group having 1 to 6 carbon atoms, and examples thereof include a methyl group, an ethyl group, an n-propyl group, an isopropyl group, an n-butyl group, a sec-butyl group, a tert-butyl group, an n-pentyl group, an isopentyl group, a neopentyl group, an n-hexyl group, an isohexyl group, 1,1-dimethyl butyl group, 2,2-dimethyl butyl group, a cyclopentyl group, and cyclohexyl group.

In Formula (AO), y is preferably 2 to 70 and more preferably 2 to 50. $R_1$ is preferably a hydrogen atom or a methyl group and particularly preferably a hydrogen atom. $R_2$ is particularly preferably a hydrogen atom or a methyl group.

In order to improve the membrane strengths of image portions, the binder polymer may have crosslinking properties. In order to impart crosslinking properties to the polymer, it is necessary to introduce crosslinking functional groups such as ethylenic unsaturated bonds into main chains or side chains of the polymer. The crosslinking functional group may be introduced by means of copolymerization.

Examples of polymers having ethylenic unsaturated bonds in main chains of the polymers include poly-1,4-butadiene, poly-1,4-isoprene, and the like.

Examples of polymers having ethylenic unsaturated bonds in side chains of the polymers include polymers of esters or amides of acrylic acid or methacrylic acid in which residues (R of —COOR or —CONHR) of the esters or the amides have ethylenic unsaturated bonds.

Examples of residues (the above-described R) having ethylenic saturated bonds include —$(CH_2)_n CR^{1A}$=$CR^{2A}R^{3A}$, —$(CH_2O)_n CH_2 CR^{1A}$=$CR^{2A}R^{3A}$, —$(CH_2CH_2O)_n CH_2 CR^{1A}$=$CR^{2A}R^{3A}$, —$(CH_2)_n NH$—CO—O—$CH_2 CR^{1A}$=$CR^{2A}R^{3A}$, —$(CH_2)_n$—O—CO—$CR^{1A}$=$CR^{2A}R^{3A}$, and —$(CH_2CH_2O)_2$—X (in the formulae, each of $R^{41}$ to $R^{43}$ independently represents a hydrogen atom, a halogen atom, an alkyl group having 1 to 20 carbon atoms, an aryl group, an alkoxy group, or an aryloxy group, and $R^{41}$ and $R^{42}$ or $R^{43}$ may be bonded together and thus form a ring. n represents an integer of 1 to 10. X represents a dicyclopentadienyl residue.).

Specific examples of ester residues include —$CH_2CH$=$CH_2$ (described in JP1995-21633B (JP-H07-21633B)), —$CH_2CH_2O$—$CH_2CH$=$CH_2$, —$CH_2C(CH_3)$=$CH_2$, —$CH_2CH$=$CH$—$C_6H_5$, —$CH_2CH_2OCOCH$=$CH$—$C_6H_5$, —$CH_2CH_2$—NHCOO—$CH_2CH$=$CH_2$, and —$CH_2CH_2O$—X (in the formula, X represents a dicyclopentadienyl residue.).

Specific examples of amide residues include —$CH_2CH$=$CH_2$, —$CH_2CH_2$—Y (in the formula, Y represents a cyclohexene residue.), and —$CH_2CH_2$—OCO—$CH$=$CH_2$.

The binder polymer having crosslinking properties is cured as described below. For example, free radicals (polymerization-initiating radicals or radicals growing in the polymerization process of polymerizable compounds) are added to the crosslinking functional groups and are addition-polymerized between the polymers directly or through polymerization chains of the polymerizable compounds, thereby forming crosslinking between polymer molecules. Alternatively, atoms in the polymers (for example, hydrogen atoms on carbon atoms adjacent to the crosslinking functional groups) are drawn off by free radicals, thus, polymer radicals are generated, and the polymer radicals are bonded to each other, thereby forming crosslinking between polymer molecules.

The content of the crosslinking groups in the binder polymer (the content of unsaturated double bonds that can be radical-polymerized by means of iodimetry) is preferably in a range of 0.1 to 10.0 mmol, more preferably in a range of 1.0 to 7.0 mmol, and particularly preferably in a range of 2.0 to 5.5 mmol per gram of the binder polymer from the viewpoint of a favorable sensitivity and favorable storage stability.

Hereinafter, specific examples 1 to 11 of the binder polymer for on-machine development will be illustrated, but the present invention is not limited thereto. In the following exemplary compounds, numeric values shown beside individual repeating units (numeric values shown beside main chain repeating units) represent the molar percentages of the repeating units. The numeric value shown beside the repeating unit of a side chain represents the number of the repeating portion repeated. In addition, Me represents a methyl group, Et represents an ethyl group, and Ph represents a phenyl group.

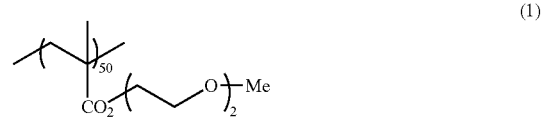

(1)

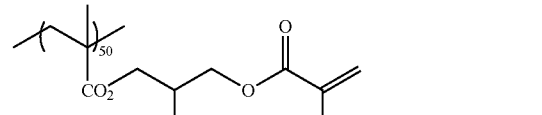

(2)

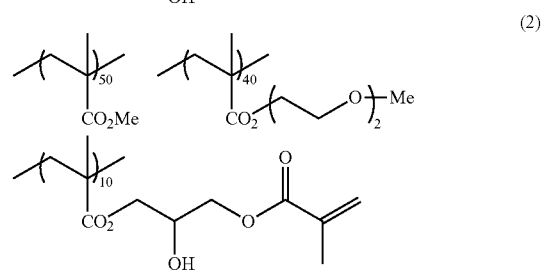

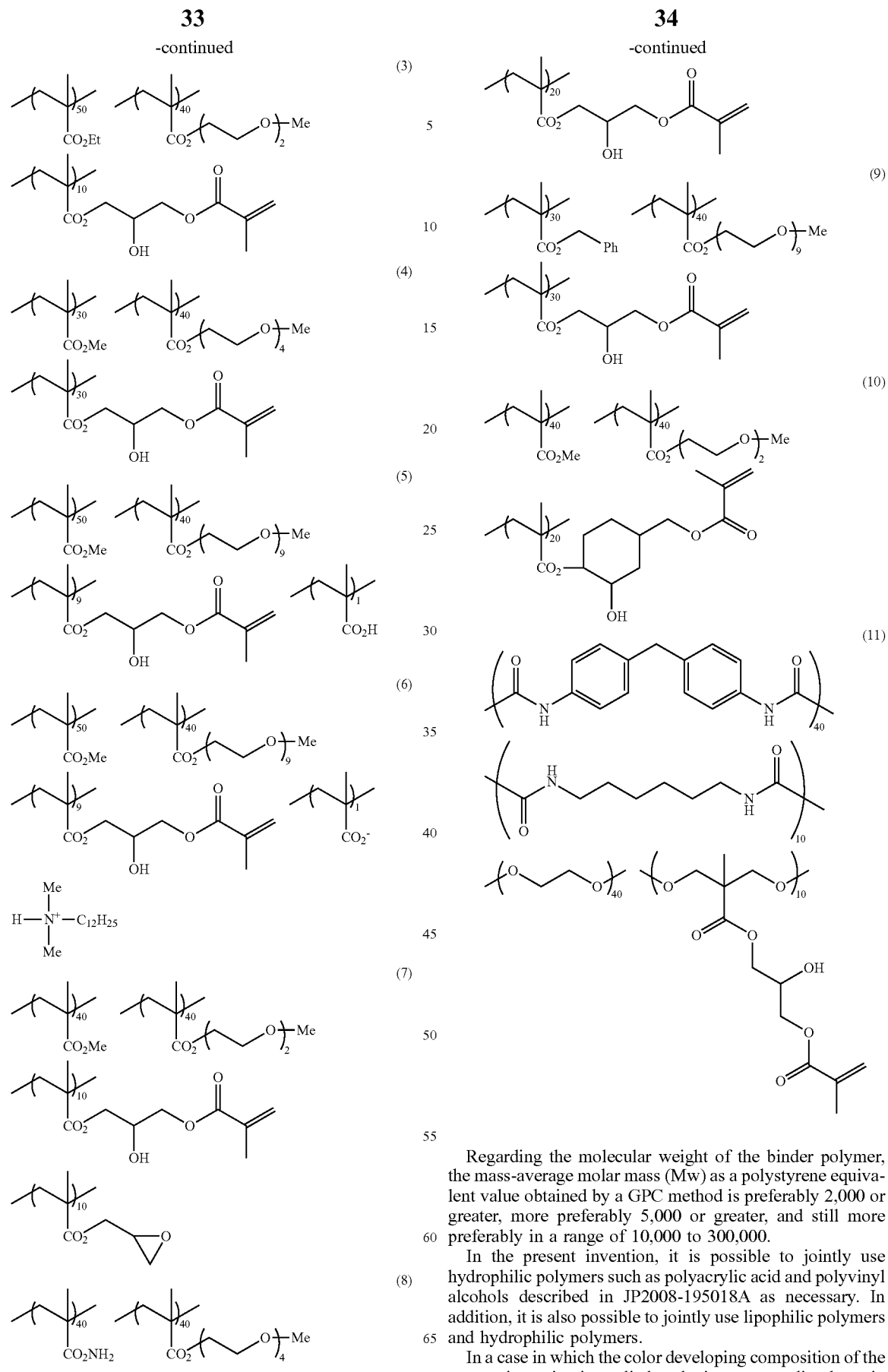

Regarding the molecular weight of the binder polymer, the mass-average molar mass (Mw) as a polystyrene equivalent value obtained by a GPC method is preferably 2,000 or greater, more preferably 5,000 or greater, and still more preferably in a range of 10,000 to 300,000.

In the present invention, it is possible to jointly use hydrophilic polymers such as polyacrylic acid and polyvinyl alcohols described in JP2008-195018A as necessary. In addition, it is also possible to jointly use lipophilic polymers and hydrophilic polymers.

In a case in which the color developing composition of the present invention is applied to the image-recording layer in the lithographic printing plate precursor, the form of the binder polymer may be present as a binder that plays a role of joining individual components or may be present in a particulate form in the color developing composition. In a case in which the binder polymer is present in a particulate form, the average primary particle diameter is preferably in a range of 10 to 1,000 nm, more preferably in a range of 20 to 300 nm, and particularly preferably in a range of 30 to 120 nm.

In the color developing composition of the present invention, the binder polymer may be used singly, or two or more binder polymers may be jointly used.

An arbitrary amount of the binder polymer can be added to the color developing composition of the present invention, but the content of the binder polymer is preferably 1% to 90% by mass and more preferably 5% to 80% by mass of the total solid content of the color developing composition of the present invention.

<Infrared Absorber>

The color developing composition of the present invention preferably further includes an infrared absorber. When including an infrared absorber, the color developing composition of the present invention can be more preferably used as an infrared-sensitive color developing composition.

In addition, even in a case in which the color developing composition of the present invention is used as a thermosensitive color developing composition, the color developing composition may include an infrared absorber.

The infrared absorber (also referred to as "IR colorant" or "infrared-absorbing colorant") is a compound having a function that converts absorbed infrared rays to heat. In addition, the infrared absorber may further have a function of migrating electrons and/or migrating energy to a polymerization initiator described below when excited by infrared rays.

The infrared absorber preferably has the maximum absorption in a wavelength range of 750 to 1,400 nm. In addition, as the infrared absorber, a dye or a pigment is preferably used.

As the dye, a commercially available dye and a well-known dye described in documents such as "Dye Handbook" (edited by The Society of Synthetic Organic Chemistry, Japan, published on 1970) can be used. Specific examples thereof include dyes such as azo dyes, metal complex salt azo dyes, pyrazolone azo dyes, naphthoquinone dyes, anthraquinone dyes, phthalocyanine dyes, carbonium dyes, quinone imine dyes, methine dyes, cyanine dyes, squarylium colorants, pyrylium salts, and metal thiolate complexes.

Among these dyes, preferred examples include cyanine colorants, squarylium colorants, and pyrylium salts. Among these, cyanine colorants are preferred, and indolenine cyanine colorants are particularly preferred.

As specific examples of the cyanine colorants, it is possible to use the compounds described in Paragraphs 0017 to 0019 of JP2001-133969A, Paragraphs 0016 to 0021 of JP2002-023360A, and Paragraphs 0012 to 0037 of JP2002-040638A, preferably use the compounds described in Paragraphs 0034 to 0041 of JP2002-278057A and Paragraphs 0080 to 0086 of JP2008-195018A, and most preferably use the compounds described in Paragraphs 0035 to 0043 of JP2007-90850A.

In addition, the compounds described in Paragraphs 0008 and 0009 of JP1993-5005A (JP-H05-5005A) and Paragraphs 0022 to 0025 of JP2001-222101A can also be preferably used.

As the pigment, the compounds described in Paragraphs 0072 to 0076 of JP2008-195018A are preferred.

In addition, the infrared absorber may be used singly, two or more infrared absorbers may be jointly used, and a pigment and a dye may be jointly used as the infrared absorber.

To the color developing composition of the present invention, an arbitrary amount of the infrared absorber can be added, and the content of the infrared absorber is preferably in a range of 0.05% to 30% by mass, more preferably in a range of 0.1% to 20% by mass, and still more preferably in a range of 0.2% to 10% by mass with respect to 100 parts by mass of the total solid content in the color developing composition or the image-recording layer or the protective layer in the lithographic printing plate precursor.

<Polymerization Initiator>

The color developing composition of the present invention may include a polymerization initiator.

The polymerization initiator that is used in the color developing composition of the present invention is a compound that generates polymerization-initiating species such as radicals or cations using the energy of either or both light and heat, and it is possible to appropriately select and use well-known thermopolymerization initiators, compounds having bonds with a small bond dissociation energy, photopolymerization initiators, and the like.

The polymerization initiator is preferably a radical polymerization initiator and more preferably an onium salt.

In addition, the polymerization initiator is preferably an infrared-sensitive polymerization initiator.

The polymerization initiator may be used singly, or two or more polymerization initiators may be jointly used.

Examples of the radical polymerization initiator include (a) organic halides, (b) carbonyl compounds, (c) azo compounds, (d) organic peroxides, (e) metallocene compounds, (f) azide compounds, (g) hexaarylbiimidazole compounds, (h) organic borate compounds, (i) disulfone compounds, (j) oxime ester compounds, and (k) onium salt compounds.

(a) The organic halides are preferably, for example, compounds described in Paragraphs 0022 and 0023 of JP2008-195018A.

(b) The carbonyl compounds are preferably, for example, compounds described in Paragraph 0024 of JP2008-195018A.

(c) As the azo compounds, it is possible to use, for example, azo compounds described in JP1996-108621A (JP-H08-108621A).

(d) The organic peroxides are preferably, for example, compounds described in Paragraph 0025 of JP2008-195018A.

(e) The metallocene compounds are preferably, for example, compounds described in Paragraph 0026 of JP2008-195018A.

(f) Examples of the azide compounds include compounds such as 2,6-bis(4-azidebenzylidene)-4-methylcyclohexanone.

(g) The hexaarylbiimidazole compounds are preferably, for example, compounds described in Paragraph 0027 of JP2008-195018A.

(h) The organic borate compounds are preferably, for example, compounds described in Paragraph 0028 of JP2008-195018A.

(i) Examples of the disulfone compounds include compounds described in each of JP1986-166544A (JP-S61-166544A) and JP2002-328465A.

(j) The oxime ester compounds are preferably, for example, compounds described in Paragraphs 0028 to 0030 of JP2008-195018A.

Among the above-described polymerization initiators, from the viewpoint of curing properties, more preferred examples of the polymerization initiator include oxime esters and onium salts, and still more preferred examples thereof include iodonium salts, sulfonium salts, and azinium salts. In addition, in a case in which the polymerization initiator is used in the lithographic printing plate precursor, iodonium salts and sulfonium salts are particularly preferred. Specific examples of these compounds will be described below, but the present invention is not limited thereto.

Examples of the iodonium salts are preferably diphenyl iodonium salts, particularly preferably diphenyl iodonium salts substituted with electron-donating groups, for example, alkyl groups or alkoxyl groups, and preferably asymmetric diphenyl iodonium salts. Specific examples thereof include diphenyliodonium=hexafluorophosphate, 4-methoxyphenyl- 4-(2-methylpropyl)phenyliodonium=hexafluoro- phosphate, 4-(2-methylpropyl)phenyl-p-tolyliodonium= hexafluorophosphate, 4-hexyloxyphenyl-2,4,6-trimethoxyphenyl iodonium=hexafluorophosphate, 4-hexyloxyphenyl-2,4-diethoxyphenyl iodonium=tetrafluoroborate, 4-octyloxyphenyl-2,4,6-trimethoxyphenyl iodonium=1-perfluorobutane sulfonate, 4-octyloxyphenyl-2,4,6-trimethoxypheny liodonium=hexafluorophosphate, and bis(4-t-butylphenyl) iodonium=hexafluorophosphate.

Examples of the sulfonium salts are preferably triarylsulfonium salts, particularly preferably triarylsulfonium salts in which at least some of electron-attracting groups, for example, groups on aromatic rings are substituted with halogen atoms, and still more preferably triarylsulfonium salts in which the total number of substituted halogen atoms on aromatic rings is four or greater. Specific examples thereof include triphenylsulfonium=hexafluorophosphate, triphenylsulfonium=benzoyl formate, bis(4-chlorophenyl)phenylsulfonium=benzoyl formate, bis(4-chlorophenyl)-4-methylphenylsulfonium=tetrafluoroborate, tris(4-chlorophe- nyl)sulfonium=3,5-bis(methoxycarbonyl)benzenesulfonate, tris(4-chlorophenyl)sulfonium=hexafluo- rophosphate, and tris(2,4-dichlorophenyl)sulfonium=hexaflu- orophosphate.

The content of the polymerization initiator is preferably in a range of 0.1% to 50% by mass, more preferably in a range of 0.5% to 30% by mass, and particularly preferably in a range of 0.8% to 20% by mass of the total solid content of the color developing composition.

<Polymerizable Compound>

The color developing composition of the present invention may include a polymerizable compound. The color developing composition of the present invention including the polymerizable compound is a curable color developing composition having a polymerization curing function in addition to color-developing properties by means of heat supply and/or exposure to infrared rays.

In addition, the color developing composition of the present invention can be preferably used as a curable composition including the polymerization initiator and the polymerizable compound and can be more preferably used as an infrared ray-curable or infrared-sensitive color developing composition.

The polymerizable compound that is used in the color developing composition of the present invention may be, for example, a radical polymerizable compound or a cationic polymerizable compound, but is preferably an addition polymerizable compound having at least one ethylenic unsaturated bond (ethylenic unsaturated compound). The ethylenic unsaturated compound is preferably a compound having at least one terminal ethylenic unsaturated bond and more preferably a compound having two or more terminal ethylenic unsaturated bonds. The polymerizable compound has a chemical form, for example, a monomer, a prepolymer, that is, a dimer, a trimer, or an oligomer, or a mixture thereof.

Examples of the monomer include unsaturated carboxylic acids (for example, acrylic acid, methacrylic acid, itaconic acid, crotonic acid, isocrotonic acid, maleic acid, and the like), esters thereof, and amides thereof, and esters of unsaturated carboxylic acids and polyvalent amine compounds and amides of unsaturated carboxylic acids and polyhydric alcohol compounds are preferably used. In addition, addition reaction products between unsaturated carboxylic acid esters or amides having nucleophilic substituents such as hydroxy groups, amino groups, or mercapto groups and monofunctional or polyfunctional isocyanates or epoxies, dehydration condensation reaction products with monofunctional or polyfunctional carboxylic acids, and the like are also preferably used. In addition, addition reaction products between unsaturated carboxylic acid esters or amides having electrophilic substituents such as isocyanate groups and epoxy groups and monofunctional or polyfunctional alcohols, amines, or thiols, furthermore, substitution reaction products between unsaturated carboxylic acid esters or amides having dissociable substituents such as halogen atoms and tosyloxy groups and monofunctional or polyfunctional alcohols, amines, or thiols are also preferred. In addition, as additional examples, compound groups obtained by substituting the unsaturated carboxylic acids with unsaturated phosphonic acids, styrene, vinyl ethers, or the like can also be used. These monomers are described in JP2006-508380A, JP2002-287344A, JP2008-256850A, JP2001-342222A, JP1997-179296A (JP-H09-179296A), JP1997-179297A (JP-H09-179297A), JP1997-179298A (JP-H09-179298A), JP2004-294935A, JP2006-243493A, JP2002-275129A, JP2003-64130A, JP2003-280187A, JP1998-333321A (JP-H10-333321A), and the like.

As specific examples of monomers of esters of polyhydric alcohol compounds and unsaturated carboxylic acids, examples of acrylic acid esters include ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanuric acid ethylene oxide (EO)-modified triacrylate, polyester acrylate oligomers, and the like. Examples of methacrylic acid esters include tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryloxy-2-hydroxypropoxy)phenyl] dimethyl methane, bis[p-(methacryloxyethoxy)phenyl] dimethyl methane, and the like. In addition, specific examples of monomers of amides of polyvalent amine compounds and unsaturated carboxylic acids include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide, xylylene bismethacrylamide, and the like.

In addition, urethane-based addition polymerizable compounds produced using an addition reaction between an isocyanate and a hydroxy group are also preferred, and specific examples thereof include vinyl urethane compounds having two or more polymerizable vinyl groups in one monomer obtained by adding vinyl monomers having a hydroxy group represented by Formula (M) below to a polyisocyanate compound having two or more isocyanate groups in one molecule which is described in, for example, JP1973-41708B (JP-S48-41708B).

$$CH_2=C(R^{M4})COOCH_2CH(R^{M5})OH \quad (M)$$

In Formula (M), each of $R^{M4}$ and $R^{M5}$ independently represents a hydrogen atom or a methyl group.

In addition, urethane acrylates described in JP1976-37193A (JP-S51-37193A), JP1990-32293B (JP-H02-32293B), JP1990-16765B (JP-H02-16765B), JP2003-344997A, and JP2006-65210A, urethane compounds having ethylene oxide-based skeletons described in JP1983-49860B (JP-S58-49860B), JP1981-17654B (JP-S56-17654B), JP1987-39417B (JP-S62-39417B), JP1987-39418B (JP-S62-39418B), JP2000-250211A, and JP2007-94138A, and urethane compounds having hydrophilic groups described in U.S. Pat. No. 7,153,632B, JP1996-505958A (JP-H08-505958A), JP2007-293221A, and JP2007-293223A are also preferred.

The details of the structures of the polymerizable compound and the method for using the polymerizable compound such as whether to use the polymerizable compound singly or jointly and the amount of the polymerizable compound added can be arbitrarily set in consideration of the applications and the like of the final color developing composition or the lithographic printing plate precursor.

The content of the polymerizable compound is preferably in a range of 5% by mass to 75% by mass, more preferably in a range of 10% to 70% by mass, and particularly preferably in a range of 15% to 60% by mass of the total solid content of the color developing composition.

<Radical Aid>

From the viewpoint of improving printing resistance in the lithographic printing plate, the color developing composition of the present invention preferably includes a radical aid described below, and five kinds of radical aids will be described below as examples thereof.

(i) Alkyl or aryl ate complexes: It is considered that carbon-hetero bonds are oxidatively cleaved and active radicals are generated. Specifically, borate compounds are preferred.

(ii) N-arylalkylamine compounds: It is considered that C—X bonds on carbon adjacent to nitrogen are cleaved due to oxidation and active radicals are generated. X is preferably a hydrogen atom, a carboxyl group, a trimethylsilyl group, or a benzyl group. Specific examples thereof include N-phenylglycines (which may or may not have a substituent in a phenyl group) and N-phenyl iminodiacetic acids (which may or may not have a substituent in a phenyl group).

(iii) Sulfur-containing compounds: The above-described amine in which a nitrogen atom is substituted with a sulfur atom are capable of generating active radicals by means of the same action. Examples thereof include phenylthioacetic acids (which may or may not have a substituent in a phenyl group).

(iv) Tin-containing compounds: The above-described amine in which a nitrogen atom is substituted with a tin atom are capable of generating active radicals by means of the same action.

(v) Sulfinates: Active radicals can be generated by means of oxidation. Specific examples thereof include sodium aryl sulfinate.

Among these, the color developing composition of the present invention preferably contains a borate compound.

The borate compound is preferably a tetraaryl compound or a monoalkyltriaryl compound, more preferably a tetraaryl compound from the viewpoint of the stability of the compound and the potential difference described below, and particularly preferably a tetraaryl compound having one or more aryl groups having an electron-attracting group from the viewpoint of the potential difference described below.

The electron-attracting group is preferably a group having a positive σ value of the Hammett equation and more preferably a group having a σ value of the Hammett equation in a range of 0 to 1.2. The σ value of the Hammett (the σp value and the σm value) are described in detail in Hansch, C.; Leo, A.; Taft, R. W., Chem. Rev., 1991, 91, 165 to 195.

Among these, the electron-attracting group is preferably a halogen atom, a trifluoromethyl group, and a cyano group and more preferably a fluorine atom, a chlorine atom, a trifluoromethyl group, and a cyano group.

A counter cation in the borate compound is not particularly limited, but is preferably an alkali metal ion or a tetraalkyl ammonium ion and more preferably a sodium ion, a potassium ion, or a tetrabutylammonium ion.

In addition, in a case in which the color developing composition of the present invention includes the borate compound, the potential difference ΔG2 between the highest occupied molecular orbital (HOMO) of the compound represented by Formula 1 and the highest occupied molecular orbital of the borate compound (ΔG2=the HOMO of the specific compound-the HOMO of the borate compound) is preferably 0.500 eV or more, more preferably 0.585 eV or more, and particularly preferably 0.608 to 1.000 eV.

When the potential difference between the HOMO of the compound represented by Formula 1 and the HOMO of the borate compound is in the above-described range, it is assumed that the stability of the borate compound while not exposed to heat or infrared rays is excellent, and, when the borate compound is exposed to heat or infrared rays, electrons migrate from the HOMO of the borate compound to the HOMO of the compound represented by Formula 1, and thus the excitation of electrons to the lowest unoccupied molecular orbital (LUMO) of the compound represented by Formula 1 is accelerated, and the decomposition of the compound represented by Formula 1 is accelerated, and it is assumed that the electron migration from the compound represented by Formula 1 to the polymerization initiator is also accelerated, and the printing resistance also improves in a case in which the color developing composition is used for a photosensitive layer in the lithographic printing plate precursor.

In the present invention, the HOMO and LUMO of compounds are computed using the following method.

First, counter anions in compounds which are computation subjects are ignored.

Quantum chemical calculation software Gaussian 09 is used, and structure optimization is carried out in DFT (B3LYP/6-31G(d)).

The molecular orbital (MO) energy is calculated using the structure obtained by means of the structure optimization in DFT (B3LYP/6-31+G(d,p)/CPCM (solvent=methanol)).

The MO energy Epre (unit: hartree) obtained by the above-described MO energy calculation is converted to Eaft (unit: eV) which is used as the HOMO and LUMO values in the present invention using the following expression.

$$Eaft=0.823168\times27.2114\times Epre-1.07634$$

Meanwhile, 27.2114 is simply a coefficient for converting hartree to eV, 0.823168 and −1.07634 are adjustment coefficients, and the HOMO and LUMO of compounds which are computation subjects are determined so that computation matches actually measured values.

ΔG2 is obtained from the difference between the HOMO of the compound represented by Formula 1 and the HOMO of the borate compound (ΔG2=the HOMO of the compound represented by Formula 1-the HOMO of the borate compound).

Specifically, the borate compound is preferably one of compounds illustrated below. $X_c^+$ represents a monovalent cation and is preferably an alkali metal ion or a tetraalkyl ammonium ion and more preferably an alkali metal ion or a tetrabutyl ammonium ion. In addition, Bu represents an n-butyl group.

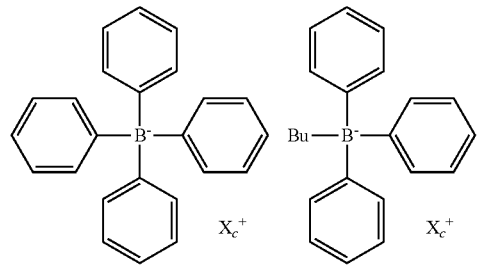

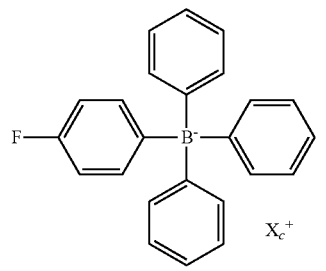

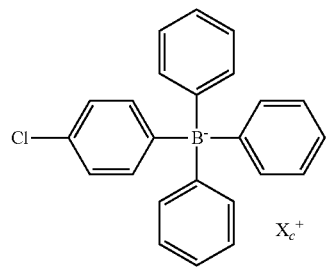

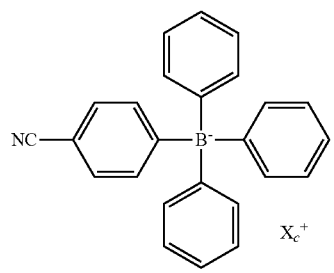

-continued

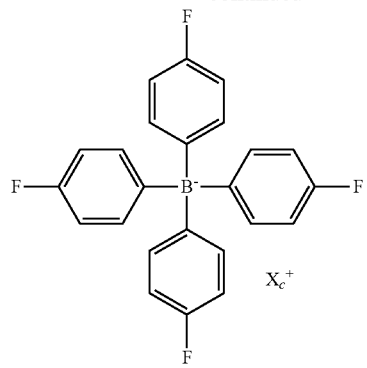

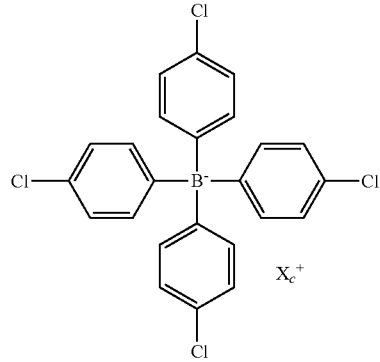

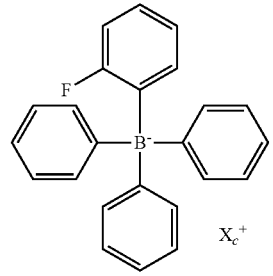

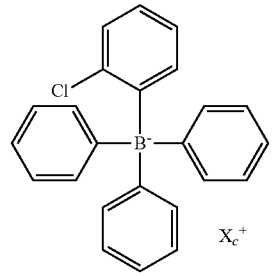

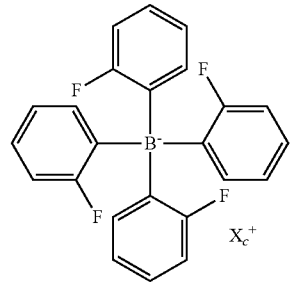

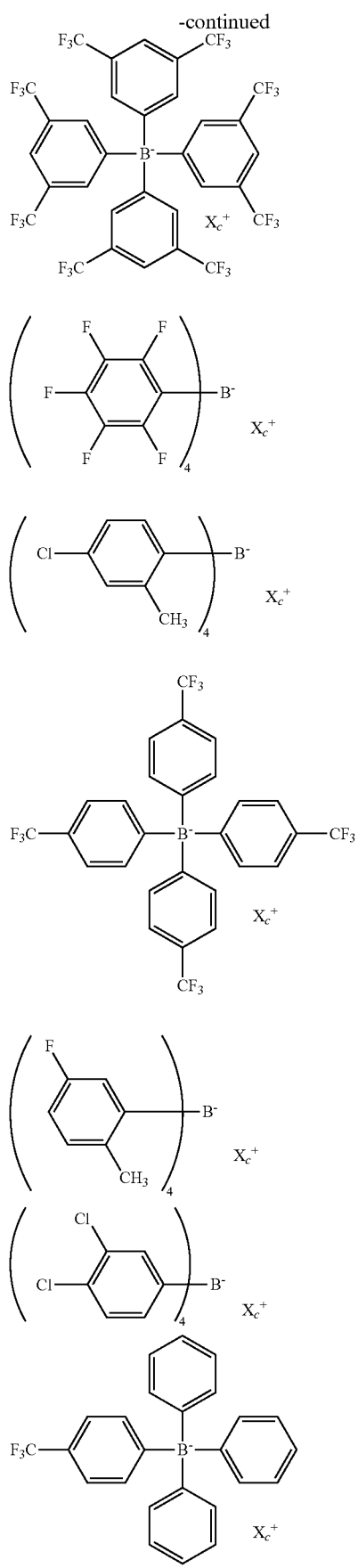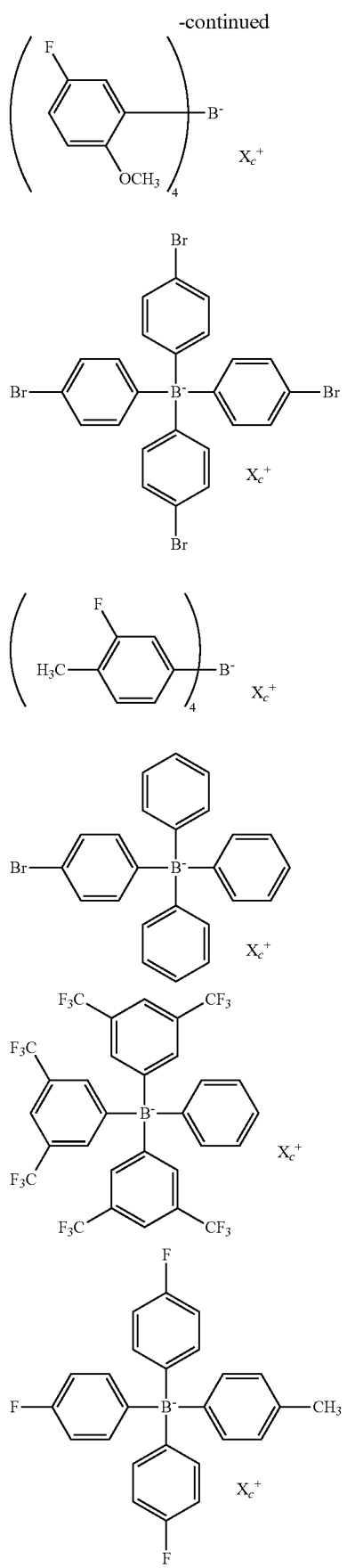

-continued

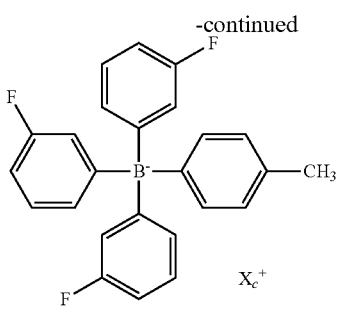

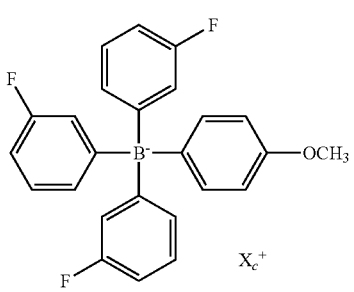

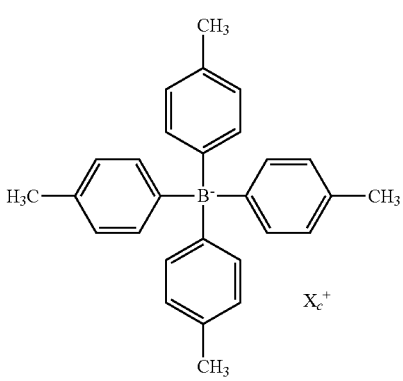

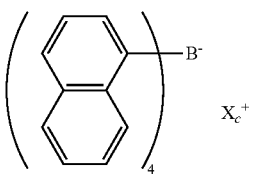

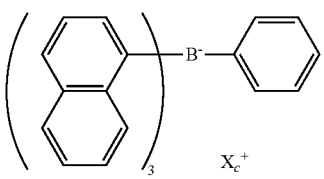

Only one radical aid may be added thereto or two or more radical aids may be jointly used.

The content of the radical aid is preferably 0.01% to 30% by mass, more preferably 0.05% to 25% by mass, and still more preferably 0.1% to 20% by mass of the total solid content of the color developing composition.

<Chain Transfer Agent>

The color developing composition of the present invention preferably includes a chain transfer agent, more preferably includes a chain transfer agent, the polymerization initiator, and the polymerizable compound, and particularly preferably includes a chain transfer agent, the borate compound, the polymerization initiator, and the polymerizable compound. In this aspect, the color-developing properties are superior, and, in a case in which the color developing composition is used for the image-recording layer or the protective layer in the lithographic printing plate precursor, the printing resistance is superior and the halftone dot reproducibility is excellent.

In addition, the color developing composition of the present invention more preferably includes a chain transfer agent and the borate compound. In this aspect, the color-developing properties are superior, and, in a case in which the color developing composition is used for the image-recording layer or the protective layer in the lithographic printing plate precursor, the printing resistance is superior.

The chain transfer agent is preferably a thiol compound, more preferably a C7 or higher thiol from the viewpoint of the boiling point (difficulty of being volatilized), and still more preferably a compound having a mercapto group on an aromatic ring (aromatic thiol compound). In this aspect, the color-developing properties are superior, and, in a case in which the color developing composition is used for the image-recording layer or the protective layer in the lithographic printing plate precursor, the printing resistance is superior, and the halftone dot reproducibility is excellent.

In addition, the thiol compound is preferably a monofunctional thiol compound.

Specific examples of the chain transfer agent preferably include the following compounds:

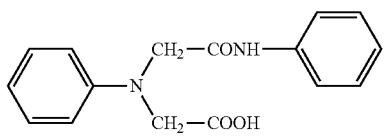 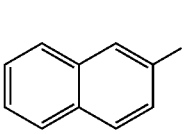 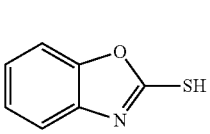 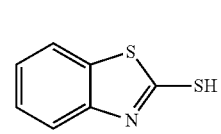

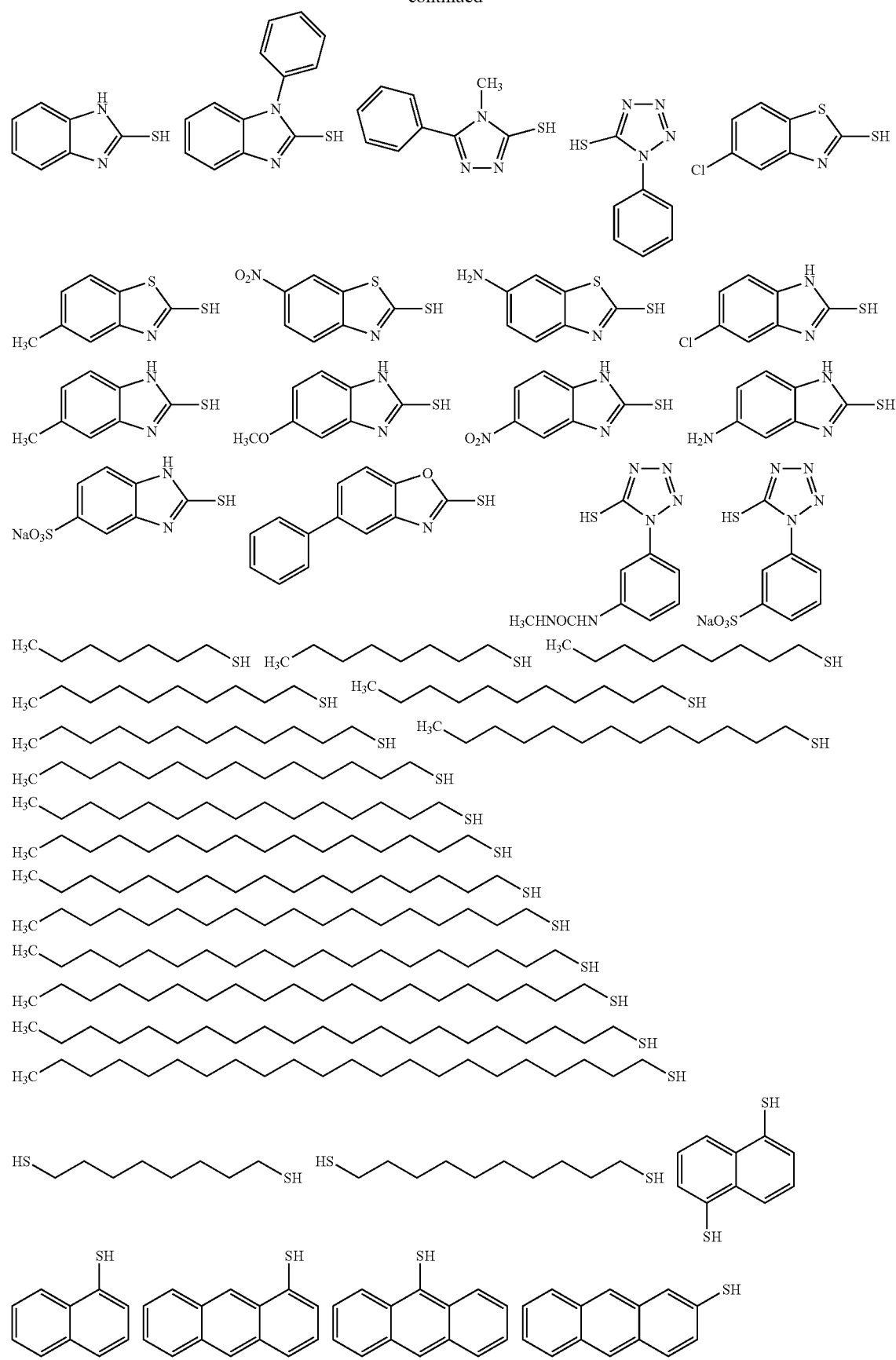

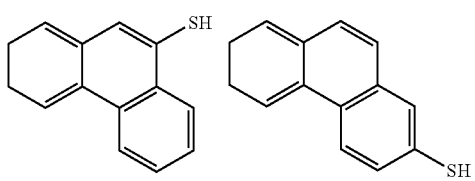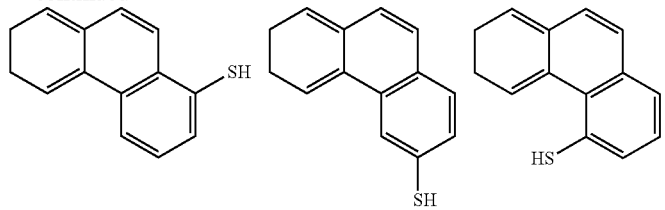

Only one chain transfer agent may be added thereto or two or more chain transfer agents may be jointly used.

The content of the chain transfer agent is preferably 0.01% to 50% by mass, more preferably 0.05% to 40% by mass, and still more preferably 0.1% to 30% by mass of the total solid content of the color developing composition.

The color developing composition of the present invention may include other additives depending on purposes. A liquid obtained by dissolving or dispersing the color developing composition in an appropriate solvent is applied and dried onto a support or the like so as to form a color developing composition film, and thus the color developing composition film can be used for thermosensitive color developing materials, infrared-sensitive color developing materials, and the like.

Thermosensitive color developing materials can be used in a broad range as thermosensitive recording medium such as tickets or receipts in facsimile, terminal printers of computers, automatic vending machines, measurement recorders, registers of supermarkets or convenience stores, and the like. In addition, infrared-sensitive color developing compositions can also be used for print-out image of printing plates.

In the present invention, the color developing composition may be used for coating by dissolving or dispersing the respective components in a variety of solvents.

As the solvents, well-known solvents can be used. Specific examples thereof include water, acetone, methyl ethyl ketone (2-butanone), cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 1-methoxy-2-propanol, 3-methoxy-1-propanol, methoxy methoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethyl formamide, dimethyl sulfoxide, γ-butyrolactone, methyl lactate, ethyl lactate, and the like. These solvent may be used singly or two or more solvents may be used in a mixed form. Meanwhile, the concentration of the solid content in the coating fluid is preferably in a range of 1% by mass to 50% by mass. Meanwhile, the concentration of the solid content refers to the concentration of all components excluding solvents.

In addition, the color developing composition of the present invention can be preferably used for the image-recording layer in the lithographic printing plate precursor.

In a case in which the color developing composition is used for the image-recording layer, the color developing composition of the present invention more preferably includes the polymerization initiator and the polymerizable compound.

In addition, in a case in which the color developing composition is used for the image-recording layer, the infrared-sensitive color developing composition of the present invention may also include well-known additives that are used for the image-recording layer.

As other constitutions of the lithographic printing plate precursor, well-known constitutions can be used as desired. For example, it is possible to provide an undercoat layer between the support and the image-recording layer and provide the protective layer on the image-recording layer.

In addition, the lithographic printing plate precursor can be preferably used as on-machine development-type lithographic printing plate precursors which enable development processes on printing machines.

In addition, regarding the constituent elements of the lithographic printing plate precursor, it is possible to refer to, for example, JP2013-199089A, JP2008-284817A, JP2006-091479A, US2008/0311520A, JP2008-195018A, and the like.

The color developing composition of the present invention may further include well-known additives that are ordinarily used for the color developing composition and the image-forming layer and the protective layer in the lithographic printing plate precursor, depending on purposes.

The respective components of the color developing composition are dissolved or dispersed in an appropriate solvent so as to prepare a coating fluid, the coating fluid is applied and dried onto an appropriate support or the like, and a color developing composition film is formed, thereby preferably producing an image-forming material. Preferred examples of the image-forming material include image-forming materials in which color development is used by means of image exposure such as lithographic printing plate precursors, print wiring substrates, color filters, and photo masks and image-forming materials in which color development and polymerization curing is used.

Image-forming materials for which the color developing composition of the present invention is used develop color by means of heating or exposure to light sources that radiate infrared rays. Heating means is not particularly limited, well-known heating means can be used, and examples thereof include heaters, ovens, hot plates, infrared lamps, infrared lasers, and the like. Preferred examples of the light sources include solid-state lasers that radiate infrared rays, semiconductor lasers, and the like.

In the present invention, during coating, the composition forming the image-forming layer or the protective layer may be used after the respective components are dissolved or dispersed in a variety of solvents.

As the solvent, a well-known solvent can be used. Specifically, the above-described solvents are preferred. One solvent can be used singly or two or more solvents can be used in a mixed form. Meanwhile, the concentration of the solid content in the coating fluid is preferably in a range of 1% to 50% by mass. Meanwhile, the concentration of the solid content refers to the concentration of all components excluding solvents.

(Lithographic Printing Plate Precursor)

A lithographic printing plate precursor of the present invention has a layer including the compound represented by Formula 1 and the binder polymer on a support.

In addition, the lithographic printing plate precursor of the present invention preferably has an image-recording layer made of the color developing composition of the present invention and/or a protective layer made of the color developing composition of the present invention.

In the lithographic printing plate precursor of the present, it is possible to provide an undercoat layer between the support and the image-recording layer and a protective layer on the image-recording layer as necessary.

In addition, the lithographic printing plate precursor of the present invention can be preferably used as on-machine development-type lithographic printing plate precursors on which a development process can be carried out on printers.

Hereinafter, constituent elements of the lithographic printing plate precursor will be described.

<Image-Recording Layer>

For the image-recording layer in the lithographic printing plate precursor, development aptitude and printing aptitude are required. Therefore, the image-recording layer preferably includes the compound represented by Formula 1, the binder polymer, the polymerization initiator, and the polymerizable compound and is capable of further including polymer particles below or other components in addition to the above-described components.

Preferred aspects of the compound represented by Formula 1, the binder polymer, the polymerization initiator, and the polymerizable compound in the image-recording layer are identical to the above-described preferred aspects in the color developing composition of the present invention.

In addition, the preferred content of these components in the image-recording layer are as described above.

—Polymer Particles—

In order to improve the on-machine developing properties of the lithographic printing plate precursor, polymer particles can be used for the image-recording layer. The polymer particles in the present invention are preferably polymer particles capable of converting the image-recording layer to be hydrophobic when irradiated with heat. The polymer particles are preferably at least one selected from hydrophobic thermoplastic polymer particles, thermally reactive polymer particles, polymer particles having polymerizable groups, microcapsules including hydrophobic compounds, and micro gels (crosslinking polymer particles). Among these, polymer particles having polymerizable groups and micro gels are preferred.

Preferred examples of the hydrophobic thermoplastic polymer particles that are used in the present invention include hydrophobic thermoplastic polymer particles described in Research Disclosure No. 33303 of January 1992 and the specifications of JP1997-123387A (JP-H09-123387A), JP1997-131850A (JP-H09-131850A), JP1997-171249A (JP-H09-171249A), JP1997-171250A (JP-H09-171250A), and EU931647B.

Specific examples of polymers that constitute the hydrophobic thermoplastic polymer particles include homopolymers or copolymers of monomers of ethylene, styrene, vinyl chloride, methyl acrylate, ethyl acrylate, methyl methacrylate, ethyl methacrylate, vinylidene chloride, acrylonitrile, vinylcarbazole, acrylates or methacrylates having polyalkylene structures, and the like and mixtures thereof. Preferred examples thereof include copolymers having polystyrene, styrene, and acrylonitrile and methyl polymethacrylate. The average particle diameter of the hydrophobic thermoplastic polymer particles is preferably in a range of 0.01 µm to 2.0 µm.

Examples of the thermally reactive polymer particles that are used in the present invention include polymer fine particles having thermally reactive groups. Polymer particles having thermally reactive groups form hydrophobilized regions through crosslinking by thermal reactions and changes in functional groups at this time.

The thermally reactive groups in the polymer particles having thermally reactive groups may be functional groups that cause any reactions as long as chemical bonds are formed, but are preferably polymerizable groups. Preferred examples thereof include ethylenic unsaturated groups that cause radical polymerization reactions (for example, acryloyl groups, methacryloyl groups, vinyl groups, allyl groups, and the like), cationic polymerizable groups (for example, vinyl groups, vinyloxy groups, epoxy groups, oxetanyl groups, and the like), isocyanato groups that cause addition reactions or blocked bodies thereof, epoxy groups, vinyloxy groups, functional groups having active hydrogen atoms that are reaction partners thereof (for example, amino groups, hydroxy groups, carboxy groups, and the like), carboxy groups that cause condensation reactions, hydroxy groups or amino groups that are reaction partners, acid anhydrides that cause ring-opening addition reactions, amino groups or hydroxy groups which are reaction partners, and the like.

Examples of the microcapsules that are used in the present invention include microcapsules including all or part of the constituent components of the image-recording layer as described in JP2001-277740A and JP2001-277742A. The constituent components of the image-recording layer can also be added outside the microcapsules. A preferred aspect of the image-recording layer including the microcapsules is an image-recording layer including hydrophobic constituent components in the microcapsules and including hydrophilic constituent components outside the microcapsules.

In the present invention, an aspect including crosslinking polymer particles, that is, micro gels can also be used. Micro gels are capable of containing some of the constituent components of the image-recording layer in at least one of the center and surface thereof, and particularly, an aspect of micro capsules that have radical polymerizable groups on the surfaces and thus turn into reactive micro gels is preferred from the viewpoint of image-forming sensitivity or printing resistance.

As a method for putting the constituent components of the image-recording layer into microcapsules or micro gels, well-known methods can be used.

The average particle diameter of the microcapsules or the micro gels is preferably in a range of 0.01 to 3.0 µm, more preferably in a range of 0.05 to 2.0 µm, and particularly preferably in a range of 0.10 to 1.0 µm. Within this range, favorable resolution and temporal stability can be obtained.

The content of a hydrophobilized precursor is preferably in a range of 5% to 90% by mass of the total solid content in the image-recording layer.

—Other Components—

The image-recording layer in the present invention may further include other components as necessary.

(1) Low-Molecular-Weight Hydrophilic Compound

In order to improve on-machine developing properties without degrading printing resistance, the image-recording layer in the present invention may include a low-molecular-weight hydrophilic compound. Meanwhile, the low-molecular-weight hydrophilic compound is preferably a compound having a molecular weight of smaller than 1,000, more preferably a compound having a molecular weight of smaller than 800, and still more preferably a compound having a molecular weight of smaller than 500.

As the low-molecular-weight hydrophilic compound, examples of water-soluble organic compounds include glycols such as ethylene glycol, diethylene glycol, triethylene glycol, propylene glycol, dipropylene glycol, and tripropylene glycol and ethers or ester derivative thereof, polyols such as glycerin, pentaerythritol, and tris(2-hydroxyethyl) isocyanurate, organic amines such as triethanolamine, diethanolamine, and monoethanolamine and salts thereof, organic sulfonic acids such as alkyl sulfonic acid, toluenesulfonic acid, and benzenesulfonic acid and salts thereof, organic sulfamic acids such as alkyl sulfamate and salts thereof, organic sulfuric acids such as alkyl sulfates and alkyl ether sulfates and salts thereof, organic phosphonic acids such as phenylphosphonic acid and salts thereof, organic carboxylic acids such as tartaric acid, oxalic acid, citric acid, malic acid, lactic acid, gluconic acid, and amino acid and salts thereof, betaines, and the like.

In the present invention, it is preferable to add at least one selected from polyols, organic sulfates, organics sulfonates, and betaines.

Specific examples of the organic sulfonates include alkyl sulfonates such as sodium n-butyl sulfonate, sodium n-hexyl sulfonate, sodium 2-ethylhexyl sulfonate, sodium cyclohexyl sulfonate, and sodium n-octyl sulfonate; alkyl sulfonates having ethylene oxide chains such as sodium 5,8,11-trioxapentadecane-1-sulfonate, sodium 5,8,11-trioxaheptadecane-1-sulfonate, sodium 13-ethyl-5,8,11-trioxaheptadecane-1-sulfonate, sodium 5,8,11,14-tetraoxatetracosane-1-sulfonate; aryl sulfonates such as sodium benzene sulfonate, sodium p-toluenesulfonate, sodium p-hydroxybenzene sulfonate, sodium p-styrene sulfonate, sodium dimethyl isophthalate-5-sulfonate, sodium 1-naphthyl sulfonate, sodium 4-hydroxynaphthylsulfonate, sodium 1,5-naphthalene disulfonate, and trisodium 1,3,6-naphthalene trisulfonate; compounds described in Paragraphs 0026 to 0031 of JP2007-276454A and Paragraphs 0020 to 0047 of JP2009-154525A; and the like. The salts may be potassium salts or lithium salts.

Examples of the organic sulfates include sulfates of alkyls, alkenyls, alkynyls, aryls, or heterocyclic monoethers such as polyethylene oxides. The number of ethylene oxide units is preferably in a range of 1 to 4, and the salts are preferably sodium salts, potassium salts, or lithium salts. Specific examples thereof include compounds described in Paragraphs 0034 to 0038 of JP2007-276454A.

The betaines are preferably compounds in which the number of carbon atoms in hydrocarbon substituents into nitrogen atoms is in a range of 1 to 5, and specific examples thereof include trimethyl ammonium acetate, dimethyl propyl ammonium acetate, 3-hydroxy-4-trimethyl ammonio butyrate, 4-(1-pyridinio) butyrate, 1-hydroxyethyl-1-imidazolio acetate, trimethyl ammonium methanesulfonate, dimethyl propyl ammonium methanesulfonate, 3-trimethylammonio-1-propane sulfonate, 3-(1-pyridinio)-1-propane sulfonate, and the like.

Since the low-molecular-weight hydrophilic compound has a small structure in hydrophobic portions and barely has surfactant actions, there are no cases in which dampening water permeates exposed portions (image portions) in the image-recording layer and thus the hydrophobic properties or membrane strength of the image portions degrade, and it is possible to favorably maintain the ink-receiving properties or printing resistance of the image-recording layer.

The amount of the low-molecular-weight hydrophilic compound added to the image-recording layer is preferably in a range of 0.5% by mass to 20% by mass, more preferably in a range of 1% by mass to 15% by mass, and still more preferably in a range of 2% by mass to 10% by mass of the total solid content of the image-recording layer. Within this range, favorable on-machine developing-properties and printing resistance can be obtained.

The low-molecular-weight hydrophilic compound may be used singly or two or more low-molecular-weight hydrophilic compound may be used in a mixed form.

(2) Sensitization Agent

In order to improve ink-absorbing properties, it is possible to use a sensitization agent such as a phosphonium compound, a nitrogen-containing low-molecular-weight compound, or an ammonium group-containing polymer in the image-recording layer. Particularly, in a case in which an inorganic lamellar compound is added to the protective layer, these compounds function as surface coating agents for the inorganic lamellar compound and prevent the ink-absorbing properties from being degraded in the middle of printing due to the inorganic lamellar compound.

Among these, a phosphonium compound, a nitrogen-containing low-molecular-weight compound, and an ammonium group-containing polymer are preferably jointly used as the sensitization agent, and a phosphonium compound, quaternary ammonium salts, and an ammonium group-containing polymer are more preferably jointly used.

Examples of a preferred phosphonium compound include phosphonium compounds described in JP2006-297907A and JP2007-50660A. Specific examples thereof include tetrabutylphosphonium iodide, butyltriphenylphosphonium bromide, tetraphenylphosphonium bromide, 1,4-bis(triphenylphosphonio)butane=di(hexafluorophosphate), 1,7-bis(triphenylphosphonio)heptane=sulfate, 1,9-bis(triphenylphosphonio)nonane=naphthalene-2,7-disulfonate, and the like.

Examples of the nitrogen-containing low-molecular-weight compound include amine salts and quaternary ammonium salts. In addition, examples thereof include imidazolinium salts, benzo imidazolinium salts, pyridinium salts, and quinolinium salts. Among these, quaternary ammonium salts and pyridinium salts are preferred. Specific examples thereof include tetramethylammonium=hexafluorophosphate, tetrabutylamm onium=hexafluorophosphate, dodecyltrimethylammonium=p-toluene sulfonate, benzyltriethylammonium= hexafluorophosphate, benzyldimethyloctylammonium= hexafluorophosphate, benzyldimethyldodecylammonium= hexafluoro phosphate, compounds described in Paragraphs 0021 to 0037 of JP2008-284858A and Paragraphs 0030 to 0057 of JP2009-90645A, and the like.

As the ammonium group-containing polymer, any ammonium group-containing polymers may be used as long as the groups have ammonium groups in the structures, but polymers including 5% by mol to 80% by mol of (meth)acrylate having ammonium groups in side chains as copolymerization components are preferred. Specific examples thereof include polymers described in Paragraphs 0089 to 0105 of JP2009-208458A.

In the ammonium salt-containing polymer, the value of the reducing specific viscosity (unit: ml/g) obtained using the measurement method described in JP2009-208458A is preferably in a range of 5 to 120, more preferably in a range of 10 to 110, and particularly preferably in a range of 15 to 100. In a case in which the reducing specific viscosity is converted to the mass-average molar mass (Mw), the mass-average molar mass is preferably in a range of 10,000 to 150,000, more preferably in a range of 17,000 to 140,000, and particularly preferably in a range of 20,000 to 130,000.

Hereinafter, specific examples of the ammonium group-containing polymer will be described.

(1) 2-(Trimethylammonio)ethyl methacrylate=p-toluenesulfonate/3,6-dioxaheptyl methacrylate copolymer (molar ratio: 10/90, Mw: 45,000)
(2) 2-(Trimethylammonio)ethyl methacrylate= hexafluorophosphate/3,6-dioxaheptyl methacrylate copolymer (molar ratio: 20/80, Mw: 60,000)
(3) 2-(Ethyldimethylammonio)ethyl methacrylate=p-toluenesulfonate/hexyl methacrylate copolymer (molar ratio: 30/70, Mw: 45,000)
(4) 2-(Trimethylammonio)ethyl methacrylate= hexafluorophosphate/2-ethylhexyl methacrylate copolymer (molar ratio: 20/80, Mw: 60,000)
(5) 2-(Trimethylammonio)ethyl methacrylate= methylsulfate/hexyl methacrylate copolymer (molar ratio: 40/60, Mw: 70,000)
(6) 2-(Butyldimethylammonio)ethyl methacrylate= hexafluorophosphate/3,6-dioxaheptyl methacrylate copolymer (molar ratio: 25/75, Mw: 65,000)
(7) 2-(Butyldimethylammonio)ethyl acrylate=haxafl uorophosphate/3,6-dioxaheptyl methacrylate copolymer (molar ratio: 20/80, Mw: 65,000)
(8) 2-(Butyldimethylammonio)ethyl methacrylate=13-ethyl-5,8,11-trioxa-1-heptadecanesulfonate/3,6-dioxaheptyl methacrylate copolymer (molar ratio: 20/80, Mw: 75,000)
(9) 2-(Butyldimethylammonio)ethyl methacrylate=hax afluorophosphate/3,6-dioxaheptyl methacrylate/2-hydroxy-3-methacryloyloxypropyl methacrylate copolymer (molar ratio: 15/80/5, Mw: 65,000)

The content of the sensitization agent is preferably in a range of 0.01% by mass to 30.0% by mass, more preferably in a range of 0.1% by mass to 15.0% by mass, and still more preferably in a range of 1% by mass to 10% by mass of the total solid content in the image-recording layer.

(3) Others

Furthermore, to the image-recording layer, as other components, it is possible to add a surfactant, a coloring agent, a printing-out agent, a polymerization inhibitor, higher aliphatic acid derivatives, a plasticizer, inorganic particles, inorganic lamellar compounds, and/or a co-sensitizing agent. Specifically, it is preferable to use compounds and amounts thereof added described in Paragraphs 0114 to 0159 of JP2008-284817A, Paragraphs 0023 to 0027 of JP2006-091479A, and Paragraph 0060 of US2008/0311520A.

—Formation of Image-Recording Layer—

The image-recording layer in the lithographic printing plate precursor of the present invention is formed by, for example, as described in Paragraphs 0142 and 0143 of JP2008-195018A, dispersing or dissolving the necessary components described above in a well-known solvent so as to prepare a coating fluid, applying the coating fluid onto a support using a well-known method such as bar coating, and drying the coating fluid. The coating amount (solid content) of the image-recording layer on the support which is obtained after application and drying varies depending on applications, but is preferably in a range of 0.3 to 3.0 g/m$^2$.

Within this range, a favorable sensitivity and favorable membrane characteristics of the image-recording layer can be obtained.

<Undercoat Layer>

In the lithographic printing plate precursor of the present invention, an undercoat layer (in some cases, referred to as the interlayer) is preferably provided between the image-recording layer and the support. The undercoat layer strengthens adhesiveness between the support and the image-recording layer in exposed portions and facilitates peeling the support and the image-recording layer in non-exposed portions, and thus the undercoat layer contributes to improving developing properties without impairing printing resistance. In addition, in the case of exposure using infrared lasers, the undercoat layer functions as an adiabatic layer and thus has an effect of preventing the sensitivity from being degraded due to the diffusion of heat generated by exposure in the support.

Examples of compounds that can be used for the undercoat layer include polymers having adsorbent groups that can be adsorbed to the surface of the support and hydrophilic groups. In order to improve adhesiveness to the image-recording layer, polymers having adsorbent groups and hydrophilic groups and further having crosslinking groups are preferred. The compounds that can be used for the undercoat layer may be low-molecular-weight compounds or high-molecular-weight polymers. The compounds that can be used for the undercoat layer may be used in a mixed form of two or more kinds as necessary.

In a case in which the compounds that are used for the undercoat layer are polymers, copolymers of monomers having adsorbent groups, monomers having hydrophilic groups, and monomers having crosslinking groups are preferred.

The adsorbent groups that can be adsorbed to the surface of the support are preferably phenolic hydroxy groups, carboxy groups, —PO$_3$H$_2$, —OPO$_3$H$_2$, —CONHSO$_2$—, —SO$_2$NHSO$_2$—, —COCH$_2$COCH$_3$. The hydrophilic groups are preferably sulfo groups or salts thereof and salts of carboxy groups. The crosslinking groups are preferably methacryl groups, allyl groups, and the like.

The polymers may have crosslinking groups introduced due to the formation of salts between polar substituents of the polymers and compounds having substituents having opposite charges of the above-described polar substituents and ethylenic unsaturated bonds and may be further copolymerized with monomers other than the above-described monomers, preferably, hydrophilic monomers.

Specifically, preferred examples thereof include silane coupling agents having ethylenic double bond reactive groups that are capable of addition polymerization described in JP1998-282679A (JP-H10-282679A) and phosphorus compounds having ethylenic double bond reactive groups described in JP1990-304441A (JP-H02-304441A). Low-molecular-weight or high-molecular-weight compounds having crosslinking groups (preferably ethylenic unsaturated bond groups), functional groups that interact with the surface of the support, and hydrophilic groups described in JP2005-238816A, JP2005-125749A, JP2006-239867A, and JP2006-215263A are also preferably used.

More preferred examples thereof include high-molecular-weight polymers having adsorbent groups that can be adsorbed to the surface of the support, hydrophilic groups, and crosslinking groups described in JP2005-125749A and JP2006-188038A.

The content of ethylenic unsaturated bonds in the polymer for the undercoat layer is preferably in a range of 0.1 to 10.0 mmol and more preferably in a range of 0.2 to 5.5 mmol per gram of the polymer.

The mass-average molar mass (the weight-average molecular weight, Mw) of the polymer for the undercoat layer is preferably 5,000 or higher and more preferably in a range of 10,000 to 300,000.

In addition to the above-described compounds for the undercoat layer, the undercoat layer may also include a chelating agent, secondary or tertiary amines, a polymerization inhibitor, compounds having amino groups or functional groups having a polymerization-inhibiting function and groups that interact with the surfaces of aluminum supports (for example, 1,4-diazabicyclo[2.2.2]octane (DABCO), 2,3,5,6-tetrahydroxy-p-quinone, chloranil, sulfophthalic acid, hydroxyethyl ethylene diamine triacetic acid, dihydroxyethyl ethylenediamine diacetic acid, hydroxyethyl iminodiacetic acid, and the like), and the like in order to prevent contamination over time.

The undercoat layer is formed using well-known coating methods. The coating amount (solid content) of the undercoat layer is preferably in a range of 0.1 to 100 mg/m$^2$ and more preferably in a range of 1 to 30 mg/m$^2$.

<Protective Layer>

In the lithographic printing plate precursor of the present invention, a protective layer (in some cases, also referred to as the overcoat layer) is preferably provided on the image-recording layer. The protective layer has a function of suppressing image formation-inhibiting reactions caused by the shielding of oxygen and additionally has a function of preventing the generation of damage in the image-recording layer and abrasion prevention during exposure using high-luminance lasers.

In addition, the lithographic printing plate precursor of the present invention preferably includes the protective layer including the compound represented by Formula 1 and the binder polymer and more preferably includes the protective layer including the compound represented by Formula 1, the binder polymer, and an inorganic lamellar compound described below.

Preferred aspects of the compound represented by Formula 1 and the binder polymer in the protective layer are identical to the preferred aspects described in the section of the color developing composition of the present invention.

In addition, the preferred content of these components in the protective layer is as described above.

Protective layers having the above-described characteristics are described in, for example, the specification of U.S. Pat. No. 3,458,311A and JP1980-49729B (JP-S55-49729B). As poor oxygen-transmissible polymers that can be used for the protective layer, it is possible to appropriately select and use any one of water-soluble polymers and water-insoluble polymers, and, if necessary, it is also possible to use two or more polymers in a mixed form. Specific examples thereof include polyvinyl alcohols, modified polyvinyl alcohols, polyvinyl pyrrolidone, water-soluble cellulose derivatives, poly(meth)acrylonitrile, and the like.

As the modified polyvinyl alcohols, acid-modified polyvinyl alcohols having carboxy groups or sulfo groups are preferably used. Specific examples thereof include modified-polyvinyl alcohols described in JP2005-250216A and JP2006-259137A.

The protective layer in the present invention preferably includes inorganic lamellar compounds in order to enhance oxygen-shielding properties. The inorganic lamellar compounds refer to particles having thin flat plate shapes, and examples thereof include mica groups such as natural mica and synthetic mica, talc represented by Formula 3MgO.4SiO.H$_2$O, taeniolite, montmorillonite, saponite, hectorite, zirconium phosphate, and the like.

The inorganic lamellar compounds that can be preferably used in the present invention are mica compounds. Examples of mica compounds include mica groups such as natural mica and synthetic mica represented by Formula: A(B, C)$_{2-5}$D$_4$O$_{10}$(OH, F, O)$_2$ [here, A is any one of K, Na, and Ca, B and C are any of Fe (II), Fe (III), Mn, Al, Mg, and V, and D is Si or Al.].

In the mica groups, examples of natural mica include white mica, soda mica, gold mica, black mica, and lepidolite. Examples of synthetic mica include non-swelling mica such as fluorphlogopite KMg$_3$(AlSi$_3$O$_{10}$)F$_2$, potassium tetrasilic mica KMg$_{2.5}$(Si$_4$O$_{10}$)F$_2$, and, Na tetrasilylic mica NaMg$_{2.5}$(Si$_4$O$_{10}$)F$_2$, swelling mica such as Na or Li taeniolite (Na, Li)Mg$_2$Li(Si$_4$O$_{10}$)F$_2$, montmorillonite-based Na or Li hectorite (Na, Li)$_{1/8}$Mg$_{2/5}$Li$_{1/8}$(Si$_4$O$_{10}$)F$_2$, and the like. Furthermore, synthetic smectite is also useful.

In the present invention, among the above-described mica compounds, fluorine-based swelling mica is particularly useful. That is, swelling synthetic mica has a laminate structure consisting of unit crystal lattice layers having a thickness in a range of approximately 10 angstroms to 15 angstroms, and metal atoms in lattices are more actively substituted than in any other clay minerals. As a result, positive charges are deficient in the lattice layers, and positive ions such as Li$^+$, Na$^+$, Ca$^{2+}$, and Mg$^{2+}$ are adsorbed between the layers in order to compensate for the deficiency. Positive ions interposed between the layers are referred to as exchangeable positive ions and are exchanged with various positive ions. Particularly, in a case in which the positive ions between the layers are Li$^+$ and Na$^+$, the ionic radii are small, and thus the bonds between lamellar crystal lattices are weak, and mica is significantly swollen by water. When shear is applied in this state, mica easily cleavages and forms a stable sol in water. The above-described tendency of swelling synthetic mica is strong, and the swelling synthetic mica is particularly preferably used in the present invention.

From the viewpoint of diffusion control, regarding the shapes of the mica compounds, the thickness is preferably thin, and the planar size is preferably large as long as the smoothness and active light ray-transmitting properties of coated surfaces are not impaired. Therefore, the aspect ratio is preferably 20 or higher, more preferably 100 or higher, and particularly preferably 200 or higher. Meanwhile, the aspect ratio is the ratio of the long diameter to the thickness of a particle and can be measured from projection views obtained from the microphotograph of the particle. As the aspect ratio increases, the obtained effect becomes stronger.

Regarding the particle diameters of the mica compound, the average long diameter thereof is preferably in a range of 0.3 to 20 µm, more preferably in a range of 0.5 to 10 µm, and particularly preferably in a range of 1 to 5 µm. The average thickness of the particles is preferably 0.1 µm or smaller, more preferably 0.05 µm or smaller, and particularly preferably 0.01 µm or smaller. Specifically, for example, in the case of swelling synthetic mica which is a typical compound, a preferred aspect has a thickness in a range of 1 to 50 nm and a surface size (long diameter) in a range of approximately 1 to 20 µm.

The content of the inorganic lamellar compound is preferably in a range of 0% to 60% by mass and more preferably in a range of 3% to 50% by mass of the total solid content of the protective layer. Even in a case in which multiple kinds of inorganic lamellar compounds are jointly used, the total amount of the inorganic lamellar compounds is preferably the above-described mass. Within the above-described range, the oxygen-shielding properties improve, and a favorable sensitivity can be obtained. In addition, the degradation of the ink-absorbing properties can be prevented.

The protective layer may include well-known additives such as a plasticizer for imparting flexibility, a surfactant for improving coating properties, and inorganic fine particles that control sliding properties on the surface. In addition, it is also possible to add the sensitization agent described in the section of the image-recording layer to the protective layer.

The protective layer is formed using a well-known coating method. Regarding the coating amount of the protective layer, the coating amount after drying is preferably in a range of 0.01 to 10 g/m$^2$, more preferably in a range of 0.02 to 3 g/m$^2$, and particularly preferably in a range of 0.02 to 1 g/m$^2$.

<Support>

Supports that can be used in the lithographic printing plate precursor of the present invention are not particularly limited, and examples thereof include well-known supports for lithographic printing plate precursors. The support is preferably an aluminum plate which has been roughened using a well-known method and anode-oxidized.

On the aluminum plate, as necessary, it is possible to appropriately select and carry out enlargement processes or sealing processes of micropores in anode oxide films described in JP2001-253181A and JP2001-322365A, surface hydrophilization processes using alkali metal silicate as described in the specifications of U.S. Pat. No. 2,714,066A, U.S. Pat. No. 3,181,461A, U.S. Pat. No. 3,280,734A, and U.S. Pat. No. 3,902,734A, and surface hydrophilization processes using polyvinyl phosphate or the like as described in the specifications of U.S. Pat. No. 3,276,868A, U.S. Pat. No. 4,153,461A, and U.S. Pat. No. 4,689,272A.

In the support, the center line average roughness is preferably in a range of 0.10 to 1.2 µm.

To the support, as necessary, it is possible to provide a backcoat layer including organic polymer compounds described in JP1993-45885A (JP-H05-45885A) or alkoxy compounds of silicon described in JP1994-35174A (JP-H06-35174A) on the surface opposite to the surface on which the image-forming layer is formed.

(Lithographic Printing Plate and Plate Making Method Therefore)

A lithographic printing plate of the present invention is a lithographic printing plate made of the lithographic printing plate precursor of the present invention.

A plate making method for a lithographic printing plate of the present invention is not particularly limited, but preferably includes an exposure step of exposing the lithographic printing plate precursor of the present invention in an image pattern, and an on-machine development process step of removing non-image portions by supplying printing ink and dampening water to the lithographic printing plate precursor that has been exposed in an image pattern on a printer.

<Exposure Step>

The plate making method for a lithographic printing plate of the present invention preferably includes an exposure step of exposing the lithographic printing plate precursor of the present invention in an image pattern.

The lithographic printing plate precursor of the present invention can be exposed in an image pattern using a method in which digital data is scanned and exposed using infrared lasers.

The wavelength of the light source that is used is preferably in a range of 750 nm to 1,400 nm. The light source having a wavelength in a range of 750 nm to 1,400 nm is preferably a solid-state laser or a semiconductor laser that radiates infrared rays. The exposure mechanism may be any one of in-plane drum methods, external surface drum methods, flat head methods, and the like.

The exposure step can be carried out using platesetters or the like and well-known methods. In addition, exposure may be carried out on a printer using a printer including an exposure device after the lithographic printing plate precursor is mounted on the printer.

<On-Machine Development Process Step>

In the on-machine development process step, when printing is carried out on the lithographic printing plate precursor that has been exposed in an image pattern by supplying printing ink and dampening water without carrying out any development processes thereon, non-exposed portions on the lithographic printing plate precursor are removed at the initial stage of printing, and accordingly, the hydrophilic surface of the support is exposed, and non-image portions are formed. As the printing ink and the dampening water, well-known printing ink and dampening water for lithographic printing are used. Here, any of printing ink and dampening water may be first supplied to the plate surface, but it is preferable to first supply printing ink from the viewpoint of preventing contamination by the components of the image-recording layer from which dampening water is removed.

In the above-described manner, the lithographic printing plate precursor is on-machine-developed on an off-set printer and is used as it is for printing a number of pieces of paper.

The plate making method for a lithographic printing plate of the present invention may also include other well-known steps in addition to the above-described steps.

Other steps are not particularly limited, but examples thereof include a plate-inspecting step of checking a position, a direction, or the like of a lithographic printing plate precursor before each step, or a checking step of checking a printed image after an on-machine development process step.

In addition, the lithographic printing plate precursor of the present invention can be preferably used as a lithographic printing plate precursor for an on-machine development process as described above and may also be developed by carrying out an alkali development (off-press) process.

The alkali development process may be not only a simple process using an alkali developing solution but also a process using an alkali developing solution including a water-soluble high-molecular-weight compound, a so-called gum development process.

(Compound Represented by Formula 1 and Color Developer)

The compound represented by Formula 1 is a new compound and can be preferably used as color developers, particularly, thermosensitive color developers and/or infrared-sensitive color developers.

A preferred aspect of the compound represented by Formula 1 as a new compound is identical to the preferred aspect of the compound represented by Formula 1 in the above-described color developing composition of the present invention.

EXAMPLES

Hereinafter, the present invention will be described using examples, but the present invention is not limited thereto.

Meanwhile, in the present examples, "parts" and "%" indicate "parts by mass" and "% by mass" unless particularly otherwise described. Meanwhile, specific compounds 1 to 45, which will be used in the examples, are respectively the same compounds as the above-described specific compounds 1 to 45.

Synthesis methods for specific compounds 1, 23, 28, and 31 in the present invention will be described below. Other specific compounds were also synthesized using the same synthesis method except for the fact that raw materials or reactive substrates were appropriately changed.

<Synthesis Method for Specific Compound 1>

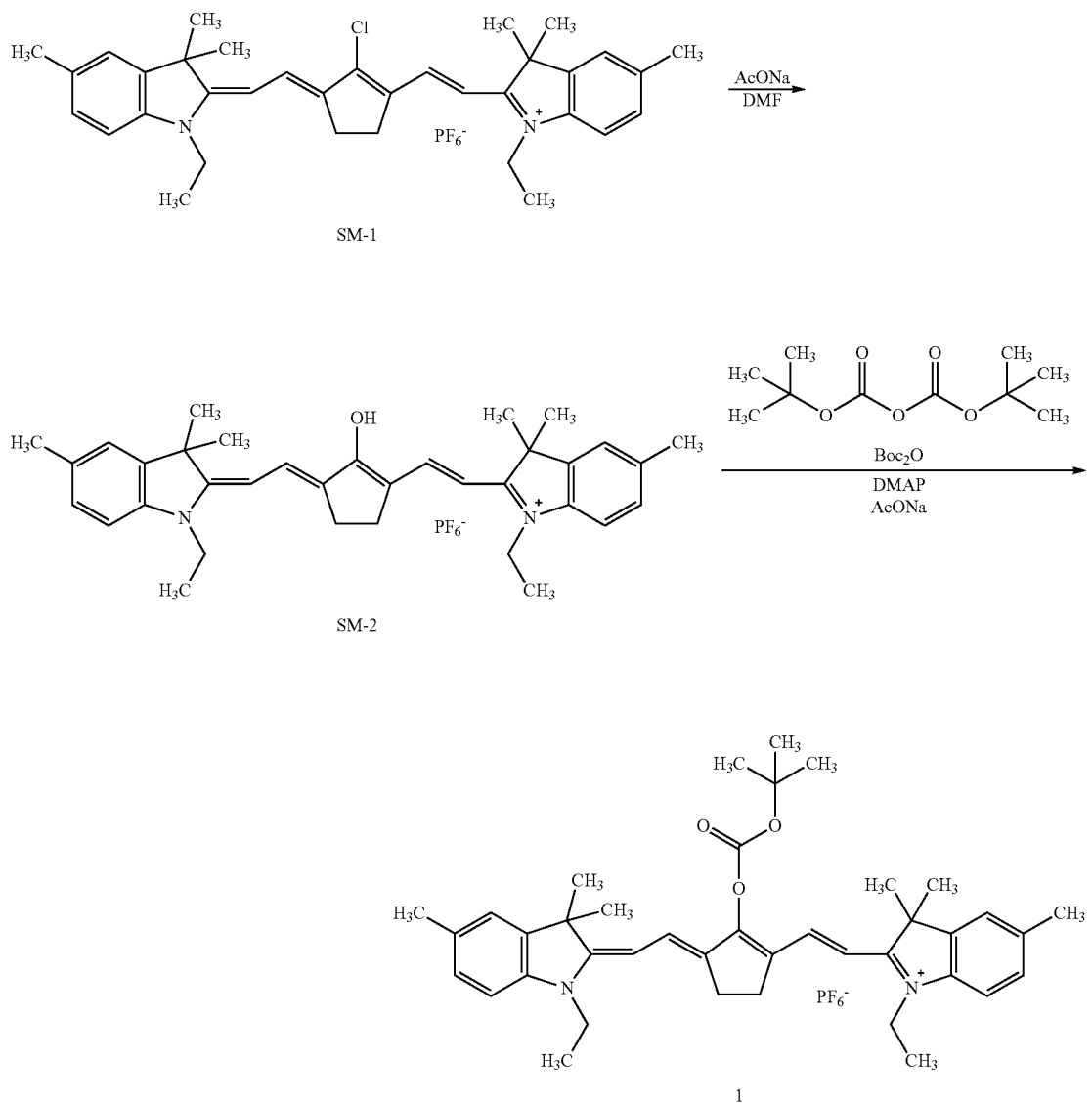

A mixture of SM-2 (3.0 g, 4.47 mmol), di-t-butyldicarbonate (Boc$_2$O) (60 g, 274 mmol), N,N-dimethyl-4-aminopyridine (DMAP) (0.39 g, 3.19 mmol), and sodium acetate (AcONa) (0.54 g, 6.58 mmol) was stirred at 80° C. for two hours. After the mixture was cooled to room temperature (25° C. which shall apply below), hexane (300 mL) was added thereto, and the precipitated solid was taken by means of filtration. The obtained solid was dissolved in acetone (50 mL), components not dissolved were filtered out, and the filtrate was added dropwise to a bilayer-based poor solvent (hexane (50 mL)-an aqueous solution of 5% by mass of KPF$_6$ (500 mL)) and was re-precipitated. The obtained solid was collected by means of filtration, thereby obtaining a specific compound 1 (0.51 g, 0.677 mmol). The yield was 15.1%.

The structure of the obtained specific compound 1 was identified by means of NMR. The identification results are described below.

$^1$H-NMR (300 MHz, deuterated dimethyl sulfoxide) δ=1.58 (t, 6H), 1.52 (s, 9H), 1.61 (s, 12H), 2.67 (s, 6H), 2.81 (br, 4H), 4.12 (q, 4H), 5.92 (d, 2H), 7.12-7.28 (m, 4H), 7.39 (S, 2H), 7.62 (d, 2H)

Meanwhile, SM-2 was prepared from SM-1 as described above according to the method described in J. Heterocyclic Chem., 41, 227 (2004). DMF is N,N-dimethyl formamide.

<Synthesis Method for Specific Compound 23>

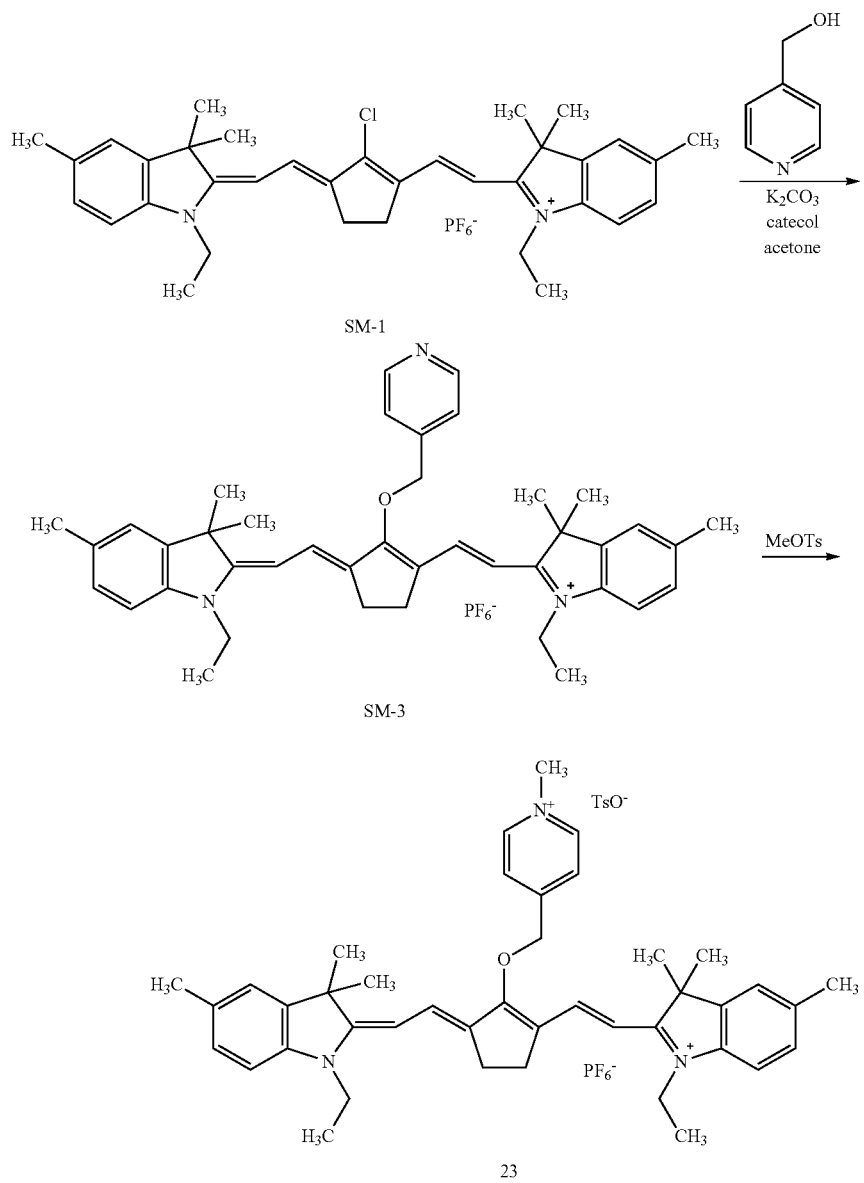

<<Synthesis of SM-3>>

An acetone solution (30 mL) of SM-1 (5.00 g, 7.45 mmol), potassium carbonate (K$_2$CO$_3$) (1.90 g, 13.7 mmol), catechol (catecol) (0.82 g, 7.45 mmol), and pyridinemethanol (4.10 g, 37.6 mmol) was stirred at 24° C. for 30 minutes. After the reaction liquid was added dropwise to water (250 mL), the precipitated solid was further washed with water and then was filtered. A solid generated by a mixed liquid of hexane (320 mL)-ethyl acetate (80 mL) added dropwise to an ethyl acetate (80 mL)-acetone (20 mL) solution of the obtained solid was taken by means of filtration, thereby obtaining SM-3 (2.40 g, 3.23 mmol). The yield was 43.3%.

<<Synthesis of Specific Compound 23>>

SM-3 (2.40 g, 3.23 mmol) and methyl tosylate (MeOTs) (7.50 g, 40.3 mmol) were stirred at 80° C. for ten minutes, and then were cooled to room temperature. The reaction liquid was added to ethyl acetate (300 mL), the precipitated solid was dissolved in acetone (100 mL), and the main liquid was added dropwise to a mixed liquid of hexane (1,200 mL)-ethyl acetate (300 mL). The generated solid was taken by means of filtration, thereby obtaining a specific compound 23 (2.59 g, 2.78 mmol). The yield was 86.1%.

The structure of the obtained specific compound 23 was identified by means of NMR. The identification results are described below.

$^1$H-NMR (300 MHz, deuterated dimethyl sulfoxide) δ=1.28 (t, 6H), 1.49 (s, 12H), 2.28 (s, 3H), 2.36 (s, 6H), 2.83 (br, 4H), 4.13 (q, 4H), 4.44 (s, 3H), 5.83 (s, 2H), 5.92 (d, 2H), 7.10 (d, 2H), 7.18-7.28 (m, 4H), 7.34 (s, 2H), 7.46 (d, 2H), 7.63 (d, 2H), 8.29 (d, 2H), 9.11 (d, 2H)

<Synthesis Method for Specific Compound 28>

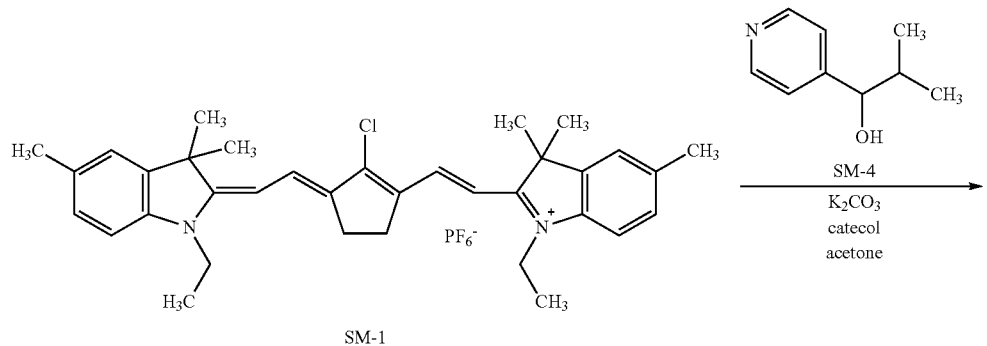

SM-1

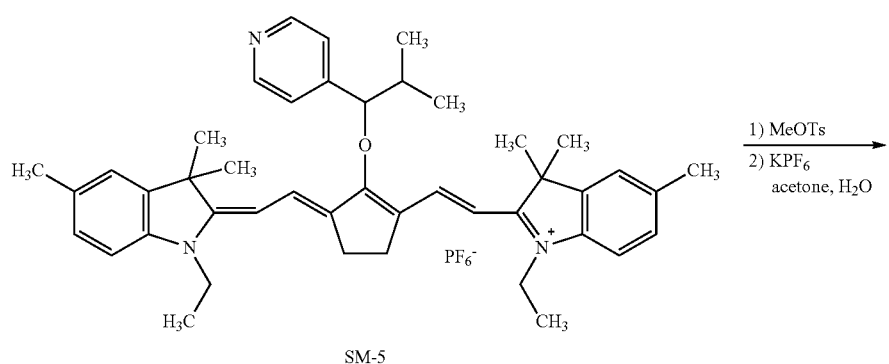

SM-5

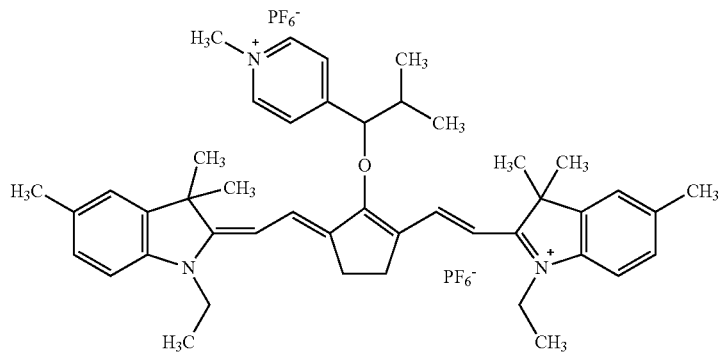

28

<<Synthesis of SM-5>>

SM-5 was synthesized in the same manner as in the synthesis example of SM-3 using SM-1 (5.00 g, 7.45 mmol) and SM-4 (3.50 g, 20.5 mmol) according to the above-described synthesis scheme, thereby obtaining SM-5 (5.01 g, 6.37 mmol). The yield was 85.5%.

<<Synthesis of Specific Compound 28>>

A specific compound 28 was synthesized in the same manner as in the synthesis example of the specific compound 23 using SM-5 (2.50 g, 3.30 mmol) and methyl tosylate (MeOTs) (7.32 g, 39.3 mmol) according to the above-described synthesis scheme, the obtained solid and KPF$_6$ (2.58 g, 14.0 mmol) were dissolved in acetone (20 mL), then, water (20 mL) was added dropwise thereto, and the generated crystals were filtered, thereby obtaining the specific compound 28 (2.00 g, 2.11 mmol). The yield was 64.0%.

The structure of the obtained specific compound 28 was identified by means of NMR. The identification results are described below.

$^1$H-NMR (300 MHz, deuterated dimethyl sulfoxide) δ=0.95 (d, 3H), 1.14 (d, 3H), 1.21 (s, 6H), 1.24 (t, 6H), 1.43 (s, 6H), 2.35 (s, 6H), 2.39-2.49 (m, 1H), 2.70-2.92 (m, 4H), 4.12 (q, 4H), 4.47 (s, 3H), 5.87 (s, 1H), 5.93 (d, 2H), 7.20 (d, 2H), 7.25 (d, 2H), 7.33 (s, 2H), 7.42 (d, 2H), 8.32 (d, 2H), 9.14 (d, 2H)

<Synthesis Method for Specific Compound 31>

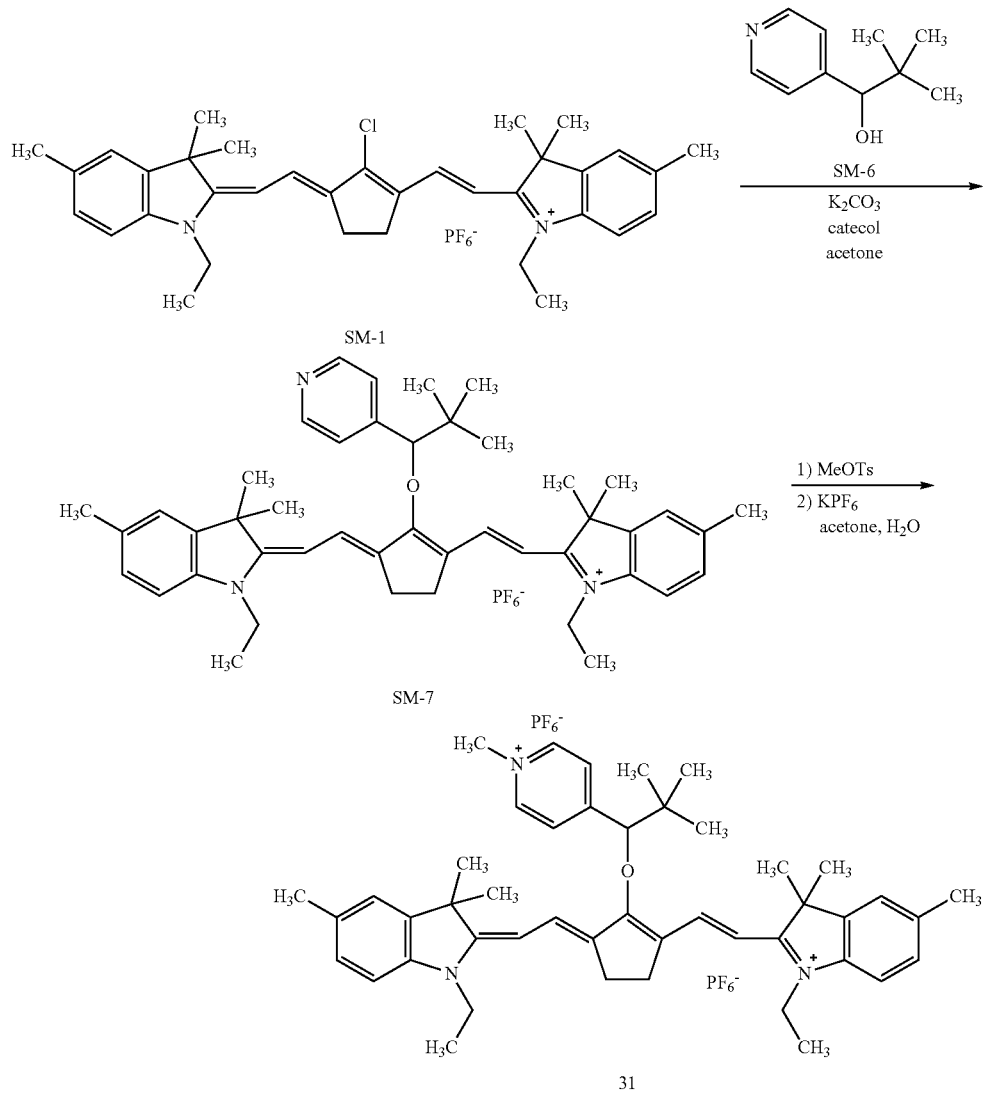

<<Synthesis of SM-7>>

SM-7 was synthesized in the same manner as in the synthesis example of SM-5 using SM-1 (3.00 g, 4.47 mmol) and SM-6 (1.85 g, 11.2 mmol) according to the above-described synthesis scheme, thereby obtaining SM-7 (2.40 g, 3.05 mmol). The yield was 68.2%.

<<Synthesis of Specific Compound 31>>

A specific compound 31 was synthesized in the same manner as in the synthesis example of the specific compound 28 using SM-7 (2.40 g, 3.05 mmol) according to the above-described synthesis scheme, thereby obtaining the specific compound 31 (1.89 g, 1.97 mmol). The yield was 64.6%.

The structure of the obtained specific compound 31 was identified by means of NMR. The identification results are described below.

$^1$H-NMR (300 MHz, deuterated dimethyl sulfoxide) δ=1.09 (s, 9H), 1.19 (s, 6H), 1.24 (t, 6H), 1.56 (s, 6H), 2.36 (s, 6H), 2.65-2.91 (m, 4H), 4.12 (q, 4H), 4.48 (s, 3H), 5.84 (s, 1H), 5.86 (d, 2H), 7.20 (d, 2H), 7.25 (d, 2H), 7.45 (s, 2H), 8.30 (d, 2H), 9.14 (d, 2H)

Examples 1 to 8 and Comparative Examples 1 to 3: Thermosensitive Color Developing Compositions I-1. Production of Aluminum Support In order to remove rolling oil on the surface of a 0.3 mm-thick aluminum plate (material JIS A 1050), a defatting process was carried out thereon using an aqueous solution of 10% by mass of sodium aluminate at 50° C. for 30 seconds, and then, the aluminum surface was grained using three implanted nylon brushes having hair diameters of 0.3 mm and a suspension of pumice having a median diameter of 25 μm and water (specific gravity: 1.1 g/cm$^3$) and well washed with water. This plate was etched by being immersed in an aqueous solution of 25% by mass of sodium hydroxide at 45° C. for nine seconds, was washed with water, then, was further immersed in 20% by mass of nitric acid at 60° C. for 20 seconds, and was washed with water. At this time, the etched amount of the grained surface was approximately 3 g/m$^2$.

Next, an electrochemical roughening process was continuously carried out thereon using alternating-current voltage of 60 Hz. At this time, an electrolytic solution was an aqueous solution of 1% by mass of nitric acid (including 0.5% by mass of aluminum ions), and the liquid temperature was 50° C. The electrochemical roughening process was carried out thereon using an alternating current source waveform in which the time TP taken for the current value to reach the peak from zero was 0.8 msec, a duty ratio of 1:1, a trapezoidal square-wave alternating current, and a carbon electrode as an opposite electrode. As an auxiliary anode, ferrite was used. The current density was 30 A/dm$^2$ in terms of the peak value of the current, and 5% of the current coming from the power supply was divided into the auxiliary positive electrode. Regarding the quantity of electricity during nitric acid electrolysis, the quantity of electricity was 175 C/dm$^2$ when the aluminum plate served as the positive electrode. After that, the plate was washed with water by means of spraying.

Subsequently, an electrochemical roughening process was carried out thereon using the same method as nitric acid electrolysis in an aqueous solution of 0.5% by mass of hydrochloric acid (including 0.5% by mass of aluminum ions) and an electrolytic solution having a liquid temperature of 50° C. under a condition of the quantity of electricity of 50 C/dm$^2$ when the aluminum plate served as the positive electrode, and then, the plate was washed with water by means of spraying.

Next, 2.5 g/m$^2$ of a direct current anode oxide film was provided to this plate at a current density of 15 A/dm$^2$ using 15% by mass of sulfuric acid (including 0.5% by mass of aluminum ions) as an electrolytic solution, and then water washing and drying were carried out thereon, thereby producing a support.

After that, a silicate process was carried out on the obtained support using an aqueous solution of 2.5% by mass of No. 3 sodium silicate at 60° C. for ten seconds, and then the support was washed with water, thereby obtaining an aluminum support. The attached amount of Si was 10 mg/m$^2$. The center line average roughness (Ra) of this substrate was measured using a needle having a diameter of 2 μm and was found to be 0.51 μm.

I-2. Production of Thermosensitive Color Developing Composition Films A-1 to A-8 and A'-1 to A'-3

Thermosensitive color developing compositions having a composition described below were respectively prepared, were applied onto the obtained aluminum support by means of bar coating so that the dried coating amount reached 1.0 g/m$^2$, and then were dried in an oven at 30° C. for 120 seconds, thereby producing thermosensitive color developing composition films A-1 to A-8 (for Examples 1 to 8) and A'-1 to A'-3 (for Comparative Examples 1 to 3) respectively.

<Compositions of Thermosensitive Color Developing Compositions>

Polymethyl methacrylate (Mw: 12,000): 0.160 parts by mass

Color developer (a compound shown in Table 1): The amount shown in Table 1

2-Butanone: 9.00 parts by mass

I-3. Evaluation of Color-Developing Properties of Thermosensitive Color Developing Composition Films The produced thermosensitive color developing composition films were heated on a hot plate TH-900 manufactured by AS ONE Corporation at 160° C. for 30 seconds, and the color-developing properties were evaluated by measuring color development immediately after the heating, as it was in a dark place after the heating, and after 24 hours elapsed under a condition of room temperature (25° C.). The color development was indicated using the difference ΔL between the L* value after the heating and the L* value before the heating using L* values (brightness) in the L*a*b* color specification system. A larger value of ΔL indicates superior color-developing properties. The color-developing properties were measured using a spectrophotometer CM2600d and operation software CM-S100W manufactured by Konica Minolta, Inc. by means of a specular component excluded (SCE) method.

The results are summarized in Table 1.

TABLE 1

| | Thermosensitive color developing composition film | Color developer | | Amount added (parts by mass) | Color-developing properties (ΔL) | |
|---|---|---|---|---|---|---|
| | | Compound represented by Formula 1 | Comparative compound | | Immediately after heating | After two hours |
| Example 1 | A-1 | Specific compound 1 | — | 0.02 | 8 | 8 |
| Example 2 | A-2 | Specific compound 1 | — | 0.04 | 12 | 12 |
| Example 3 | A-3 | Specific compound 1 | — | 0.1 | 18 | 18 |
| Example 4 | A-4 | Specific compound 2 | — | 0.02 | 8.5 | 8.5 |
| Example 5 | A-5 | Specific compound 15 | — | 0.02 | 10 | 10 |
| Example 6 | A-6 | Specific compound 17 | — | 0.02 | 10 | 10 |
| Example 7 | A-7 | Specific compound 20 | — | 0.02 | 10 | 10 |
| Example 8 | A-8 | Specific compound 25 | — | 0.02 | 12 | 12 |
| Comparative Example 1 | A'-1 | — | Comparative compound 1 | 0.02 | 1.5 | 1.5 |
| Comparative Example 2 | A'-2 | — | Comparative compound 1 | 0.1 | 7.5 | 7.5 |
| Comparative Example 3 | A'-3 | — | Comparative compound 2 | 0.02 | 1 | 1 |

Comparative compounds 1 and 2 shown in Table 1 are compounds illustrated below.

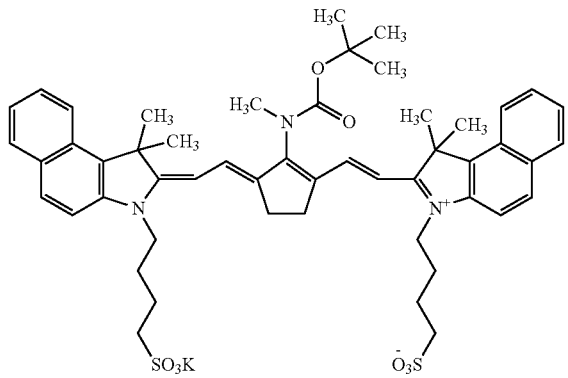

Comparative compound 1

-continued

Comparative compound 2

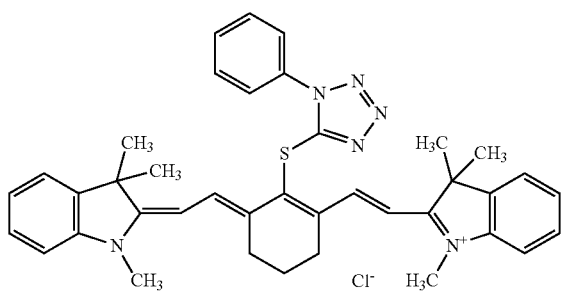

From the results in Table 1, it is found that the compound represented by Formula 1 has favorable color-developing properties after heating even in a case in which a small amount of the compound is added to thermosensitive color developing composition films and is an excellent thermosensitive color developer that does not discolor after two hours.

Examples 9 to 22 and Comparative Examples 4 to 7: Infrared-Sensitive Color Developing Compositions II-1. Production of Infrared-Sensitive Color Developing Composition Films B-1, B-4 to B-13, and B'-2 to B'-4

Infrared-sensitive color developing compositions having a composition 1 described below were respectively prepared, were applied onto the obtained aluminum support by means of bar coating so that the dried coating amount reached 1.0 g/m², and then were dried in an oven at 50° C. for 120 seconds, thereby producing infrared-sensitive color developing composition films B-1, B-4 to B-13 (for Examples 9 and 12 to 21) and B'-2 to B'-4 (for Comparative Examples 5 to 7) respectively.

<Compositions 1 of Infrared-Sensitive Color Developing Compositions>

Polymethyl methacrylate (Mw: 12,000): 0.24 parts by mass

Color developer (a compound shown in Table 2): The amount shown in Table 2

2-Butanone: 9.00 parts by mass

II-2. Production of Infrared-Sensitive Color Developing Composition Films B-2

Infrared-sensitive color developing compositions having a composition 2 described below were respectively prepared, were applied onto the obtained aluminum support by means of bar coating so that the dried coating amount reached 0.5 g/m², and then were dried in an oven at 50° C. for 120 seconds, thereby producing infrared-sensitive color developing composition films B-2 (for Example 10).

<Compositions 2 of Infrared-Sensitive Color Developing Compositions>

Polymethyl methacrylate (Mw: 12,000): 0.12 parts by mass

Color developer (a compound shown in Table 2): The amount shown in Table 2

2-Butanone: 9.12 parts by mass

II-3. Production of Infrared-Sensitive Color Developing Composition Films B-3

Infrared-sensitive color developing compositions having a composition 3 described below were respectively prepared, were applied onto the obtained aluminum support by means of bar coating so that the dried coating amount reached 0.5 g/m², and then were dried in an oven at 50° C. for 120 seconds, thereby producing infrared-sensitive color developing composition films B-3 (for Example 11).

<Compositions 3 of Infrared-Sensitive Color Developing Compositions>

Polymethyl methacrylate (Mw: 12,000): 0.06 parts by mass

Color developer (a compound shown in Table 2): The amount shown in Table 2

2-Butanone: 9.18 parts by mass

II-4. Production of Infrared-Sensitive Color Developing Composition Films B-14

Infrared-sensitive color developing compositions having a composition 4 described below were respectively prepared, were applied onto the obtained aluminum support by means of bar coating so that the dried coating amount reached 1.0 g/m², and then were dried in an oven at 50° C. for 120 seconds, thereby producing infrared-sensitive color developing composition films B-14 (for Example 22).

<Compositions 4 of Infrared-Sensitive Color Developing Compositions>

Polymethyl methacrylate (Mw: 12,000): 0.06 parts by mass

Color developer (a compound shown in Table 2): The amount shown in Table 2

Sodium tetraphenylborate: 0.040 parts by mass

2-Butanone: 9.18 parts by mass

II-5. Production of Infrared-Sensitive Color Developing Composition Films B'-1

Infrared-sensitive color developing compositions having a composition 5 described below were respectively prepared, were applied onto the obtained aluminum support by means of bar coating so that the dried coating amount reached 1.0 g/m², and then were dried in an oven at 50° C. for 120 seconds, thereby producing infrared-sensitive color developing composition films B'-1 (for Comparative Example 4).

<Compositions 5 of Infrared-Sensitive Color Developing Compositions>

Polymethyl methacrylate (Mw: 12,000): 0.24 parts by mass

Initiator 1 [the following structure]: 0.162 parts by mass

Infrared absorber 1 [the following structure]: 0.02 parts by mass

2-Butanone: 9.00 parts by mass

Initiator 1

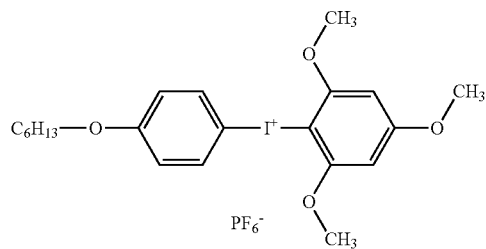

Infrared absorber 1

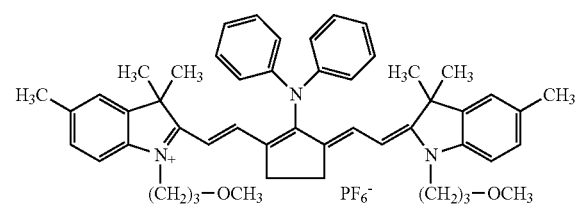

II-6. Evaluation of Color-Developing Properties of Infrared-Sensitive Color Developing Composition Films The produced infrared-sensitive color developing composition films were exposed in a Trendsetter 3244VX equipped with a water cooling-type 40 W infrared semiconductor laser manufactured by Creo Co., Ltd. under conditions of an output of 11.7 W, an external surface drum rotation speed of 250 rpm, a resolution of 2,400 dpi (dot per inch, 1 inch=25.4 mm). Meanwhile, the films were exposed under conditions of 25° C. and 50% RH.

The color-developing properties were evaluated by measuring color development immediately after the exposure, as it was in a dark place after the exposure, and after 24 hours elapsed under a condition of room temperature (25° C.). The color development was indicated using the difference ΔL between the L* value of an exposed portion and the L* value of a non-exposed portion using L* values (brightness) in the L*a*b* color specification system. A larger value of ΔL indicates superior color-developing properties. The color-developing properties were measured using a spectrophotometer CM2600d and operation software CM-S100W manufactured by Konica Minolta, Inc. by means of a specular component excluded (SCE) method.

The results are summarized in Table 2.

added was identical to each other, and the dried coating amounts were small, the color-developing properties improved. It is assumed that, when the dried coating amount decreases, the film thickness becomes small, the density of the specific compound increases, and the color-developing properties improve. In Example 22, although the reasons are not clear, the addition of a radical aid improved the color-developing properties.

Examples 23 to 36 and Comparative Examples 8 to 11: On-Machine Development-Type Lithographic Printing Plate III-1. Production of Lithographic Printing Plate Precursors C-1 to C-14 and C'-2 to C'-4

[Formation of Undercoat Layer]

The following coating fluid for the undercoat layer was applied onto the support produced above so that the dried coating amount reached 20 mg/m$^2$, thereby producing a support having the following undercoat layer.

<Coating Fluid for Undercoat Layer>

Compound for undercoat layer having the following structure: 0.18 parts by mass

TABLE 2

| Infrared-sensitive color developing composition film | Color developer | | Amount added (parts by mass) | Color-developing properties (ΔL) | |
|---|---|---|---|---|---|
| | Compound represented by Formula 1 | Comparative compound | | Immediately after exposure | After two hours |
| Example 9 | B-1 | Specific compound 1 | — | 0.02 | 11 | 11 |
| Example 10 | B-2 | Specific compound 1 | — | 0.02 | 13 | 13 |
| Example 11 | B-3 | Specific compound 1 | — | 0.02 | 16 | 16 |
| Example 12 | B-4 | Specific compound 2 | — | 0.02 | 7 | 7 |
| Example 13 | B-5 | Specific compound 15 | — | 0.02 | 8 | 8 |
| Example 14 | B-6 | Specific compound 17 | — | 0.02 | 8 | 8 |
| Example 15 | B-7 | Specific compound 20 | — | 0.02 | 8 | 8 |
| Example 16 | B-8 | Specific compound 21 | — | 0.02 | 7 | 7 |
| Example 17 | B-9 | Specific compound 23 | — | 0.02 | 7 | 7 |
| Example 18 | B-10 | Specific compound 28 | — | 0.02 | 5 | 5 |
| Example 19 | B-11 | Specific compound 29 | — | 0.02 | 5 | 5 |
| Example 20 | B-12 | Specific compound 30 | — | 0.02 | 5 | 5 |
| Example 21 | B-13 | Specific compound 31 | — | 0.02 | 6 | 6 |
| Example 22 | B-14 | Specific compound 28 | — | 0.02 | 8 | 8 |
| Comparative Example 4 | B'-1 | | Infrared absorber 1 + initiator 1 | | 3 | 2 |
| Comparative Example 5 | B'-2 | — | Comparative compound 1 | 0.02 | 1.5 | 1.5 |
| Comparative Example 6 | B'-3 | — | Comparative compound 1 | 0.1 | 7.5 | 7.5 |
| Comparative Example 7 | B'-4 | — | Comparative compound 2 | 0.02 | 1 | 1 |

Comparative compounds 1 and 2 shown in Table 2 are the above-described compounds.

From the results in Table 2, it is found that the compound represented by Formula 1 has favorable color-developing properties after exposure to infrared rays and is an excellent infrared-sensitive color developer that does not discolor after two hours. In addition, in Examples 10 and 11 in which the amount of the compound represented by Formula 1

Hydroxyethyl iminodiacetic acid: 0.10 parts by mass

Methanol: 55.24 parts by mass

Water: 6.15 parts by mass

Meanwhile, the numeric values at the bottom right of the parentheses representing individual constituent units in the following compound for the undercoating represent molar ratios, and, in addition, the parentheses in ethylene oxide groups represent repeating numbers.

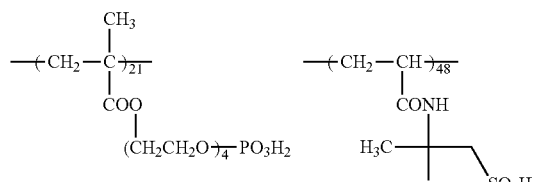

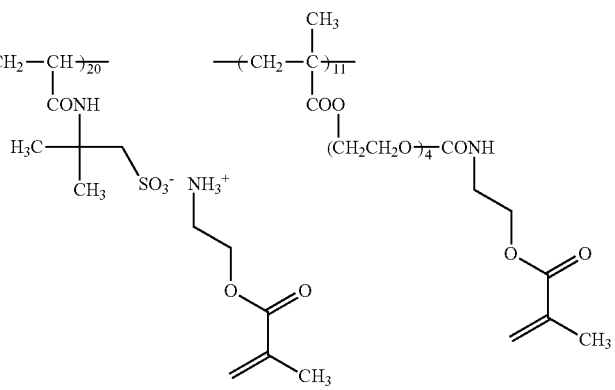

Compound for undercoat layer (Mw = 100,000)

<Production of Lithographic Printing Plate Precursors C-1 to C-11 and C'-2 to C-4>
[Formation of Image-Recording Layer]

A coating fluid for an image-recording layer 1 having the following composition was applied onto the undercoat layer formed in the above-described manner by means of bar coating and then was dried in an oven at 100° C. for 60 seconds, thereby forming an image-recording layer having a dried coating amount of 1.0 g/m².

The coating fluid for the image-recording layer 1 was obtained by mixing and stirring the following photosensitive liquid 1 and a micro gel liquid immediately before the coating.

<Photosensitive Liquid 1>
Binder polymer (the following structure): 0.240 parts by mass
Compound represented by Formula 1 (color developer, the compound shown in Table 3): The amount shown in Table 3
Initiator 1 (the above-described compound): 0.162 parts by mass
Polymerizable compound (tris(acryloyloxyethyl)isocyanurate, NK ester A-9300, manufactured by Shin-Nakamura Chemical Co., Ltd.): 0.192 parts by mass
Low-molecular-weight hydrophilic compound (tris(2-hydroxyethyl)isocyanurate): 0.062 parts by mass
Low-molecular-weight hydrophilic compound (the following structure): 0.050 parts by mass
Sensitization agent (phosphonium compound, the following structure): 0.055 parts by mass
Sensitization agent (benzyl-dimethyl-octylammonium.PF$_6$ salt): 0.018 parts by mass
Sensitization agent (ammonium group-containing polymer, the following structure, reducing specific viscosity of 44 ml/g): 0.035 parts by mass
Fluorine-based surfactant (the following structure): 0.008 parts by mass
2-Butanone: 1.091 parts by mass
1-Methoxy-2-propanol: 8.609 parts by mass
<Micro Gel Liquid>
Micro gel (gel obtained using the following synthesis method): 2.640 parts by mass
Distilled water: 2.425 parts by mass The structures of the low-molecular-weight hydrophilic compounds, the phosphonium compound, and the ammonium group-containing polymer and the synthesis method for the micro gel are as described below. Meanwhile, the number at the bottom right of the parentheses representing individual constituent units in the following polymers indicate molar ratios.

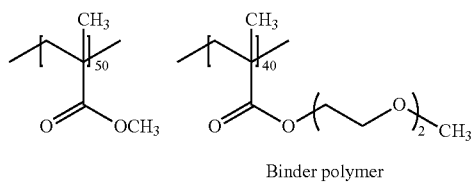

Binder polymer

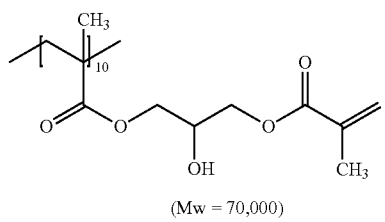

(Mw = 70,000)

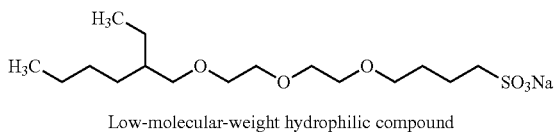

Low-molecular-weight hydrophilic compound

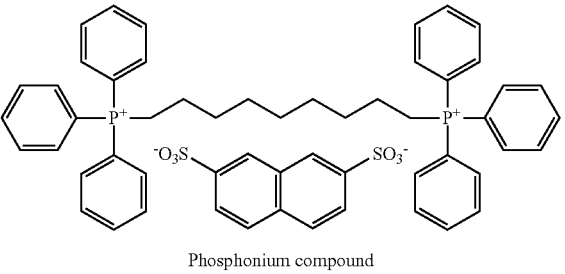

Phosphonium compound

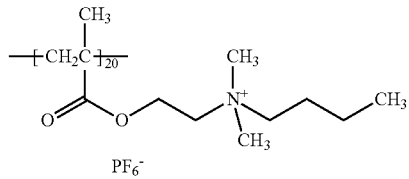

-continued $$-\!\!+\!\!CH_2\underset{\underset{O}{|}}{\overset{\overset{CH_3}{|}}{C}}\!\!+\!\!_{80}\!\!-$$
$$\underset{O}{\overset{\|}{C}}\!\!-\!\!O\!\!-\!\!(\diagup\!\!\diagdown)\!\!-\!\!O\!\!+\!\!CH_3$$
$$\phantom{xxxxxxxxxxxxxxxxxxxxxx}_2$$

Ammonium group-containing polymer $$-\!\!+\!\!CH_2CH\!\!+\!\!_{30}\!\!-$$
$$\phantom{xx}|$$
$$\phantom{xx}COOC_2H_4C_6F_{13}$$
$$-\!\!+\!\!CH_2CH\!\!+\!\!_{70}\!\!-$$
$$\phantom{xx}|$$
$$\phantom{xx}\underset{\underset{O}{\|}}{C}\!\!-\!\!(OC_2H_4)_{\overline{11}}\!(OC_3H_6)_{\overline{22}}\!(OC_2H_4)_{\overline{11}}\!OH$$

(Mw = 13,000)

Fluorine-based surfactant

—Synthesis of Micro Gel—

As oil-phase components, trimethylolpropane and xylene diisocyanate adduct (manufactured by Mitsui Chemicals, Inc., TAKENATE D-110N) (10 parts by mass), pentaerythritol triacrylate (manufactured by Nippon Kayaku Co., Ltd., SR444) (3.15 parts by mass), and alkylbenzene sulfonate (manufactured by Takemoto Oil & Fat Co., Ltd., PIONIN A-41C) (0.1 parts by mass) were dissolved in ethyl acetate (17 parts by mass). As a water-phase component, an aqueous solution of 4% by mass of polyvinyl alcohol (40 parts by mass) (PVA-205 manufactured by Kuraray Co., Ltd.) was prepared. The oil-phase components and the water-phase component were mixed together and were emulsified using a homogenizer at 12,000 rpm for 10 minutes. The obtained emulsified substance was added to distilled water (25 parts by mass), and the mixture was stirred at room temperature for 30 minutes, and then was stirred at 50° C. for three hours. The concentration of the solid content of the micro gel liquid obtained in the above-described manner was diluted using distilled water so as to reach 15% by mass, and this micro gel liquid was used as the micro gel. The average particle diameter of the micro gel was measured using a light scattering method and was found to be 0.2 µm.

[Formation of Protective Layer]

A protective layer coating fluid having the following composition was further applied onto the image-recording layer by means of bar coating and then was dried in an oven at 120° C. for 60 seconds, thereby forming a protective layer having a dried coating amount of 0.15 g/m² and thus obtaining lithographic printing plate precursors C-1 to C-11 (for Examples 23 to 33) and C'-2 to C'-4 (for Comparative Examples 9 to 11).

<Protective Layer Coating Fluid>

Inorganic lamellar compound dispersion liquid 1: 1.5 parts by mass

Aqueous solution of 6% by mass of polyvinyl alcohol (CKS50 manufactured by The Nippon Synthetic Chemical Industry Co., Ltd., sulfonic acid-modified, degree of saponification of 99% by mol or higher, degree of polymerization of 300): 0.55 parts by mass Aqueous solution of 6% by mass of polyvinyl alcohol (PVA-405 manufactured by Kuraray Co., Ltd., degree of saponification of 81.5% by mol, degree of polymerization of 500): 0.03 parts by mass Aqueous solution of 1% by mass of a surfactant (EM-ALEX 710, manufactured by Nihon Emulsion Co., Ltd.): 0.86 parts by mass Ion exchange water: 6.0 parts by mass —Preparation of Inorganic Lamellar Compound Dispersion Liquid 1—

Synthetic mica SOMASIF ME-100 (manufactured by Co-op Chemical Co., Ltd.) (6.4 parts by mass) was added to ion exchange water (193.6 parts by mass) and was dispersed using a homogenizer until the average particle diameter (the laser scattering method) reached 3 µm. The aspect ratio of the obtained dispersed particles was 100 or higher.

III-2. Production of Lithographic Printing Plate Precursor C-12

A coating fluid was produced in the same manner as C-1 using the following photosensitive liquid 2, and a lithographic printing plate precursor C-12 (for Example 34) was produced in the same manner as the lithographic printing plate precursor C-1.

<Photosensitive Liquid 2>

Binder polymer (the above-described structure): 0.240 parts by mass

Compound represented by Formula 1 (color developer, the compound shown in Table 3): The amount shown in Table 3

Initiator 1 (the above-described compound): 0.162 parts by mass

Sodium tetraphenylborate: 0.040 parts by mass

Polymerizable compound (tris(acryloyloxyethyl)isocyanurate, NK ester A-9300, manufactured by Shin-Nakamura Chemical Co., Ltd.): 0.192 parts by mass Low-molecular-weight hydrophilic compound (tris(2-hydroxyethyl)isocyanurate): 0.062 parts by mass Low-molecular-weight hydrophilic compound (the above-described structure): 0.050 parts by mass Sensitization agent (phosphonium compound, the above-described structure): 0.055 parts by mass Sensitization agent (benzyl-dimethyl-octylammonium.$PF_6$ salt): 0.018 parts by mass Sensitization agent (ammonium group-containing polymer, the above-described structure, reducing specific viscosity of 44 ml/g): 0.035 parts by mass Fluorine-based surfactant (the above-described structure): 0.008 parts by mass 2-Butanone: 1.091 parts by mass 1-Methoxy-2-propanol: 8.609 parts by mass III-3. Production of Lithographic Printing Plate Precursors C-13 and C-14

A coating fluid was produced in the same manner as C-1 using the following photosensitive liquid 3, and an image-recording layer for lithographic printing plate precursors C-13 and C-14 was formed in the same manner as the lithographic printing plate precursor C-1 (for Examples 35 and 36).

<Photosensitive Liquid 3>

Binder polymer (the above-described structure): 0.240 parts by mass

Initiator 1 (the above-described compound): 0.162 parts by mass

Infrared absorber 1 (the above-described compound): 0.020 parts by mass

Polymerizable compound (tris(acryloyloxyethyl)isocyanurate, NK ester A-9300, manufactured by Shin-Nakamura Chemical Co., Ltd.): 0.192 parts by mass Low-molecular-weight hydrophilic compound (tris(2-hydroxyethyl)isocyanurate): 0.062 parts by mass Low-molecular-weight hydrophilic compound (the above-described sulfonate compound): 0.050 parts by mass Sensitization agent (phosphonium compound, the above-described compound): 0.055 parts by mass Sensitization agent (benzyl-dimethyl-octylammonium.PF$_6$ salt): 0.018 parts by mass Sensitization agent (ammonium group-containing polymer, the above-described structure, reducing specific viscosity of 44 ml/g): 0.035 parts by mass Fluorine-based surfactant (the above-described fluorine-based surfactant): 0.008 parts by mass 2-Butanone: 1.091 parts by mass 1-Methoxy-2-propanol: 8.609 parts by mass

[Formation of Color Developing Protective Layers]

A color developing protective layer coating fluid having the following composition was further applied onto the image-recording layer by means of bar coating and then was dried in an oven at 120° C. for 60 seconds, thereby forming a protective layer having a dried coating amount of 0.15 g/m$^2$ and thus obtaining lithographic printing plate precursors C-13 and C-14 (for Examples 35 and 36) respectively.

<Color Developing Protective Layer Coating Fluid>

Compound represented by Formula 1 (color developer, the compound shown in Table 3): The amount shown in Table 3

Inorganic lamellar compound dispersion liquid (the above-described dispersion liquid): 1.5 parts by mass Aqueous solution of 6% by mass of polyvinyl alcohol (CKS50 manufactured by The Nippon Synthetic Chemical Industry Co., Ltd., sulfonic acid-modified, degree of saponification of 99% by mol or higher, degree of polymerization of 300): 0.55 parts by mass Aqueous solution of 6% by mass of polyvinyl alcohol (PVA-405 manufactured by Kuraray Co., Ltd., degree of saponification of 81.5% by mol, degree of polymerization of 500): 0.03 parts by mass Aqueous solution of 1% by mass of a surfactant (EMALEX 710, manufactured by Nihon Emulsion Co., Ltd.): 0.86 parts by mass Ion exchange water: 6.0 parts by mass III-4. Production of Lithographic Printing Plate Precursor C'-1

A lithographic printing plate precursor C'-1 (for Comparative Example 8) was produced in the same manner as the lithographic printing plate precursor C-1 except for the fact that a photosensitive liquid 4 described below was used as the photosensitive liquid for the image-recording layer.

<Photosensitive Liquid 4>

Binder polymer (the above-described structure): 0.240 parts by mass

Initiator 1 (the above-described compound): 0.162 parts by mass

Infrared absorber 1 (the above-described compound): 0.020 parts by mass

Polymerizable compound (tris(acryloyloxyethyl)isocyanurate, NK ester A-9300, manufactured by Shin-Nakamura Chemical Co., Ltd.): 0.192 parts by mass Low-molecular-weight hydrophilic compound (tris(2-hydroxyethyl)isocyanurate): 0.062 parts by mass Low-molecular-weight hydrophilic compound (the above-described structure): 0.050 parts by mass Sensitization agent (phosphonium compound, the above-described structure): 0.055 parts by mass Sensitization agent (benzyl-dimethyl-octylammonium.PF$_6$ salt): 0.018 parts by mass Sensitization agent (ammonium group-containing polymer, the above-described structure, reducing specific viscosity of 44 ml/g): 0.035 parts by mass Fluorine-based surfactant (the above-described structure): 0.008 parts by mass 2-Butanone: 1.091 parts by mass 1-Methoxy-2-propanol: 8.609 parts by mass III-4. Evaluation of Lithographic Printing Plate Precursors (i) Color-Developing Properties The obtained lithographic printing plate precursors were exposed using a TRENDSETTER 3244VX manufactured by Creo Co., Ltd. which was equipped with a water cooling-type 40 W infrared semiconductor laser under conditions of an output of 11.7 W, an external surface drum rotation speed of 250 rpm, and a resolution of 2,400 dpi.

Color development was measured immediately after exposure and two hours after exposure under conditions of a dark plate and room temperature.

Color development was measured in the same manner as the case of the infrared-sensitive color developing composition film. A larger value of $\Delta L$ indicates superior color-developing properties. The results are summarized in Table 3.

(ii) On-Machine Developing Properties

The obtained lithographic printing plate precursors were exposed using a LUXEL PLATESETTER T-6000III manufactured by Fujifilm Corporation which was equipped with an infrared semiconductor laser under conditions of an external surface drum rotation speed of 1,000 rpm, a laser output of 70%, and a resolution of 2,400 dpi. Exposed images were provided with beta images and 50% halftone dot charts of 20 μm dot FM screens.

Without carrying out a development process on the obtained exposed plate precursors, the lithographic printing plate precursors were attached to the plate trunk of a printer LITHRONE 26 manufactured by Komori Corporation. The lithographic printing plate precursors were on-machine-developed using dampening water of ECOLITY-2 (manufactured by Fujifilm Corporation)/tap water=2/98 (capacity ratio) and SPACE COLOR FUSION G(N) BLACK INK (manufactured by DIC Graphics Corporation) by supplying dampening water and ink using the standard automatic printing start method of LITHRONE 26, and then printing was carried out on 100 pieces of TOKUBISHI art paper (76.5 kg) at a printing rate of 10,000 pieces per hour.

The on-machine development of non-exposed portions in the image-recording layer on the printer was completed, and the number of pieces of printing paper required until ink was not transferred to the non-image portions was measured as the on-machine developing properties. The results are summarized in Table 3.

(iii) Printing Resistance

After the on-machine developing properties immediately after the above-described coating was evaluated, printing was further continued. As the number of printed pieces increased, the image-recording layer gradually wore, and thus the ink concentration on printed matters decreased. The printing resistance was evaluated using the number of printed portions when the value of the halftone dot area ratio of FM screen 50% halftone dots on printed matters measured using a gretag density meter decreased to be 5% lower than the measurement value obtained when printing was carried out on 100$^{th}$ piece of paper as the number of completely-printed pieces. The results are summarized in Table 3.

TABLE 3

| Lithographic printing plate precursor | | Color developer | | Amount added (parts by mass) | Color-developing properties (ΔL) | | On-machine developing properties (sheets) | Printing resistance (10,000 sheets) |
|---|---|---|---|---|---|---|---|---|
| | | Compound represented by Formula 1 | Comparative compound | | Immediately after exposure | After two hours | | |
| Example 23 | C-1 | Specific compound 1 | — | 0.020 | 8 | 8 | 30 | 7 |
| Example 24 | C-2 | Specific compound 2 | — | 0.020 | 4 | 4 | 30 | 7 |
| Example 25 | C-3 | Specific compound 15 | — | 0.020 | 5 | 5 | 30 | 7 |
| Example 26 | C-4 | Specific compound 17 | — | 0.020 | 5 | 5 | 30 | 7 |
| Example 27 | C-5 | Specific compound 20 | — | 0.020 | 5 | 5 | 30 | 7 |
| Example 28 | C-6 | Specific compound 21 | — | 0.020 | 7 | 7 | 30 | 7 |
| Example 29 | C-7 | Specific compound 23 | — | 0.020 | 7 | 7 | 30 | 7 |
| Example 30 | C-8 | Specific compound 28 | — | 0.020 | 5 | 5 | 30 | 7 |
| Example 31 | C-9 | Specific compound 29 | — | 0.020 | 5 | 5 | 30 | 7 |
| Example 32 | C-10 | Specific compound 30 | — | 0.020 | 5 | 5 | 30 | 7 |
| Example 33 | C-11 | Specific compound 31 | — | 0.020 | 6 | 6 | 30 | 7 |
| Example 34 | C-12 | Specific compound 28 | — | 0.020 | 8 | 8 | 30 | 9 |
| Example 35 | C-13 | Specific compound 10 | — | 0.020 | 12 | 12 | 30 | 7 |
| Example 36 | C-14 | Specific compound 11 | — | 0.020 | 11 | 11 | 30 | 7 |
| Comparative Example 8 | C'-1 | | Infrared absorber 1 + initiator 1 | | 3 | 2 | 30 | 7 |
| Comparative Example 9 | C'-2 | — | Comparative compound 1 | 0.020 | 1 | 1 | 30 | 7 |
| Comparative Example 10 | C'-3 | — | Comparative compound 1 | 0.100 | 3 | 3 | 30 | 3 |
| Comparative Example 11 | C'-4 | — | Comparative compound 2 | 0.020 | 1 | 1 | 30 | 5 |

Comparative compounds 1 and 2 shown in Table 3 are the above-described compounds.

From the results of Table 3, it is clear that, in the lithographic printing plate precursor of the present invention, the printing performance represented by on-machine developing properties and printing resistance and the color-developing properties (plate-inspecting properties) are excellent even in a case in which a small amount of the compound represented by Formula 1 is added thereto, and strong color development is maintained even when the lithographic printing plate precursor is aged after exposure and color development. In addition, in Examples 35 and 36 in which the specific compound 10 or 11 was added to the protective layer having a thin film thickness, the color-developing properties improved compared with the corresponding specific compounds 1 and 2. It is assumed that, since the film thickness became thin, the density of the compound represented by Formula 1 in the layer increased, and the color-developing properties improved. In Example 34, the color-developing properties and the printing resistance could be improved due to the addition of the radical aid.

Examples 37 to 41

Coating fluids were respectively produced in the same manner as C-1 except for the fact that a color developer shown in Table 4 (the compound represented by Formula 1), a borate compound, an initiator, and a chain transfer agent were used, and lithographic printing plate precursors C-15 to C-19 (for Examples 37 to 41) were respectively produced in the same manner as the lithographic printing plate precursor C-1.

Meanwhile, the amount of the borate compound added in a case in which the borate compound was used was 0.040 parts by mass, and the amount of the chain transfer agent added in a case in which the chain transfer agent was used was 0.120 parts by mass.

Color-developing properties and printing resistance were evaluated in the same manner as above using the obtained lithographic printing plate precursors C-15 to C-19. The evaluation results are shown in Table 4.

TABLE 4

| Lithographic printing plate precursor | | Color developer Compound represented by Formula 1 | Borate compound | Initiator | Chain transfer agent | Color-developing properties (ΔL) | | Printing resistance (10,000 sheets) |
|---|---|---|---|---|---|---|---|---|
| | | | | | | Immediately after exposure | After two hours | |
| Example 37 | C-15 | Specific compound 42 | None | None | CT-1 | 5 | 5 | 9.0 |
| Example 38 | C-16 | Specific compound 28 | Bo-1 | Initiator 2 | CT-2 | 8 | 8 | 10.0 |
| Example 39 | C-17 | Specific compound 28 | Bo-1 | None | CT-3 | 12 | 12 | 10.0 |
| Example 40 | C-18 | Specific compound 43 | Bo-1 | None | CT-4 | 12 | 12 | 10.0 |
| Example 41 | C-19 | Specific compound 33 | Bo-1 | None | CT-5 | 14 | 14 | 11.5 |

Meanwhile, the details of compounds shown in Table 4 except the above-described compounds are as described below.

Bo-1

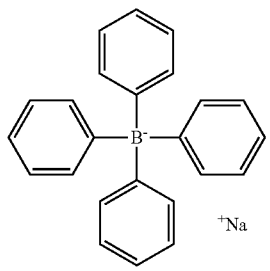

Initiator 2

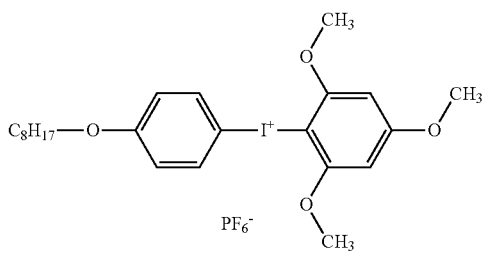

CT-1

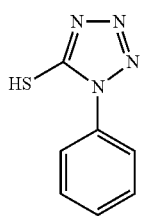

CT-2

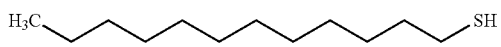

CT-3

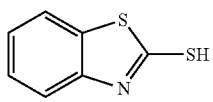

CT-4

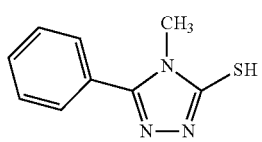

CT-5

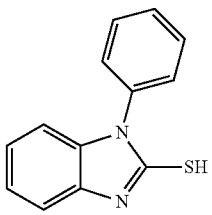

The results of Table 4 show that, in the lithographic printing plate precursor of the present invention, even when the initiator is not used, only by the addition of chain transfer agents, the printing performance represented by on-machine developing properties and printing resistance and the color-developing properties (plate-inspecting properties) of the obtained lithographic printing plate precursor are superior.

Examples 42 to 51

Coating fluids were respectively produced in the same manner as C-1 except for the fact that a color developer shown in Table 5 (the compound represented by Formula 1), a borate compound, an initiator, and a chain transfer agent were used, and lithographic printing plate precursors C-20 to C-29 (for Examples 42 to 51) were respectively produced in the same manner as the lithographic printing plate precursor C-1.

Meanwhile, the amount of the borate compound added in a case in which the borate compound was used was 0.040 parts by mass, and the amount of the chain transfer agent added in a case in which the chain transfer agent was used was 0.120 parts by mass.

Color-developing properties, printing resistance, and halftone dot reproducibility described below were evaluated in the same manner as above using the obtained lithographic printing plate precursors C-20 to C-29. The evaluation results are shown in Table 6.

(iv) Halftone Dot Reproducibility

The obtained lithographic printing plate precursors were exposed under conditions described below, on-machine development was carried out, and the halftone dot area ratios in exposed portions on 100 printed matters were measured using a halftone dot area measurement instrument iC Plate 2 (manufactured by X-Rite Inc.), thereby evaluating the halftone dot reproducibility. Meanwhile, the evaluation results show that, as the value approximates to 50, tone reproducibility becomes superior.

Regarding the exposure conditions, the lithographic printing plate precursors were exposed using Luxel PLATESET-TER T-6000III manufactured by Fujifilm Corporation under conditions of an external surface drum rotation speed of 400 rpm, a laser output of 85%, and a resolution of 2,400 dpi. Exposed images were provided with 50% halftone dot charts of AM 200 lines.

TABLE 5

|  | Lithographic printing plate precursor | Color developer Compound represented by Formula 1 | Borate compound | Initiator | Chain transfer agent |
|---|---|---|---|---|---|
| Example 42 | C-20 | Specific compound 42 | Bo-2 | Initiator 3 | None |
| Example 43 | C-21 | Specific compound 44 | Bo-2 | Initiator 2 | None |
| Example 44 | C-22 | Specific compound 28 | Bo-3 | Initiator 2 | None |
| Example 45 | C-23 | Specific compound 33 | Bo-4 | Initiator 3 | None |
| Example 46 | C-24 | Specific compound 33 | Bo-1 | Initiator 2 | None |
| Example 47 | C-25 | Specific compound 33 | Bo-5 | Initiator 2 | None |
| Example 48 | C-26 | Specific compound 36 | Bo-6 | Initiator 2 | None |
| Example 49 | C-27 | Specific compound 45 | Bo-3 | Initiator 2 | None |
| Example 50 | C-28 | Specific compound 45 | Bo-7 | Initiator 2 | CT-4 |
| Example 51 | C-29 | Specific compound 45 | Bo-7 | None | CT-5 |

TABLE 6

|  | HOMO of compound represented by Formula 1 (eV) | HOMO of borate compound (eV) | ΔG2 | λmax of compound represented by Formula 1 (nm) | Color-developing properties (ΔL) | | Printing resistance (10,000 sheets) | Halftone dot reproducibility (%) |
|---|---|---|---|---|---|---|---|---|
|  |  |  |  |  | Immediately after exposure | After two hours |  |  |
| Example 42 | −5.435 | −5.957 | 0.522 | 840 | 5 | 5 | 7.5 | 56 |
| Example 43 | −5.329 | −5.957 | 0.628 | 788 | 7 | 7 | 8.5 | 50 |
| Example 44 | −5.323 | −5.910 | 0.587 | 788 | 8 | 8 | 9.0 | 52 |
| Example 45 | −5.254 | −5.772 | 0.518 | 804 | 9 | 9 | 9.0 | 57 |
| Example 46 | −5.254 | −5.905 | 0.651 | 804 | 9 | 9 | 9.0 | 50 |
| Example 47 | −5.254 | −6.052 | 0.798 | 804 | 9 | 9 | 9.0 | 50 |
| Example 48 | −5.320 | −5.939 | 0.619 | 828 | 9 | 9 | 9.5 | 50 |
| Example 49 | −5.270 | −5.910 | 0.640 | 814 | 10 | 10 | 9.5 | 50 |
| Example 50 | −5.270 | −5.973 | 0.700 | 814 | 12 | 12 | 10.0 | 50 |
| Example 51 | −5.270 | −5.973 | 0.700 | 814 | 14 | 14 | 11.5 | 50 |

Meanwhile, the details of compounds shown in Table 5 except the above-described compounds are as illustrated below.

Initiator 3

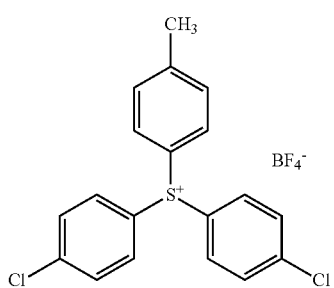

Bo - 2

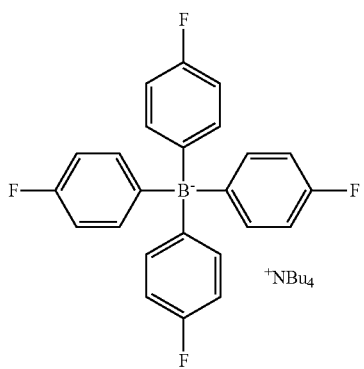

Bo - 3

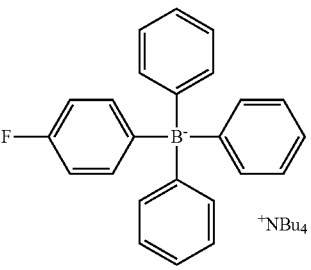

Bo - 4

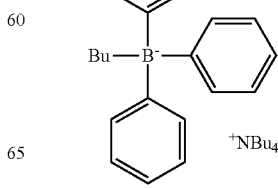

-continued

Bo-5
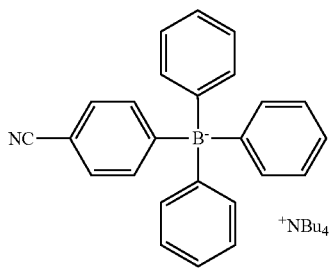

Bo-6
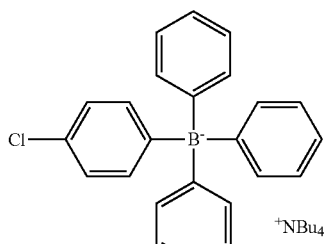

Bo-7
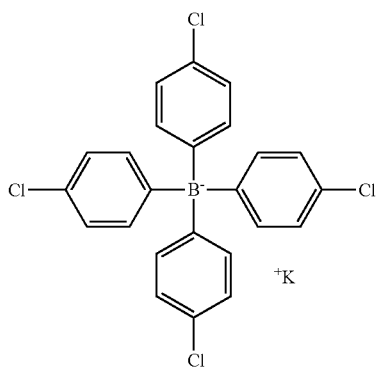

In the above-illustrated compounds, Bu represents an n-butyl group.

In addition, the HOMO values shown in Table 6 were computed using the following method.

<Potential Computation Method>

First, counter ions in compounds that were computation subjects were ignored.

Quantum chemical calculation software Gaussian 09 was used, and structure optimization was carried out in DFT (B3LYP/6-31G(d)).

The molecular orbital (MO) energy was calculated using the structure obtained by means of the structure optimization in DFT (B3LYP/6-31+G(d,p)/CPCM (solvent=methanol)).

The MO energy Epre (unit: hartree) obtained by the above-described MO energy calculation was converted to Eaft (unit: eV) which was used as the HOMO and LUMO values in the present invention using the following expression.

$$Eaft=0.823168\times 27.2114\times Epre-1.07634$$

(Meanwhile, 27.2114 was simply a coefficient for converting hartree to eV, 0.823168 and −1.07634 were adjustment coefficients, and the HOMO and LUMO of compounds which were computation subjects were determined so that computation matched actually measured values.)

ΔG2 was obtained from the difference between the HOMO of the specific compound and the HOMO of the borate compound (ΔG2=the HOMO of the specific compound-the HOMO of the borate compound).

From the results of Table 6, it is clear that, in the lithographic printing plate precursor of the present invention, when the difference ΔG2 between the HOMO of the compound represented by Formula 1 and the HOMO of the borate compound is set to 0.585 eV or more, halftone dot reproducibility is superior in lithographic printing plates to be obtained. In addition, when the maximum absorption wavelength of the compound represented by Formula 1 is increased, printing resistance and color-developing properties (plate-inspecting properties) further improve.

What is claimed is:

1. A color developing composition comprising a compound represented by Formula 1, (1)

wherein, in Formula 1, $R^1$ represents a group in which an $R^1$—O bond is cleaved by heat or exposure to infrared rays, $R^2$ and $R^3$ each independently represent a hydrogen atom or an alkyl group, $R^2$ and $R^3$ may be linked to each other to form a ring, $Ar^1$ and $Ar^2$ each independently represent a group forming a benzene ring or a naphthalene ring, $Y^1$ and $Y^2$ each independently represent an oxygen atom, a sulfur atom, —$NR^0$—, or a dialkyl methylene group, $R^4$ and $R^5$ each independently represent an alkyl group, $R^6$ to $R^9$ each independently represent a hydrogen atom or an alkyl group, $R^0$ represents a hydrogen atom, an alkyl group, or an aryl group, and Za represents a counter ion neutralizing a charge.

2. The color developing composition according to claim 1, wherein $R^1$ is a group represented by any one of Formulae 1-1 to 1-7

-continued

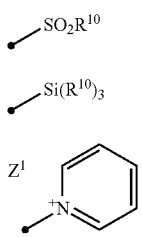

in Formulae 1-1 to 1-7, ● represents a bonding site with the O atom in Formula 1, $R^{10}$'s each independently represent a hydrogen atom, an alkyl group, an alkenyl group, an aryl group, $-OR^{14}$, $-NR^{15}R^{16}$, or $-SR^{17}$, $R^{11}$'s each independently represent a hydrogen atom, an alkyl group, or an aryl group, $R^{12}$ represents an aryl group, $-OR^{14}$, $-NR^{15}R^{16}$, $-SR^{17}$, $-C(=O)R^{18}$, $-OC(=O)R^{18}$, or a halogen atom, $R^{13}$ represents an aryl group, an alkenyl group, an alkoxy group, or an onium group, $R^{14}$ to $R^{17}$ each independently represent a hydrogen atom, an alkyl group, or an aryl group, $R^{18}$'s each independently represent an alkyl group, an aryl group, $-OR^{14}$, $-NR^{15}R^{16}$, or $-SR^{17}$, and $Z^1$ represents a counter ion neutralizing a charge.

3. The color developing composition according to claim 2, wherein $R^1$ is a group represented by any one of Formulae 1-1 to 1-3.

4. The color developing composition according to claim 1, wherein $R^1$ is a group represented by Formula 2,

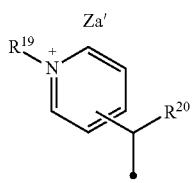

in Formula 2, ● represents a bonding site with the O atom in Formula 1, $R^{19}$ and $R^{20}$ each independently represent an alkyl group, and Za' represents a counter ion neutralizing a charge.

5. The color developing composition according to claim 1, further comprising:
a binder polymer.

6. The color developing composition according to claim 1, further comprising:
a polymerization initiator; and
a polymerizable compound.

7. The color developing composition according to claim 1, further comprising:
a chain transfer agent.

8. The color developing composition according to claim 7, wherein the chain transfer agent is a thiol compound.

9. The color developing composition according to claim 1, further comprising:
a borate compound.

10. The color developing composition according to claim 9, wherein a potential difference between a highest occupied molecular orbital of the compound represented by Formula 1 and a highest occupied molecular orbital of the borate compound is 0.585 eV or more.

11. The color developing composition according to claim 9, wherein the borate compound is a tetraarylborate compound.

12. The color developing composition according to claim 1 which is a thermosensitive and/or infrared-sensitive color developing composition.

13. A lithographic printing plate precursor comprising:
a layer including a compound represented by Formula 1 and a binder polymer on a support,

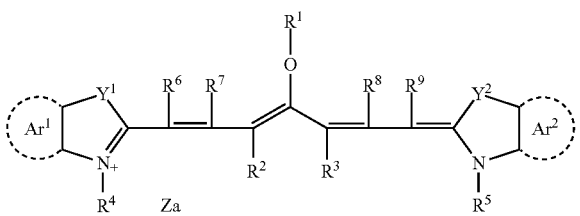

wherein, in Formula 1, $R^1$ represents a group in which an $R^1$—O bond is cleaved by heat or exposure to infrared rays, $R^2$ and $R^3$ each independently represent a hydrogen atom or an alkyl group, $R^2$ and $R^3$ may be linked to each other to form a ring, $Ar^1$ and $Ar^2$ each independently represent a group forming a benzene ring or a naphthalene ring, $Y^1$ and $Y^2$ each independently represent an oxygen atom, a sulfur atom, $-NR^0-$, or a dialkyl methylene group, $R^4$ and $R^5$ each independently represent an alkyl group, $R^6$ to $R^9$ each independently represent a hydrogen atom or an alkyl group, $R^0$ represents a hydrogen atom, an alkyl group, or an aryl group, and Za represents a counter ion neutralizing a charge.

14. The lithographic printing plate precursor according to claim 13, wherein the layer is an image-recording layer.

15. The lithographic printing plate precursor according to claim 14, further comprising:
a protective layer on the image-recording layer.

16. The lithographic printing plate precursor according to claim 13, wherein the layer is a protective layer.

17. A plate making method for a lithographic printing plate, comprising:
an exposure step of exposing the lithographic printing plate precursor according to claim 13 in an image pattern; and
an on-machine development process step of removing non-image portions by supplying printing ink and dampening water to the lithographic printing plate precursor that has been exposed in an image pattern on a printer.

18. A compound represented by Formula 1,

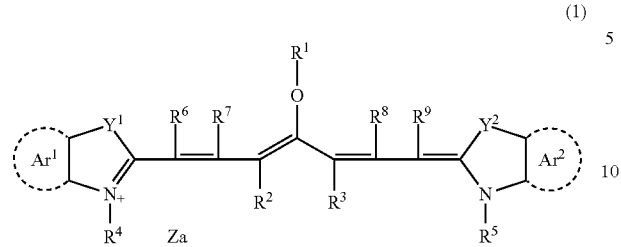

(1)

wherein, in Formula 1, $R^1$ represents a group in which an $R^1$—O bond is cleaved by heat or exposure to infrared rays, $R^2$ and $R^3$ each independently represent a hydrogen atom or an alkyl group, $R^2$ and $R^3$ may be linked to each other to form a ring, $Ar^1$ and $Ar^2$ each independently represent a group forming a benzene ring or a naphthalene ring, $Y^1$ and $Y^2$ each independently represent an oxygen atom, a sulfur atom, —$NR^0$—, or a dialkyl methylene group, $R^4$ and $R^5$ each independently represent an alkyl group, $R^6$ to $R^9$ each independently represent a hydrogen atom or an alkyl group, $R^0$ represents a hydrogen atom, an alkyl group, or an aryl group, and Za represents a counter ion neutralizing a charge, wherein $R^1$ is a group represented by any one of Formulae 1-1 to 1-7,

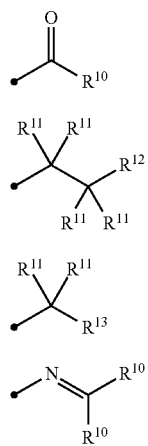

(1-1)

(1-2)

(1-3)

(1-4)

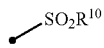

(1-5)

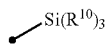

(1-6)

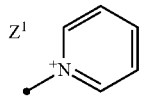

(1-7)

in Formulae 1-1 to 1-7, ● represents a bonding site with the O atom in Formula 1, $R^{10}$'s each independently represent a hydrogen atom, an alkyl group, an alkenyl group, an aryl group, —$OR^{14}$, —$NR^{15}R^{16}$, or —$SR^{17}$, $R^{11}$'s each independently represent a hydrogen atom, an alkyl group, or an aryl group, $R^{12}$ represents an aryl group, —$OR^{14}$, —$NR^{15}R^{16}$, —$SR^{17}$, —$C(=O)R^{18}$, —$OC(=O)R^{18}$, or a halogen atom, $R^{13}$ represents an aryl group, an alkenyl group, an alkoxy group, or an onium group, $R^{14}$ to $R^{17}$ each independently represent a hydrogen atom, an alkyl group, or an aryl group, $R^{18}$'s each independently represent an alkyl group, an aryl group, —$OR^{14}$, —$NR^{15}R^{16}$, or —$SR^{17}$, and $Z^1$ represents a counter ion neutralizing a charge, and in a case in which $R^{10}$ in Formula 1-1 is an alkyl group, the alkyl group is an alkyl group having an arylthio group or an alkyloxycarbonyl group at the α-position.

19. The compound according to claim 18, wherein $R^1$ is a group represented by any one of Formulae 1-1 to 1-3.

20. The compound according to claim 18, wherein $R^1$ is a group represented by Formula 2,

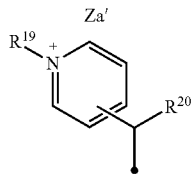

(2)

in Formula 2, ● represents a bonding site with the O atom in Formula 1, $R^{19}$ and $R^{20}$ each independently represent an alkyl group, and Za' represents a counter ion neutralizing a charge.

21. The compound according to claim 18 which is a thermosensitive and/or infrared-sensitive color developer.

* * * * *